(12) United States Patent
Zhang

(10) Patent No.: US 7,425,391 B2
(45) Date of Patent: Sep. 16, 2008

(54) HIGHLY-CORRECTED MASK

(76) Inventor: Guobiao Zhang, P.O. Box 6182, Carson City, NV (US) 89449-6182

( * ) Notice: Subject to any disclaimer, the term of this patent is extended or adjusted under 35 U.S.C. 154(b) by 433 days.

(21) Appl. No.: 11/163,865

(22) Filed: Nov. 2, 2005

(65) Prior Publication Data

US 2006/0088772 A1 Apr. 27, 2006

Related U.S. Application Data

(62) Division of application No. 10/230,610, filed on Aug. 28, 2002, now Pat. No. 6,989,603.

(60) Provisional application No. 60/326,919, filed on Oct. 2, 2001, provisional application No. 60/339,334, filed on Dec. 13, 2001, provisional application No. 60/395,099, filed on Jul. 10, 2002.

(51) Int. Cl.
*G03F 1/00* (2006.01)
(52) U.S. Cl. .......................................... 430/5
(58) Field of Classification Search ............. 430/5, 430/30, 311, 312, 313
See application file for complete search history.

(56) References Cited

U.S. PATENT DOCUMENTS 5,415,835 A 5/1995 Brueck et al. ............... 430/311
6,042,998 A * 3/2000 Brueck et al. ............... 430/316

OTHER PUBLICATIONS

Brueck, "Optical and Interferometric Lithography—Nanotechnology Enablers", *Proceedings of the IEEE*, vol. 93, No. 10, Oct. 2005.

* cited by examiner

*Primary Examiner*—Stephen Rosasco

(57) ABSTRACT

The present invention discloses a pattern-distributed mask. It comprises a plurality of mask regions whose images will be merged into a single image (e.g. by interleaving) on an image-carrier (e.g. wafer, mask blank). The pattern spacing on a pattern-distributed mask could be much larger than a conventional mask. For example, all pattern spacing on a pattern-distributed mask could be ~3F (vs. ~1F on a conventional mask). It can enable highly-corrected mask, as well as thin-film mask with supporting structures.

20 Claims, 29 Drawing Sheets

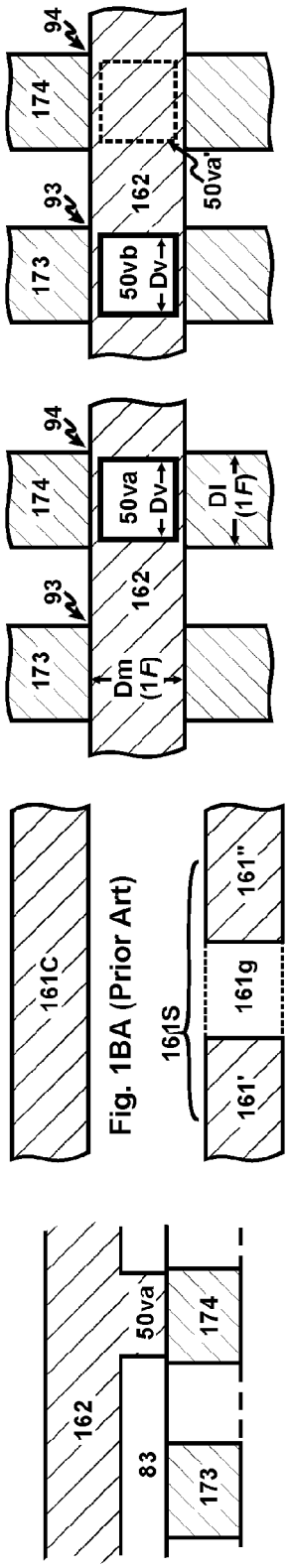

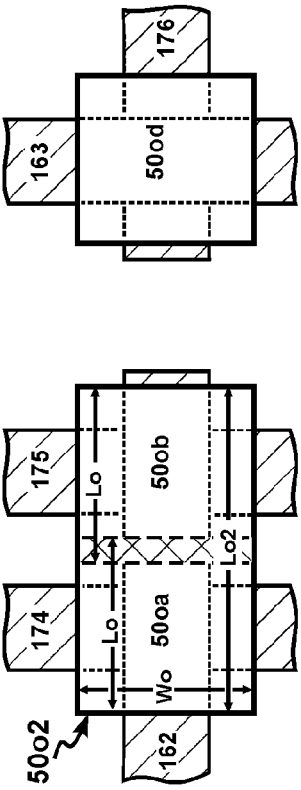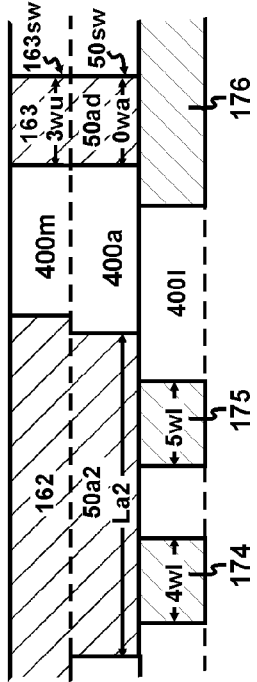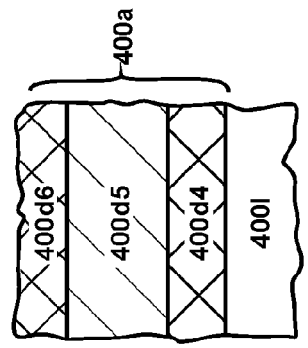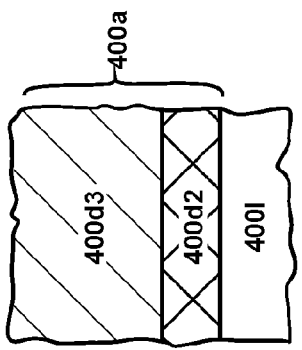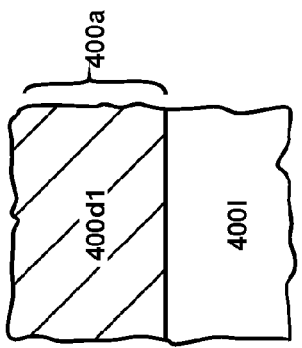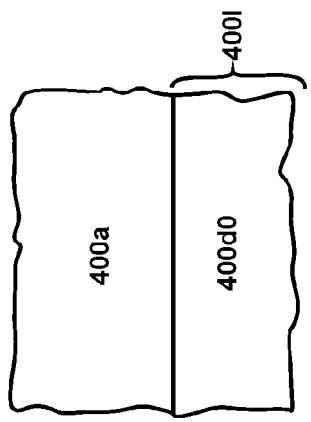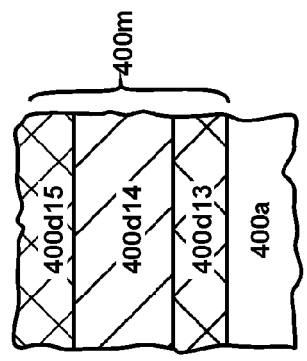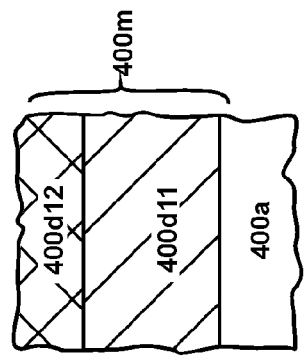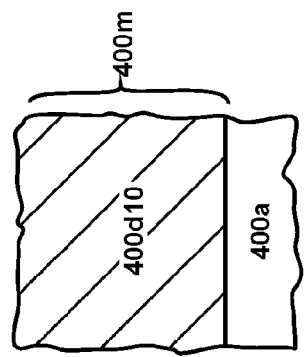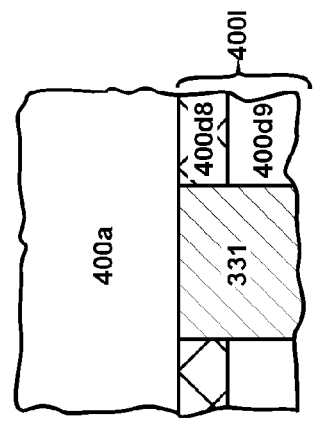

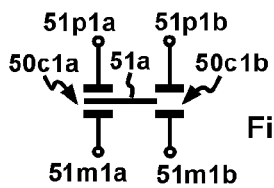
Fig. 11F
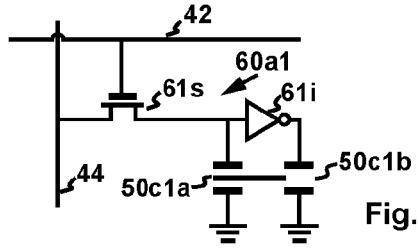
Fig. 11GA
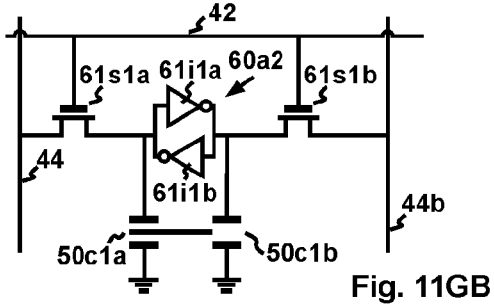
Fig. 11GB
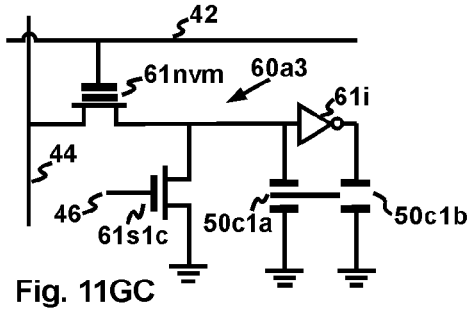
Fig. 11GC
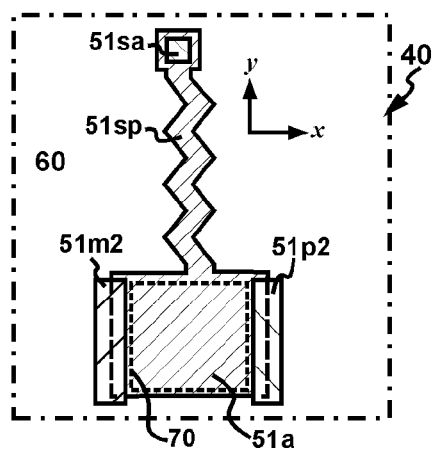
Fig. 11HA
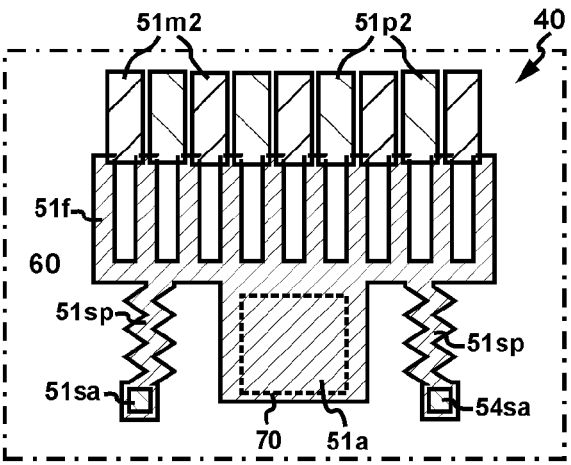
Fig. 11HB
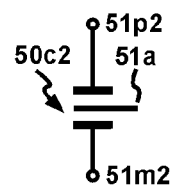
Fig. 11I
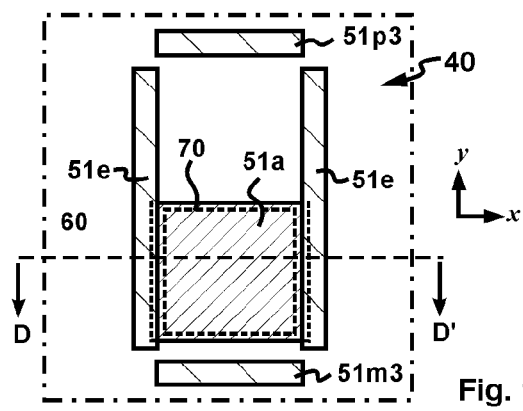
Fig. 11JA
Fig. 11JB
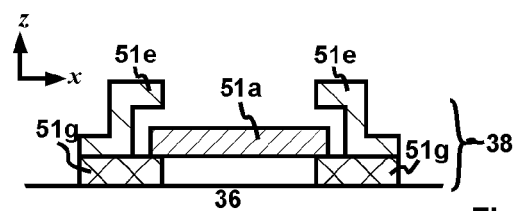
Fig. 11K
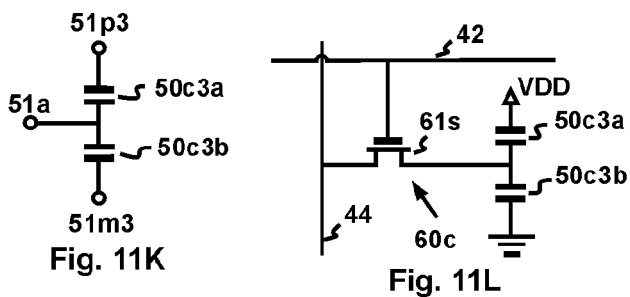
Fig. 11L

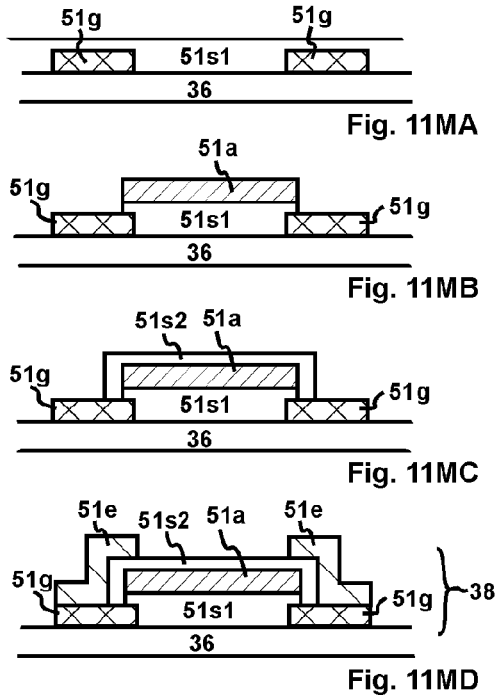
Fig. 11MA
Fig. 11MB
Fig. 11MC
Fig. 11MD
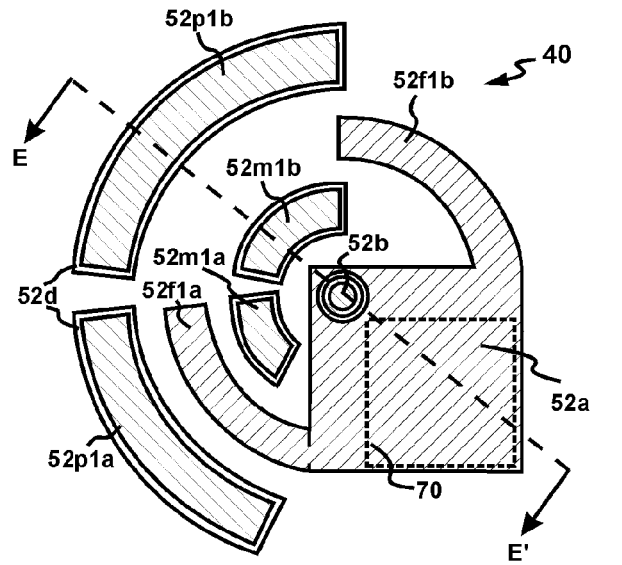
Fig. 12CA
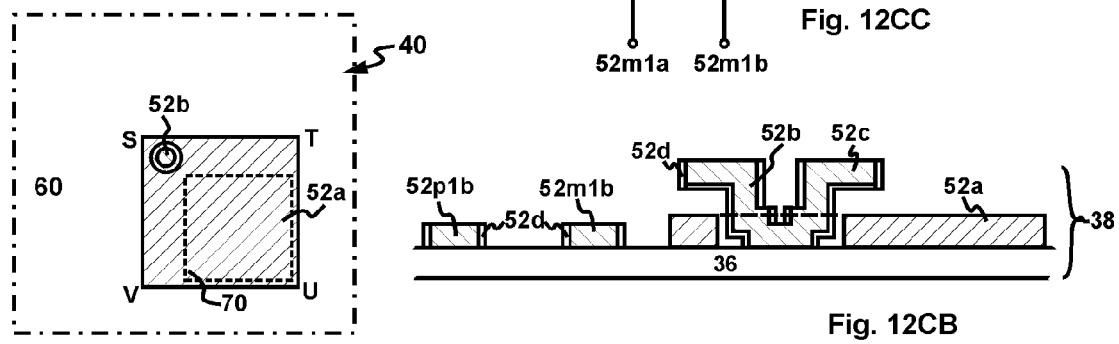
Fig. 12CC
Fig. 12CB
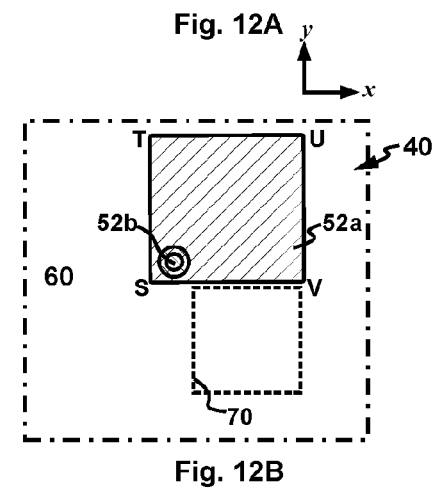
Fig. 12A
Fig. 12B
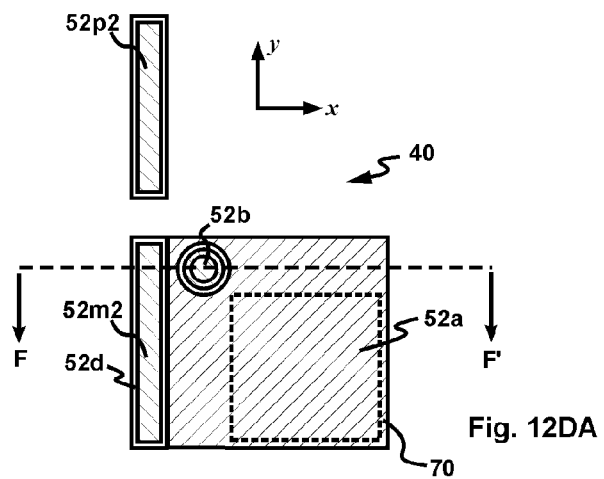
Fig. 12DA

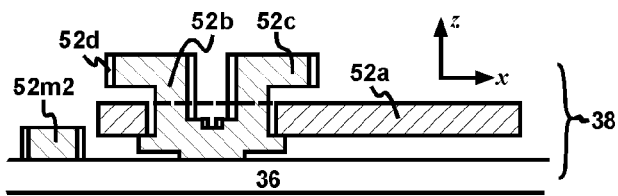
Fig. 12DB
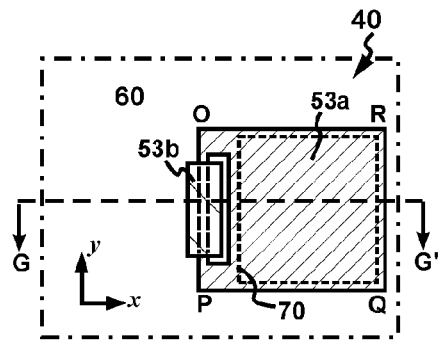
Fig. 13AA
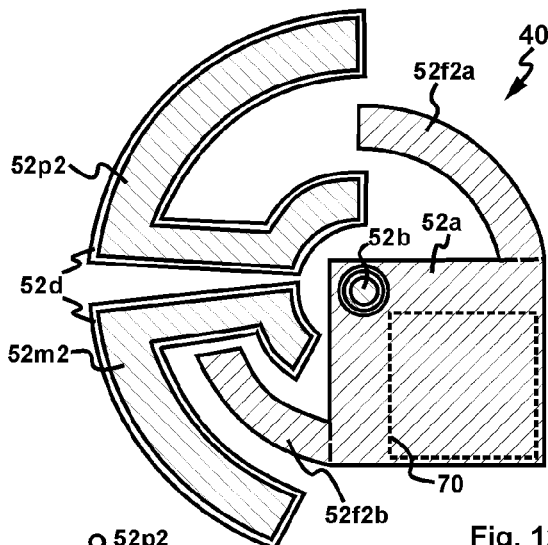
Fig. 12DC
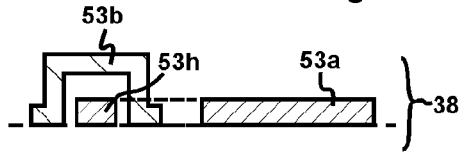
Fig. 13AB
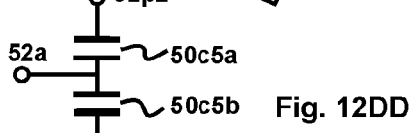
Fig. 12DD
Fig. 13AC
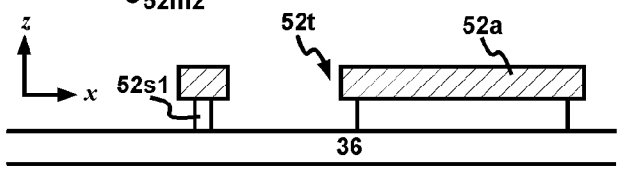
Fig. 12EA
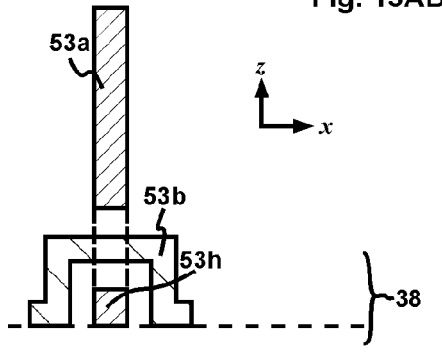
Fig. 13AD
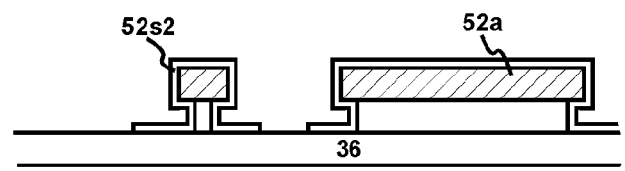
Fig. 12EB
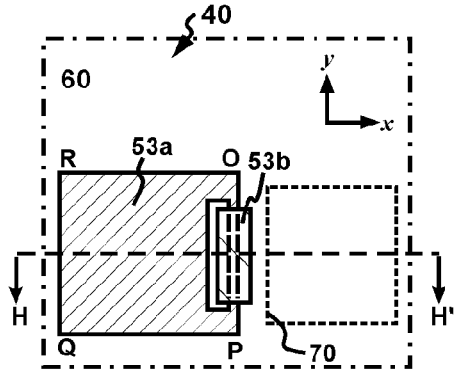
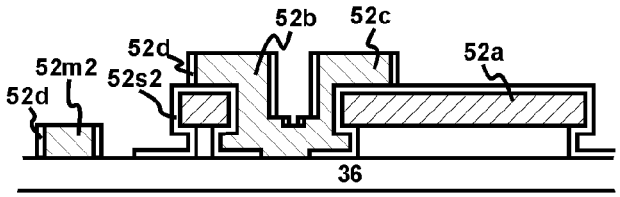
Fig. 12EC
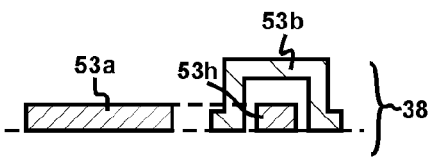
Fig. 13AE

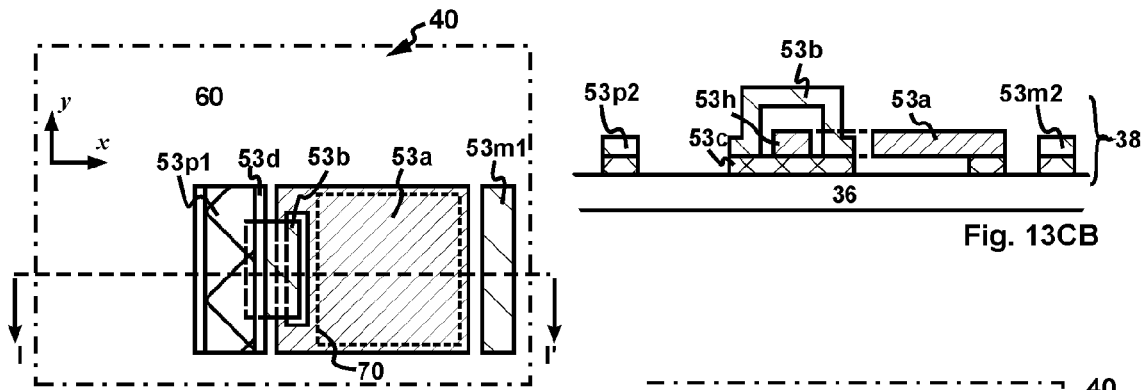
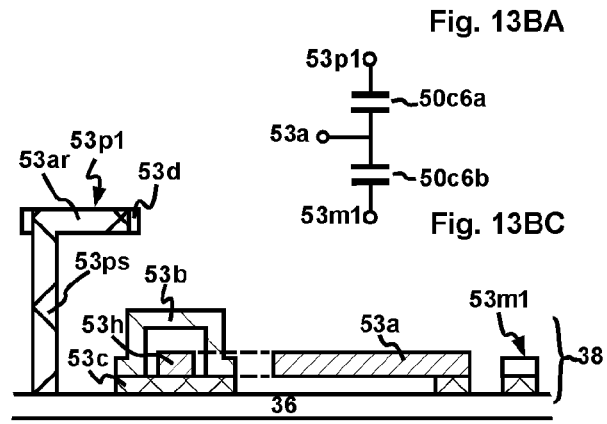
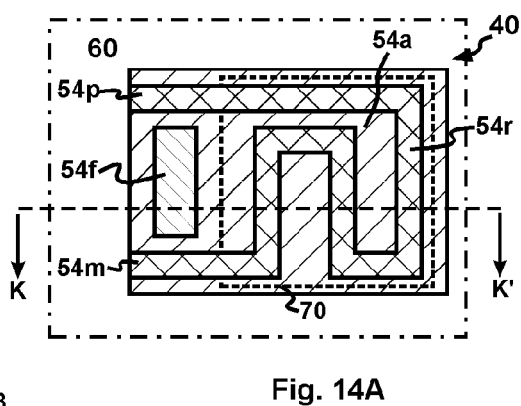
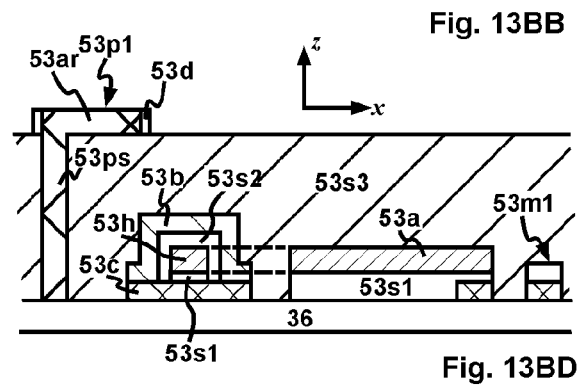
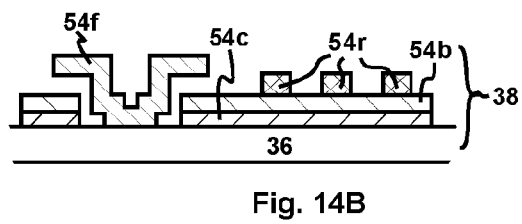
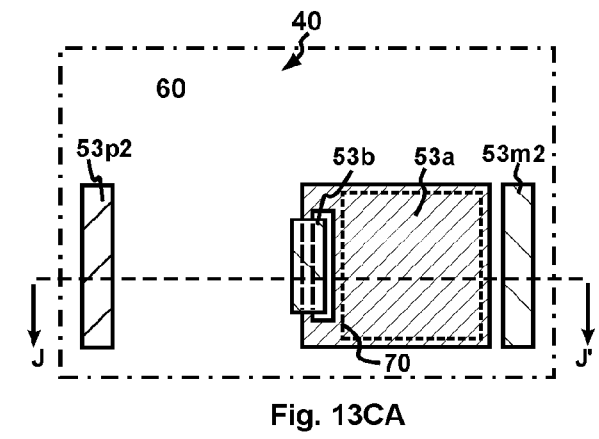
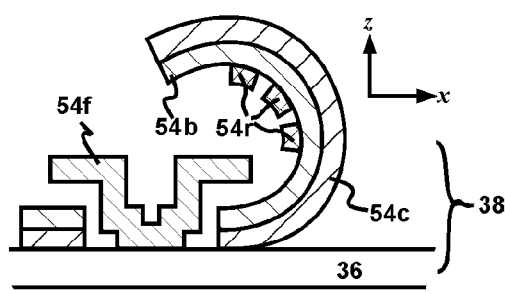

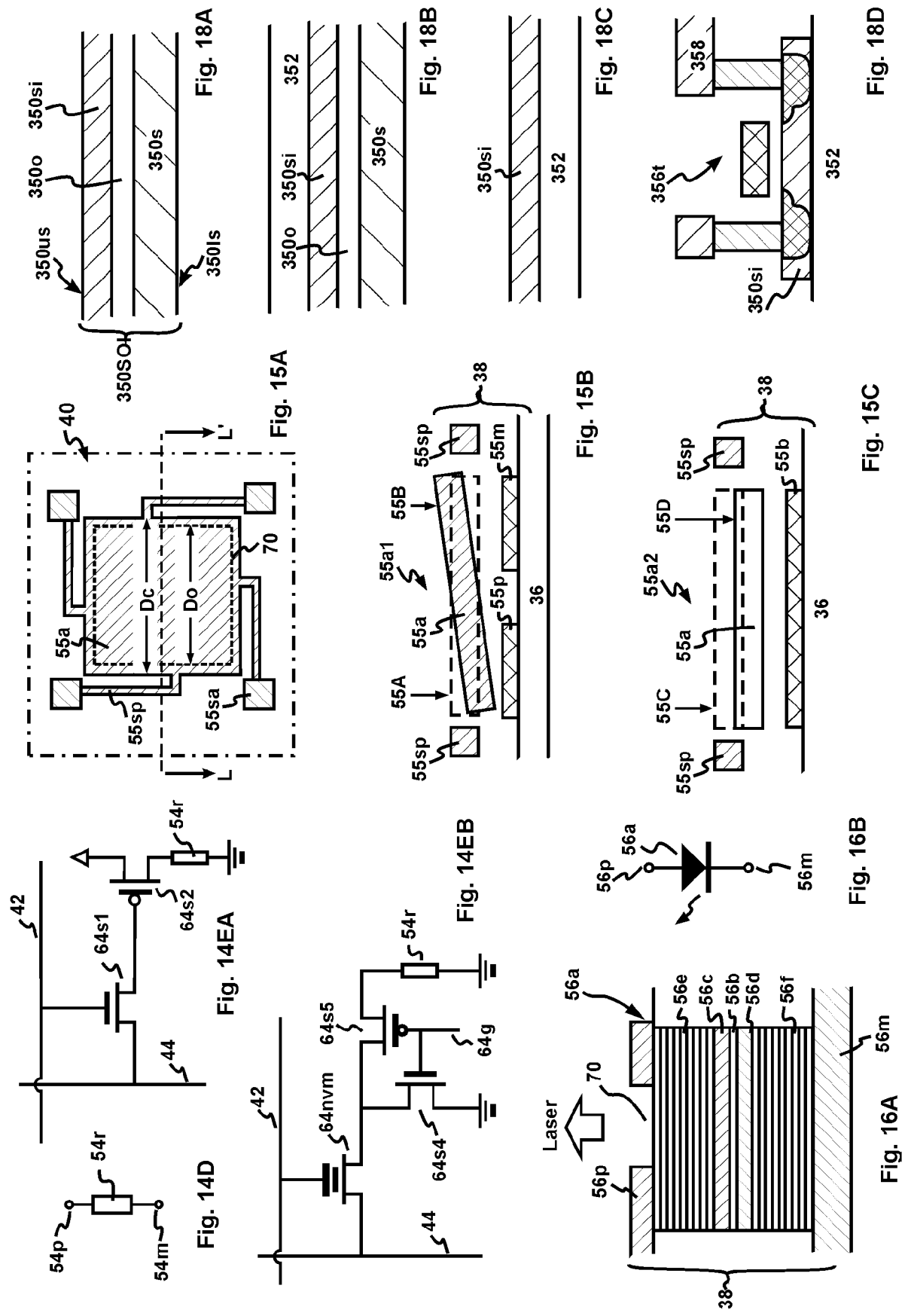

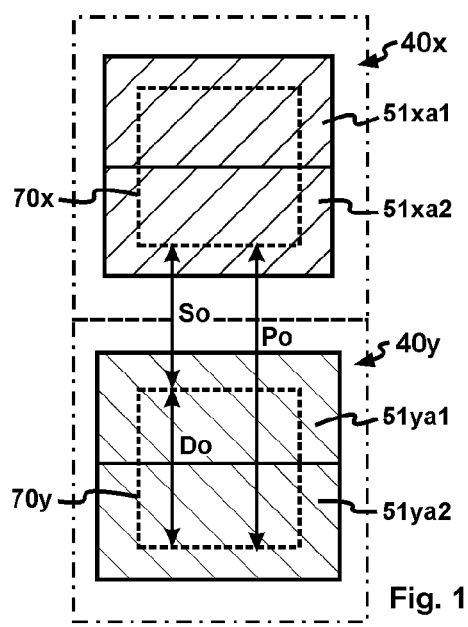
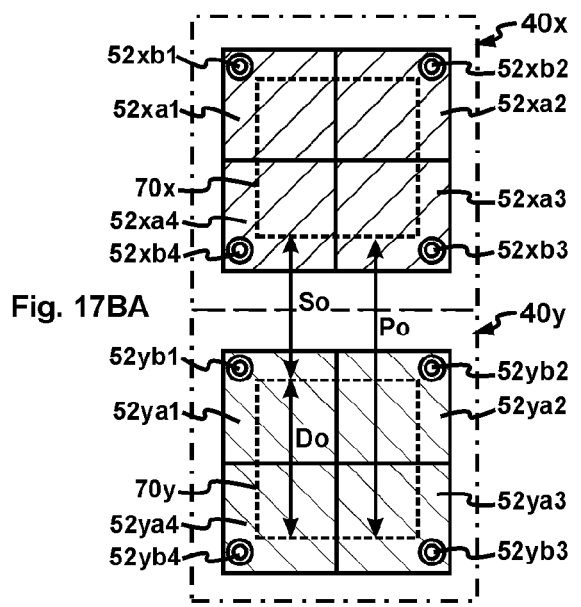
Fig. 17AA
Fig. 17BA
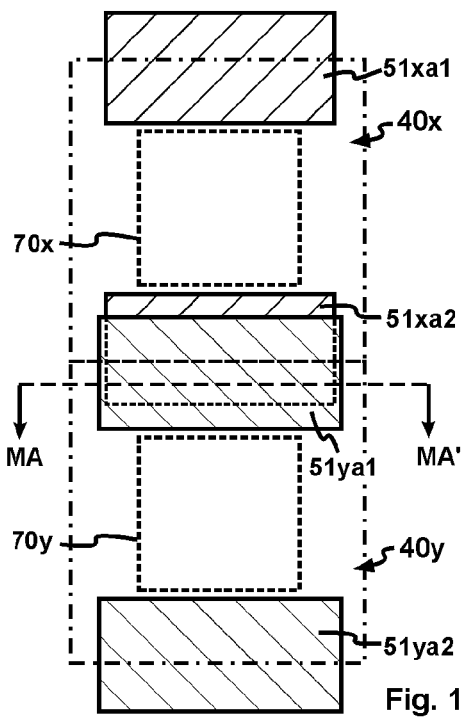
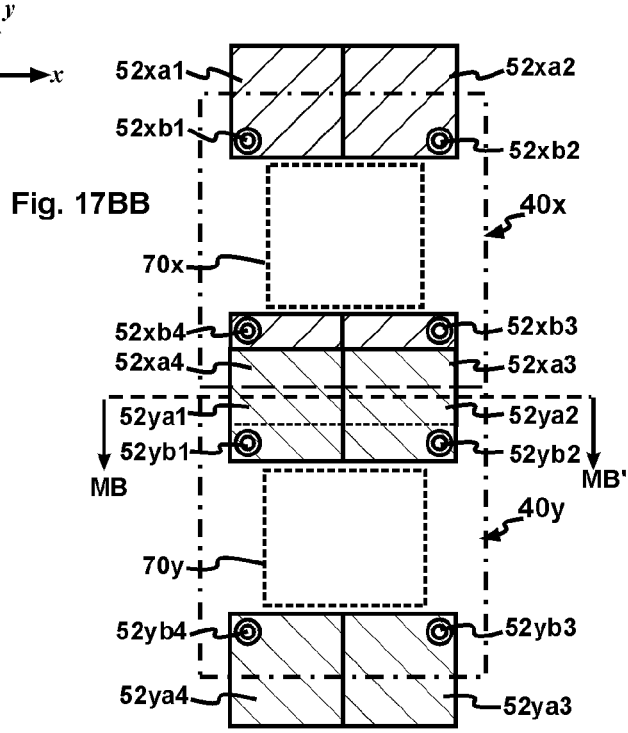
Fig. 17AB
Fig. 17BB
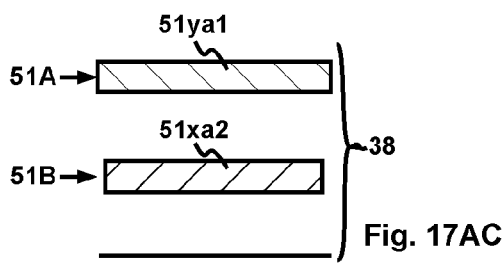
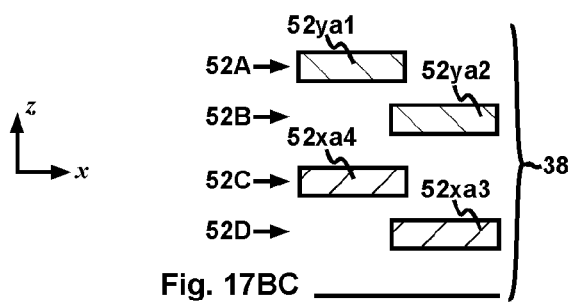
Fig. 17AC
Fig. 17BC

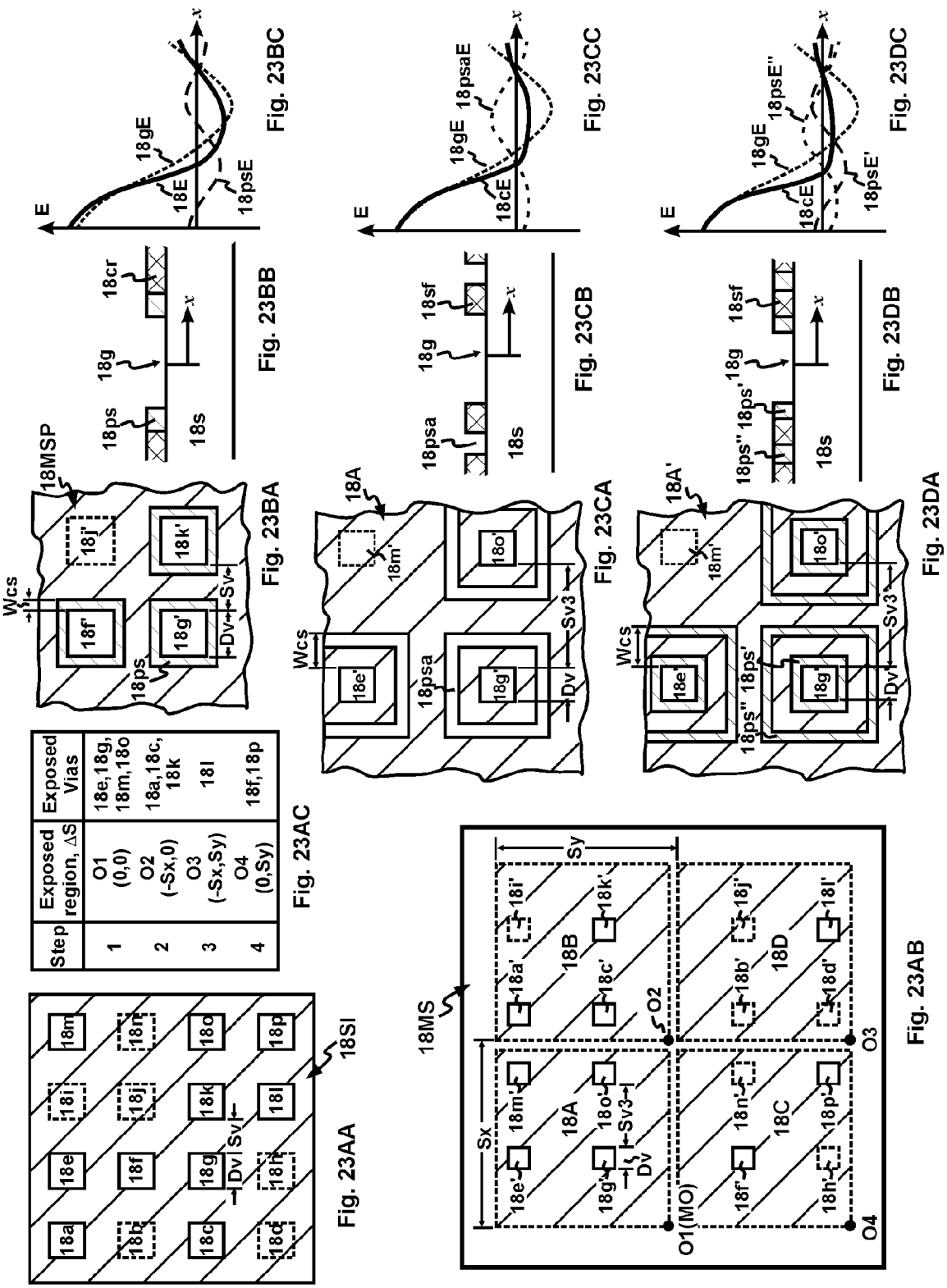

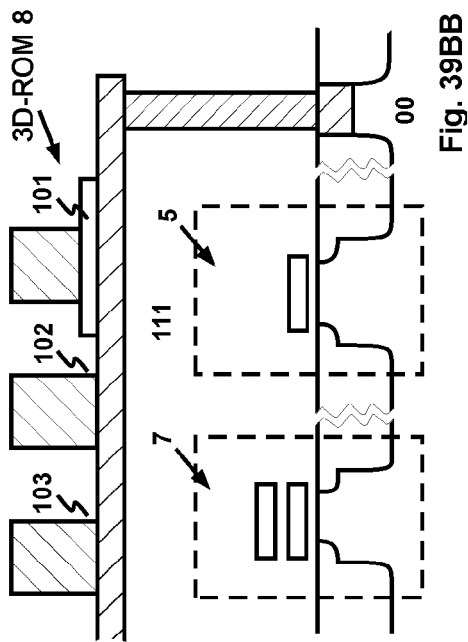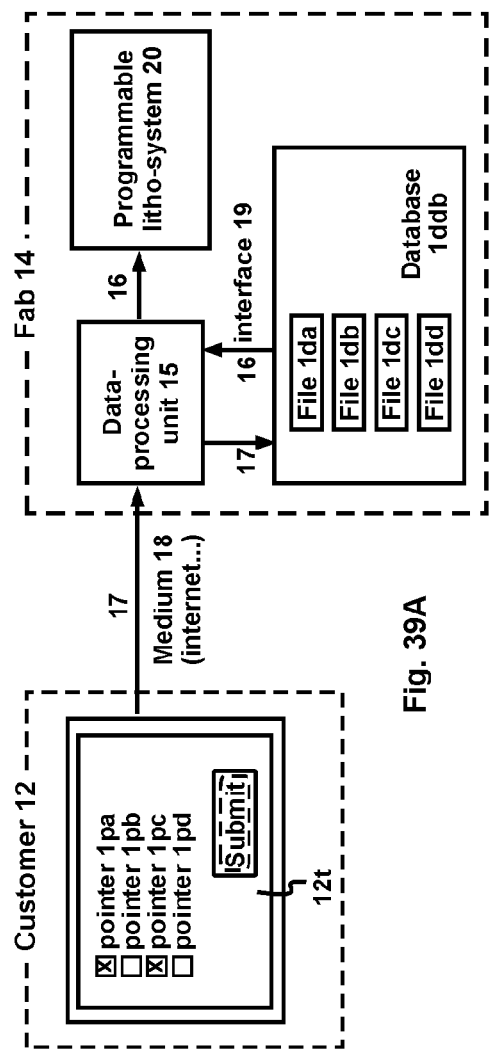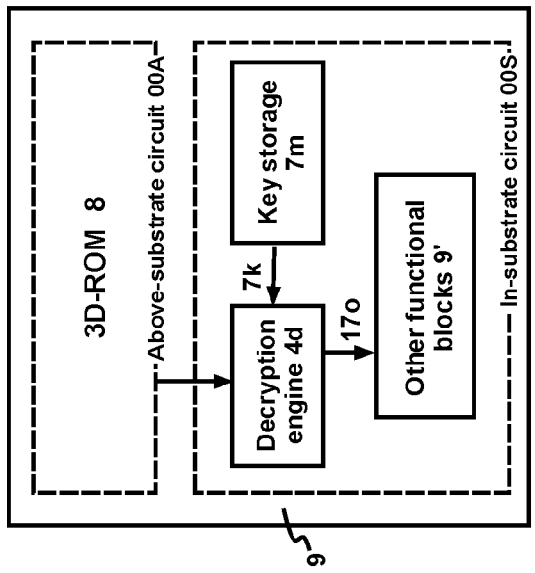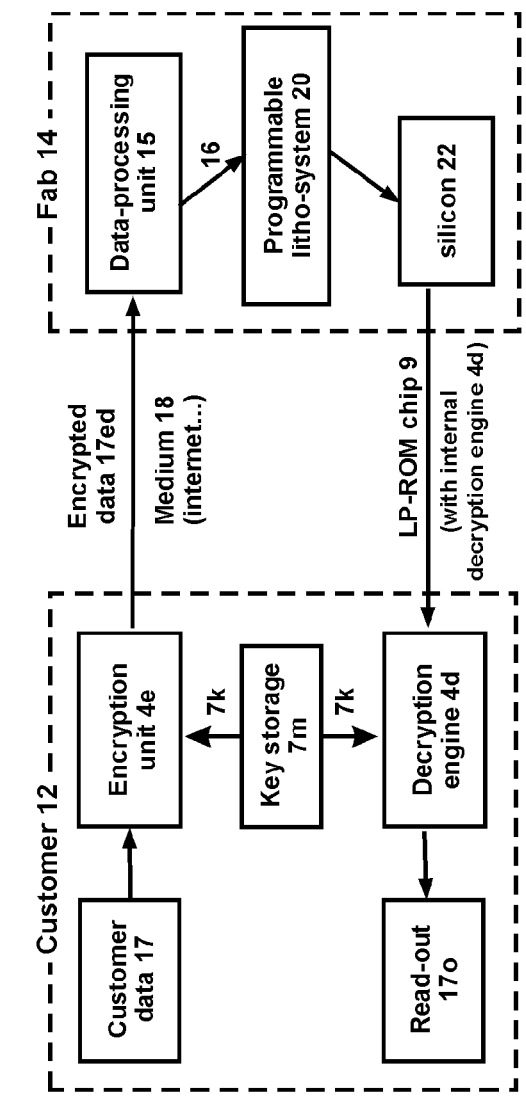

HIGHLY-CORRECTED MASK

CROSS-REFERENCE TO RELATED APPLICATIONS

This patent application is a division of U.S. patent application Ser. No. 10/230,610, Filed Aug. 28, 2002. Said patent application Ser. No. 10/230,610 is related to the following domestic patent applications:
1. "Opening-Programmable Integrated Circuits", provisional application Ser. No. 60/326,919, filed on Oct. 2, 2001;
2. "Litho-Programmable Integrated Circuits", provisional application Ser. No. 60/339,334, filed on Dec. 13, 2001;
3. "Low-Cost Lithography", provisional application Ser. No. 60/395,099, filed on Jul. 10, 2002, and the following foreign patent applications:
1. "Design of Three-Dimensional Read-Only Memory", CHINA P. R., patent application Ser. No. 02113333.6, filed on Feb. 5, 2002;
2. "Programmable Litho-System and Applications", CHINA P. R., patent application Ser. No. 02113475.8, filed on Mar. 20, 2002;
3. "Logic Litho-System and Applications", CHINA P. R., patent application Ser. No. 02113476.6, filed on Mar. 20, 2002;
4. "Design, Fabrication and Business Model of Litho-Programmable Integrated Circuits", CHINA P. R., patent application Ser. No. 02113477.4, filed on Mar. 20, 2002;
5. "Methods to Lower the Mask Cost in an Integrated Circuit", CHINA P. R., patent application Ser. No. 02113792.7, filed on May 28, 2002;
6. "Logic Litho-System", CHINA P. R., patent application Ser. No. 02113836.2, filed on Jun. 6, 2002;
7. "Litho-Programmable Application Specific Integrated Circuits", CHINA P. R., patent application Ser. No. 02133303.3, filed on Jun. 18, 2002, all by the same inventor.

BACKGROUND

1. Technical Field of the Invention

The present invention relates to the field of integrated circuits, and more particularly to low-cost lithography.

2. Related Arts

Lithography is the process of creating patterns in an IC layer. It involves mask fabrication, lithographic and related processes. With the advancement of integrated circuits, masks become more and more expensive. At the 0.13 μm node, a conventional mask costs~$30,000, and well over $100,000 for a phase-shift mask (PSM); a typical mask set costs~$1 million. For medium-to small-volume production, mask cost becomes a significant portion of the overall IC cost. The present invention particularly addresses the lithographic costs associated with opening-related patterns (e.g. inter-level connection and segmented-line), high-precision mask (e.g. OPC-mask and PSM), SCIC (semi-custom IC) and ASIC (application-specific IC), and others.

Before proceeding further, a clarification needs to be made here: the size, dimension, width, length used throughout this disclosure could be either a size, dimension, width, length on wafer, or a size, dimension, width, length on mask. They are, in general, not specified, but should become apparent from the context. For example, no extra efforts have been made to distinguish the minimum feature size on wafer Fw from the corresponding minimum feature size on mask Fm (Fm=Fw× R, where R is the image-reduction ratio of the reduction stepper). They are both referred to as F throughout this disclosure. In the context of wafer pattern (patterns on wafer), F means Fw; in the context of mask pattern (patterns on mask), F means Fm.

1. Opening-Related Patterns

Opening-related pattern refers to the pattern at which an opening is formed in the photoresist during its manufacturing process. There are many types of opening-related patterns in an integrated circuit. The most common ones are inter-level connections and segmented-lines.

FIGS. 1A-1B illustrate a conventional inter-level connection (i.e. physical connection 50va between upper-and lower-metal lines 162, 174). It is a 1 F-via 50va, i.e. its dimension (Dv) is equal to or less than 1 F, which is the minimum width (Dm, Dl) of metal lines 162, 174. The 1 F-via requires precise control over the shape of the opening on the mask (mask opening). Accordingly, the mask fabrication needs expensive equipment (e.g. e-beam writing). In addition, this type of bordered via (i.e. via 50va is completely encompassed by the overlapping area of metal lines 162, 174) has small overlay tolerance. It incurs a high processing cost.

FIG. 1BB illustrates a segmented-line 161S. As a comparison, a continuous line 161C is illustrated in FIG. 1BA. This segmented-line 161S comprises two segments 161', 161" separated by a segment-gap 161g. This segment-gap 161g is, in fact, a form of opening (referring to FIG. 26). Note that the segments 161', 161" have the same width and if the segment 161' is extended to the right, it preferably coincides with the segment 161".

2. High-Precision Mask

High-precision masks such as OPC-mask (optical proximity correction) and PSM (phase-shift mask) are developed to extend optical lithography beyond the range of conventional imaging. Both provide the first-order correctional structures to mask patterns. The OPC adds serifs to mask features to recover the loss of shape fidelity due to diffraction and the PSM adds phase-shifter to mask features in such a way that pattern diffraction is partly cancelled. As a result, the imaged wafer patterns have more desired shapes. The correctional structures used by the OPC and the PSM are in direct contact with the zero-order pattern (the mask pattern that forms the majority portion the wafer pattern). Details on OPC and PSM can be found on "Silicon Processing for the VLSI Era", Vol. 1, 2nd Ed., by Wolf and Tauber, pp. 628-37. Both techniques add significant cost to lithography.

3. Semi-Custom Integrated Circuit (SCIC)

In an SCIC, customers are only involved in the design of a limited number of layers. SCIC manufacturers stock a large number of base wafers. On base wafers, only transistor patterns are finished. Interconnects between transistors are not processed until customer inputs are received. There are two key concepts in SCIC: one is SCIC family; the other is SCIC product. A SCIC family comprises a number of SCIC products. In a SCIC product, all chips have the same transistor and interconnect patterns; in a SCIC family, all SCIC products have the same transistor pattern, but chips from different SCIC products may have different interconnect pattern. The patterns used in SCIC include common patterns and custom patterns: the common patterns are shared in a SCIC family and created by common masks; the custom patterns are only used in a single SCIC product and conventionally created by custom masks. In the memory world, one exemplary SCIC is read-only memory (ROM); in the logic world, one exemplary SCIC is programmable gate-array (PGA).

In a ROM, memory cell could be located at the intersection of horizontal and vertical metal lines. The bit stored in a memory cell is represented through the existence or absence of a via. Accordingly, vias are referred to as info-vias. The via configurations of FIGS. 1CA-1CB, if used in ROM, represent two ROM products: in FIG. 1CA, ROM cells 93, 94 represent "0", "1", whereas, "1", "0" in FIG. 1CB. One ROM of particular interest is three-dimensional read-only memory (3D-ROM), which is disclosed in U.S. Pat. No. 5,835,396. In the 3D-ROM, there is a 3D-ROM layer (a.k.a. quasi-conduction layer) between said vertical and horizontal lines (referring to FIG. 4 of U.S. Pat. No. 5,835,396).

In PGA, the connections between metal lines are configured by vias. Accordingly, vias are referred to as config-vias. If used in PGA, the via configuration of FIGS. 1CA-1CB creates two metal connections: in FIG. 1CA, horizontal line 162 is connected with vertical line 174, whereas, in FIG. 1CB, it is connected with vertical line 173.

In PGA, routings can be configured through metal-line segmentation. For example, if the metal mask of FIG. 1BB is used, the gap 161g will segment the metal line 161S into two segments 161', 161", each of which can be used for separate routing and has smaller capacitive load; on the other hand, if the metal mask of FIG. 1BA is used, the metal line 161C will be a continuous line. The metal lines of FIGS. 1BA-1BB can be used in different configurations.

4. Application-Specific Integrated Circuit (ASIC)

In general, ASIC is small and fast. In prior arts, all masks used in an ASIC product are custom masks. The large number of custom masks makes medium-to small-volume ASIC expensive. Even in the shuttle programs provided by several foundries, a 5 mm×5 mm chip costs~$75,000. This price tag is difficult to accept for most design-houses.

5. Fabrication of Conventional Mask and Master Optical Disc

In the prior art, the fabrication of a conventional mask is similar to lithographic process in IC. First, photoresist is coated on mask blank, and exposed by e-beam. Then the undesired Cr film is etched away. It is time-consuming and expensive. For PGA, ROM and others, the mask-making should take advantage of the fact that typical openings in these devices are regularly sized and spaced. The opening masks for these devices can be made in a shorter time and at a lower cost.

Optical discs, such as CD, VCD, DVD, have a huge consumer market. An optical disc is fabricated by pressing a master optical disc on a disc blank. Currently, the fabrication of master optical disc is similar to the fabrication of mask in IC. It is time-consuming and expensive.

OBJECTS AND ADVANTAGES

It is a principle object of the present invention to provide a low-cost lithography.

It is a further object of the present invention to lower the mask cost.

It is a further object of the present invention to lower the cost of lithographic and related processes.

It is a further object of the present invention to lower the cost of high-precision masks as well as improve the lithographic resolution.

In accordance with these and other objects of the present invention, a low-cost lithography is disclosed.

SUMMARY OF THE INVENTION

The low-cost lithography disclosed in the present invention is based on two approaches: 1. Use low-precision mask (e.g. nF-opening mask) to implement high-precision pattern (e.g. opening-related patterns); 2. Improve the mask re-usability (e.g. with programmable litho-system and/or logic litho-system). To take full advantage of these techniques, "design-for-litho-programming (DFL)" is preferred. Low-cost lithography can be used in litho-programmable integrated circuits (e.g. litho-programmable SCIC and litho-programmable ASIC), as well as the fabrication of conventional masks and master optical discs. On the other hand, pattern-distribution enables the mask-repair by redundancy. It further enables highly-corrected mask, which provides higher-order correctional structures for clear patterns on wafer.

1. nF-Opening-Related Patterns and Processes

The present invention discloses means for implementing high-precision pattern through low-precision (thus low-cost) mask. This approach is particularly suitable to implement opening-related patterns (e.g. inter-level connection and segmented-line). For inter-level connection, the dimension of the opening perpendicular to the upper metal line is controlled by the width of the upper metal line; the dimension of the opening along the upper metal line can be larger than the width of the lower metal line. For segmented-line, the dimension of the opening (i.e. segment-gap) is preferably larger than the width of the metal line. Accordingly, the dimension of the opening used in these patterns can be larger than the width of the metal line it interacts with. Because the minimum metal width is 1 F, the opening dimension could be nF, with n>1. In the other words, the nF-opening mask (n>1, feature size>1 F) can be used to implement high-precision opening-related patterns (feature size ~1 F). It offers the following benefits: 1. With a large feature size, the nF-opening mask costs less; 2. With a large toleration on the pattern shape, the nF-opening mask can be made with low-precision tools, even in-house with a conventional litho-tool; 3. The nF-opening mask can tolerate large alignment errors to the upper/lower-level metal patterns. The associated processing cost is lower.

In the present invention, the inter-level connection manufactured from the nF-opening mask is referred to as aiv. During its manufacturing process, damascene, particularly dual-damascene technique is preferably used. Dual damascene can take the form of embedded nf-opening, nF-opening-first-trench-second, trench-first-nF-opening-second. On the other hand, segmented-line can be implemented through litho-"OR" between an nF-opening mask and a continuous-line mask.

2. Programmable Litho-System

A programmable litho-system can be used to improve the mask re-usability. Its core technology is a programmable mask. Being a "soft" mask, a programmable mask can adjust the pattern thereon based on a set of configuration data. Accordingly, the configuration data are coded into an image carrier (i.e. the object that receives the exposure light in a litho-tool, e.g. wafer, mask blank, or master disc. Unless being specifically mentioned, wafer is used as an example). Opening-programmable mask (OPM) is one type of programmable mask that is well suited to adjust the light intensity at openings.

An OPM comprises at least an opening-defining plane (ODP) and a light-modulating plane (LMP). The ODP defines the final shape of openings on wafer; the LMP controls light intensity at said opening. Preferably, the ODP and the LMP are located on separate surfaces. This arrangement offers more design freedom, better manufacturability and longer exposure endurance. The LMP comprises a plurality of light-modulating cells (LMC). They include liquid-crystal-LMC (LC-LMC), MEMS-type-LMC (MEMS-LMC), and emissive-LMC. The LC-LMC and the MEMS-LMC can be either transmissive or reflective. The LC-LMC is similar to liquid-crystal display (LCD). The MEMS-LMC comprises at least one movable element, whose position controls the state of opening ("ON" or "OFF"). Typical movable elements are slider, rotor, roller-shade, digital micro-mirror, and digital light-valve. The emissive-LMC controls light emission at each cell. The LMC can be built in three-dimension (multi-level) to improve its density. On the other hand, the peripheral circuit of an LMC preferably comprises a transistor and may use technologies developed in SOI (e.g. backside grinding, smart-cut).

3. Logic Litho-System

In a logic litho-system, wafer pattern is generated through a series of litho-logic operations between mask images. Typical litho-logic operations include litho-"OR" and litho-"AND". Litho-"OR" can be implemented through multiple exposures on a wafer. Litho-"AND" can be implemented through multiple filterings to the exposure light.

One important consequence of the logic litho-system is pattern-distribution. With pattern-distribution, wafer patterns are distributed on a plurality of mask, or in a plurality of mask regions on a single mask (a.k.a. pattern-distributed mask). After performing a litho-logic operation to the patterns from these masks (regions), the desired wafer pattern can be obtained. Pattern-distribution can be used to improve the mask re-usability. It can further enable the mask-repair through redundancy and highly-corrected masks.

In some IC designs, one portion of the circuit is quite mature (mature circuit), with another often subject to change (volatile circuit). In prior arts, a small circuit change translates to a costly new order for the whole mask. On the other hand, with pattern-distribution, the wafer patterns can be distributed on two masks: one for mature circuit (mature mask) and the other for volatile circuit (volatile mask). The mature mask can be used in a number of products—an improvement of the mask re-usability. Moreover, the data amount on the volatile mask is typically small and therefore, its fabrication is much less time-consuming and less expensive.

A. Mask-Repair Through Redundancy

Pattern-distribution enables the mask-repair through redundancy. In prior arts, the defective primary mask (i.e. the mask supposed to carry the patterns to be formed on wafer) is repaired at the defect sites. To be more specific, the defect sites are first cleared on the primary mask then the correctional structures are formed in the cleared space. Because a typical mask is "feature-dense", "repair-at-site" will likely damage the adjacent "known-good" mask features and therefore, is error-prone. The situation becomes even worse for the OPC-mask and the PSM.

On the other hand, during mask-repair through redundancy, after clearing or darkening the defect sites (depending on the logic litho-operation to be used), instead of "repair-at-site", the correctional structures are formed in a redundant mask (region). These redundant patterns can form the desired wafer pattern through a litho-logic operation with the primary patterns. Because the correctional structures are formed in a separate area on the mask or on a different mask, this formation process will unlikely interfere with other "known-good" mask patterns. As a result, "repair-through-redundancy" is more reliable and robust. It is particularly suitable to repair the OPC-mask and PSM. Mask-repair through redundancy can improve the mask yield.

B. Highly-Corrected Masks

Another important application of pattern-distribution is in the area of highly-corrected masks. In prior arts, because the features are closely spaced, there is not much space to accommodate higher-order correctional structures. This is no longer true to a pattern-distributed mask. After pattern-distribution, the feature spacing on the pattern-distributed mask can be much larger than that on a conventional mask. This results in less proximity effect and less OPC-computing. Secondly and more importantly, the larger spacing between mask features can be used to accommodate highly-order correctional structures. As a result, even if the same litho-tool is used, the highly-corrected masks can achieve much better lithographic resolution. Moreover, the highly-corrected mask can still be a binary mask. This can greatly simplify the mask fabrication.

4. Design-For-Litho-Programming (DFL)

Ideally, a few general-purpose masks (GPM) can be used in most lithographic processes. The GPM examples include uniform opening programming mask (UOPM) and uniform metal-line mask (UMLM). On an UOPM, all programmable openings have the same size and same spacing, preferably 1 F or 2 F; on an UMLM, all metal lines have the same width and same spacing, preferably 1 F. To maximize their usage, IC layout preferably follows "design-for-litho-programming (DFL)". One set of DFL rules require that: a. any inter-level connection on a wafer should correspond to the location of a programmable opening on the UOPM; b. at least the metal lines inside the programming area has the same width and same pitch, preferably with a smaller or equal corresponding width than and equal or half corresponding pitch to the programmable openings on the UOPM.

5. Composite Litho-System

Composite litho-system combines programmable litho-system with logic litho-system. Besides programmable SoC and programmable lines, a composite litho-system enables the deep-sub-µm litho-programming based on manufacturable OPM. It can also improve the mask yield and offer longer exposure endurance to an OPM.

The size of typical manufacturable LMC (preferably based on the mature LCD technology) is ~5 µm. With R (image-reduction ratio of a reduction stepper) 4×-5× and assuming no ODP, the wafer opening could be as large as ~1 µm. This is too large for any deep-sub-µm litho-programming. Fortunately, because the ODP opening is the opening that defines the final shape of the wafer opening, a small ODP opening size can make the final wafer opening small enough. However, the LMC size still dictates the wafer-opening period Pw. With a large Pw (~1 µm), not all wafer openings can be litho-programmed at once. A practical solution is to use a composite litho-system, where a multi-pass exposure with displacement is adopted (i.e. inter-leaved exposure). In the multi-pass with displacement, a first number of openings are first exposed, then a displacement ΔS is made to the wafer or to the mask before a second number of openings are exposed. By setting ΔS to the Pw for that deep-sub-µm node, the Pw requirement can be met. Alternatively, the litho-tools with large R (e.g. 20) can be used. Another practical solution is by twice-imaging (referring to section "Quasi-opening-programmable mask").

During its usage, an OPM preferably goes through a field inspection to ensure a desired pattern is generated. An image sensor can be used for this purpose. On the other hand, to improve the mask yield, a redundant mask (region) can be used. The OPM is well suited for this purpose.

With separate LMP and ODP, the OPM can endure long-term exposure. Between exposures, the location of the ODP is fixed, while the LMP is displaced. As a result, all regions on LMP are evenly heated and this prolongs the OPM lifetime.

6. Applications of Low-Cost Lithography

Low-cost lithography combines techniques such as nF-opening mask, programmable litho-system, and logic litho-system. It is ideal for the fabrication of litho-programmable integrated circuits (LP-IC). The LP-IC comprises a plurality of litho-programmable opening-related patterns (e.g. inter-level connections and segmented-lines). It can be implemented with an UOPM and optionally with an UMLM. In an LP-IC flow, a customer first creates a set of customer data; then s/he sends to the fab an order, which has an order volume; the fab returns with a price quote. The overall expected revenue for this order, which is the product of the order volume and the price quote, can be smaller than the cost of the conventional custom opening-mask set corresponding to said opening-related patterns (custom patterns). In contrast, in prior arts, the completion of the same order involves making a new set of (conventional) custom masks. The manufacturing cost, including other processing and materials costs, should at least be higher than the cost for these masks. Namely, the overall expected revenue of the conventional (non-litho-programmable) IC cannot be lower than the mask cost.

One example of LP-IC is litho-programmable SCIC (LP-SCIC). In an LP-SCIC, a limited number of custom layers are formed by litho-programming. The LP-SCIC includes litho-programmable ROM (LP-ROM) and litho-programmable PGA (LP-PGA). Another example of LP-IC—litho-programmable ASIC (LP-ASIC)—goes even further. In the LP-ASIC, no custom masks (at least no expensive custom masks) are used for the back-end interconnects. The LP-ASIC design needs to follow a more stringent ASIC-DFL: in at least one metal layer, metal lines are aligned along a first direction with their width and spacing preferably 1 F; in a metal layer next to said metal layer, metal lines are aligned along a second direction with their width and spacing also preferably 1 F. By repetitively using GPM's such as UOPM and UMLM, all interconnect patterns are formed. Shared in many LP-ASIC products, the GPM's add little cost to ASIC chip.

Low-cost lithography, more particularly OPM, can be used to fabricate conventional masks. Accordingly, this type of conventional mask is referred to as quasi-opening programmable mask (QOPM). It is quasi-programmable because the configuration data can be easily coded into the QOPM in-house. After being coded by an OPM pattern, the QOPM is used to generate patterns on wafer. By "imaging twice" (first from an OPM to a QOPM, then from the QOPM to a wafer), the image-reduction ratio from the OPM to the wafer is R2 (R=4×-5×, R2=16×-25×). As a result, manufacturable OPM (preferably based on mature LCD with dimension ~5 µm) can be used to create deep-sub-µm features.

Low-cost lithography can also be used to fabricate master optical disc. This process is similar to that of the QOPM. Note that pits on the master optical disc are on a spiral. Between exposures, the disc needs to be rotated and displaced.

7. Business Model

The LP-IC preferably follows an internet business model, i.e. a customer send a set of customer data to the fab through internet. Here, the customer data may comprise a file pointer. Said file pointer points to a file in a database, which the fab has fast access to. Once a new order is received, a new set of configuration data is issued to the OPM and then coded into the wafers-under-exposure. Accordingly, the customer have direct, remote, real-time control over the wafers-being-processed.

Using a conventional "hard" mask for coding, the prior-art ROM usually only stores "public" information (e.g. operating system). With the advent of litho-programming, litho-programmable ROM (LP-ROM) can be used to store "personal" information. To provide better information security, the LP-ROM data sent to the fab are preferably encrypted. Moreover, a decryption engine and a key storage are preferably formed on the same chip as the LP-ROM. After it is shipped back from the fab, user inputs the key to enable the chip. Thus, the key is not exposed to any third party, during the chip manufacturing or during the chip usage. This guarantees maximum data security.

BRIEF DESCRIPTION OF DRAWINGS

FIGS. 1A-1CB illustrate several opening-related patterns used in prior arts.

FIG. 2A illustrates a preferred nF-opening and its interaction with various metal lines; FIG. 2B illustrates the core and peripheral portions of said opening on an nF-opening mask.

FIGS. 3AA-3BB illustrate several preferred aivs.

FIGS. 4AA-4CC illustrate several preferred dielectric structures used in aiv.

FIGS. 11A-11MD illustrate the structures and peripheral circuits for several preferred sliders.

FIGS. 12A-12EC illustrate the structures and peripheral circuits for several preferred rotors.

FIGS. 13AA-13CB illustrate the structures and peripheral circuits for several preferred hinges.

FIGS. 14A-14EB illustrate the structures and peripheral circuits of a preferred roller-shade LMC (RS-LMC).

FIGS. 15A-15C illustrate the structures of several preferred reflective LMC's (R-LMC).

FIGS. 16A-16B illustrate the structure and circuit symbol of a preferred emissive LMC (E-LMC).

FIGS. 17AA-17BC illustrate the structures of several three-dimensional LMC (3D-LMC).

FIGS. 18A-18D describe a preferred process flow for a peripheral circuit in an LMC.

FIGS. 23AA-23DC illustrate several preferred correctional structures for vias on a highly-corrected mask.

FIGS. 39A-39BC illustrate several preferred business models for an LP-IC and a preferred litho-programmable ROM (LP-ROM).

For the reason of simplicity, in this disclosure, the figure number with a missing appendix refers to all figures with that appendix. For example, FIG. 11 refers to FIGS. 11A-17MD; and FIG. 11M refers to FIG. 11MA-11MD.

DETAILED DESCRIPTION OF PREFERRED EMBODIMENTS

1. nF-Opening-Related Patterns and Processes

Figure 5A:
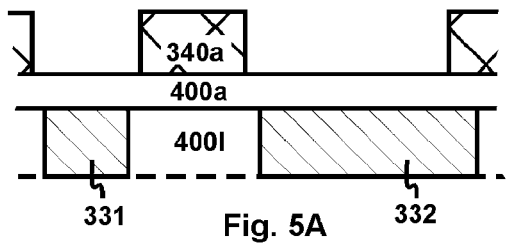
FIGS. 5A-5D (including FIG. 5A') describe several preferred aiv processes based on the conventional metallization.

According to the present invention, low-precision masks (nF-opening masks) can be used to implement high-precision opening-related patterns (e.g. inter-level connections and segmented-lines).

A. nF-Opening-Related Patterns

Opening-related pattern refers to the pattern at which an opening is formed in the photoresist during its manufacturing process. FIG. 2A illustrates an opening 50*o*. It can interact with metal line 162 (and 174) adjacent to it. If the metal lines 162, 174 are on adjacent metal levels, the opening 50*o* can form an inter-level connection between them; on the other hand, the opening 50*o* can also segment the metal line 162 to form metal segments 162*l*, 162*r*. Accordingly, inter-level connection and segmented-lines are referred to as opening-related patterns. For inter-level connection, Wo, Lo of the opening 50*o* can be larger than Dm, Dl of the metal lines 162, 174 (~1 F); for segmented-lines, Wo of the opening 50*o* can larger than Dm of the metal line 162 (~1 F). Namely, the dimension Wo (and Lo) of the opening pattern 50*o* can be larger than the width Dm (and Dl) of the metal-line patterns it interacts with. Accordingly, the opening 50*o* is referred to as nF-opening (with n>1, preferably 2). At the 0.13 μm node, the nF-opening mask can use masks from the 0.25 μm node. Apparently, they are much less expensive.

FIG. 2B illustrates the core portion 50*oc* and the peripheral portion 50*op* of the nF-opening 50*o* on an nF-opening mask 50*om*. During its lithographic process, only the core portion 50*oc* needs to be fully exposed. For the peripheral portion 50*op*, there is little requirement on exposure dosage and image fidelity (as will become apparent as FIGS. 3AA-3BB and FIGS. 26A-26FC are explained). Without stringent requirements on the shape of the openings, the nF-opening masks can be made in-house, even in a conventional litho-tool. That further lowers the mask cost and shortens the turn-around time. Moreover, it is acceptable to have a large alignment tolerance between the nF-opening mask and the metal-line masks. This can lower the processing cost.

B. Aiv Structures

To differentiate from a conventional 1 F-via, the physical opening formed in the inter-level connection based on an nF-opening mask is referred to as aiv. FIG. 3AA illustrates the relative placement of the nF-opening pattern vs. the upper-level metal pattern, and FIG. 3AB illustrates the relative placement of the nF-opening pattern vs. the lower-level metal pattern for two aivs 321*a*, 322*a*. Because the cross-sectional views along both the length and width directions of an aiv are shown therein, FIG. 3 and figures thereafter choose this aiv configuration to illustrate the invention. Here, the length direction of an aiv is perpendicular to the upper-level metal line; the width direction is along the upper-level metal line. The nF-openings 321, 322 provide inter-level connections between the upper-level metal line 311 and the lower-level metal line 331, between the upper-level metal line 312 and the lower-level metal line 332, respectively. The aiv pattern on wafer is the intersection of nF-opening pattern and upper-level metal pattern. FIG. 3AC illustrates the cross-sectional view of aivs 321*a*, 322*a* along A1-A2. Along the width direction of the aiv 322*a*, the aiv width 2*wa* is equal to the width 2*lwm* of the upper-level metal line 312. Accordingly, at this direction, the precision of the aiv pattern is controlled by the upper-level metal mask. On the other hand, along the length direction of the aiv 321*a*, the aiv length 1*la* is equal to the length 1*lo* of the nF-opening 321 and it can be larger than the width 1*wl* of the lower-level metal line 331. As long as the right edge 1*ar* of the aiv 321*a* (corresponding to the right edge 1*r* of nF-opening 321 in FIG. 3AA) does not touch the adjacent lower-level metal line 332, circuit performance will not be affected much. Accordingly, the layout of nF-openings is very flexible.

For the nF-openings with n≧2, adjacent openings 50*oa*, 50*ob* can be combined into a merged opening 50*o*2 (FIG. 3BA). It provides inter-level connection for the upper-level metal line 162 and two lower-level metal lines 174, 175. In contrast to conventional vias (where, even if connected to a same metal line, adjacent vias are still physically separate), the merged aiv 50*a*2 is continuous (FIG. 3BB). As a reference, a standalone aiv 50*od* (i.e. not merged with other aivs) is also illustrated in FIG. 3BB. The merged opening 50*o*2 can help further lower the mask cost.

In FIGS. 2A-3BB, the inter-level connection is a bipolar connection (i.e. its resistance along both directions is low). It should be noted that, other forms of inter-level connections can also use the nF-opening mask. Examples include programmable inter-level connection (e.g. antifuse) and unipolar inter-level connection (i.e. its resistance is higher in one direction than in the other, e.g. 3D-ROM cell). In a programmable inter-level connection, aiv comprises an antifuse layer; in a unipolar inter-level connection, aiv comprises a ROM layer (a.k.a. quasi-conduction layer). Similarly, the aiv length in these devices can also be larger than the width of the lower-level metal line, and the aiv width can be equal to the width of the upper-level metal line. Their manufacturing process can be similar to the (bipolar) inter-level connection of FIGS. 2A-3BB.

In aivs and the metal lines they connect (FIG. 3AC and FIG. 3BB), the dielectric between the lower-level metal lines (e.g. 331, 332) is referred to as lower-level dielectric 400*l*; the dielectric between the aivs (e.g. 321*a*, 322*a*) is referred to as inter-level dielectric 400*a*; and the dielectric between the upper-level metal lines (e.g. 311, 312) is referred to as upper-level dielectric 400m. FIGS. 4AA-4CC illustrate several preferred dielectric structures.

FIGS. 4AA-4AB illustrate several preferred lower-level dielectrics 400l. In FIG. 4AA, it comprises a single, uniform dielectric 400d0. In FIG. 4AB, it comprises at least two dielectric films 400d8, 400d9. The dielectric film 400d9 typically comprises low-κ dielectric (e.g. silicon dioxide, SiLK). The dielectric film 400d8 can be used as an etchstop layer for the inter-level dielectric 400a. It may comprise silicon nitride, high-ρ poly- or amorphous silicon.

FIGS. 4BA-4BC illustrate several preferred inter-level dielectrics 400a. In FIG. 4BA, it uses a single, uniform dielectric 400d1. In FIG. 4BB, it comprises two dielectric films 400d2, 400d3. The dielectric film 400d2 can be used as etch-stop layer for the dielectric film 400d3. It comprises silicon nitride, high-ρ poly- or amorphous silicon. The dielectric film 400d3 comprises low-κ dielectric. In FIG. 4BC, the inter-level dielectric 400a comprises three dielectric films 400d4, 400d5, 400d6. Each dielectric film can be an etchstop layer for the film located thereon. Examples are: the dielectric film 400d5 comprises low-κ dielectric; the dielectric films 400d4, 400d6 comprise silicon nitride, high-ρ poly- or amorphous silicon.

FIGS. 4CA-4CC illustrate several preferred upper-level dielectrics 400m. In FIG. 4CA, it uses a single, uniform dielectric 400d10. In FIG. 4CB, the upper-level dielectric 400m comprises two dielectric films 400d11, 400d12. The dielectric film 400d12 can be used as a hard-mask for the dielectric film 400d11. Examples are: the dielectric film 400d11 comprises low-κ dielectric; the dielectric film 400d12 comprises silicon nitride, high-ρ poly- or amorphous silicon. In FIG. 4CC, the upper-level dielectric 400m comprises three dielectric films 400d13, 400d14, 400d15. Each dielectric film can be an etchstop layer for the film located thereon. Example are: the dielectric film 400d14 comprises low-κ dielectric; the dielectric films 400d13, 400d15 comprise silicon nitride, high-ρ poly- or amorphous silicon. Alternatively, the dielectric film 400d13 may comprise silicon nitride, etc; the dielectric film 400d15 may comprise high-ρ poly- or amorphous silicon.

C. Aiv Processes

FIGS. 5A-7CE' illustrate several preferred aiv processes. They can be categorized according to the metallization process. They include conventional metallization, single damascene, and dual damascene.

a. Conventional Metallization

Figure 5B:
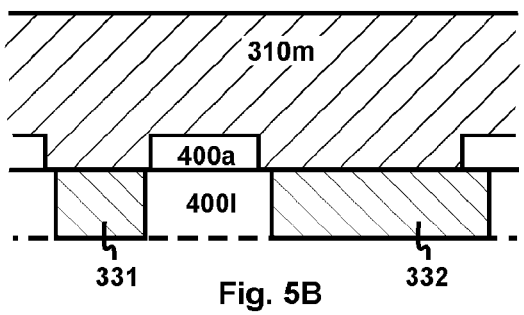
Figure 5C:
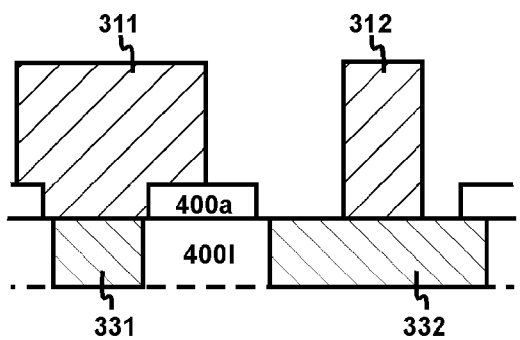
Figure 5D:
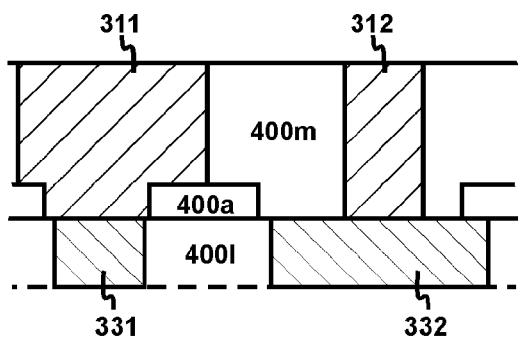
Figure 5A:
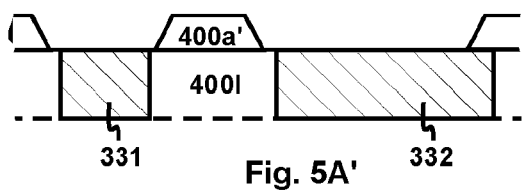

FIGS. 5A-5D (including FIG. 5A') describe several preferred aiv process flows based on conventional metallization. After the formation of the lower-level metal lines 331, 332, an inter-level dielectric 400a is formed above, upon which the nF-opening pattern 340a is transferred (FIG. 5A). After removing the inter-level dielectric 400a, a conductive film 310m is formed (FIG. 5B). With another lithographic step, a conductive film 310m forms upper-level metal lines 311, 312 (FIG. 5C). Then an upper-level dielectric 400m is filled in and planarized (FIG. 5D). FIG. 5A' is a variation of FIG. 5A. After the nF-opening pattern transfer, a tapered sidewall is formed in the inter-level dielectric 400a'. It facilitates the etch of the upper-level metal lines. The taper sidewall can also be used in other aiv structures.

b. Single Damascene

Figure 6A:
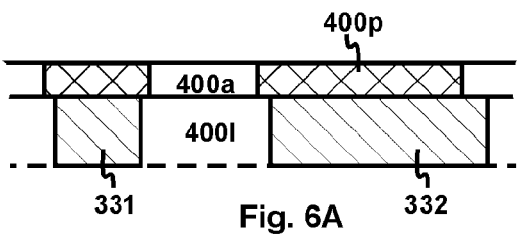
FIGS. 6A-6C' describe several preferred aiv processes based on single damascene.
Figure 6B:
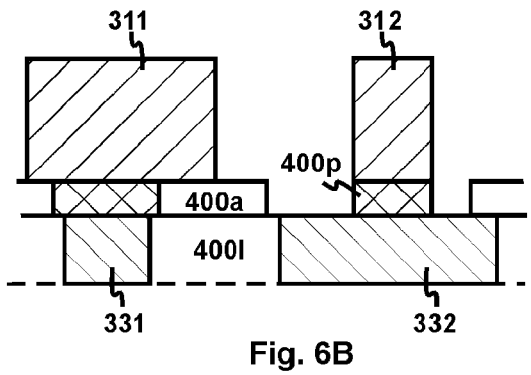
Figure 6B:
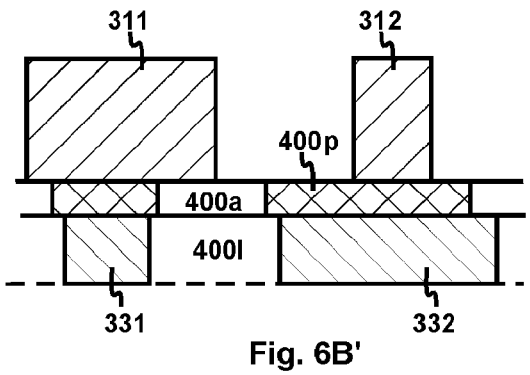
Figure 6C:
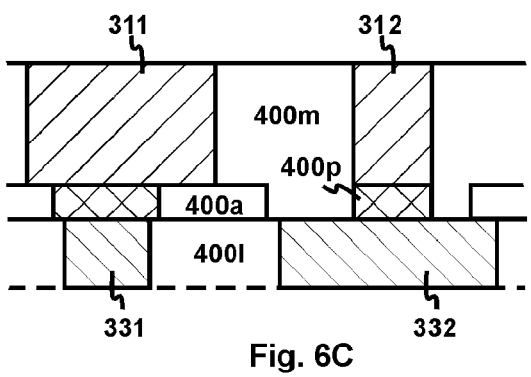
Figure 6C:
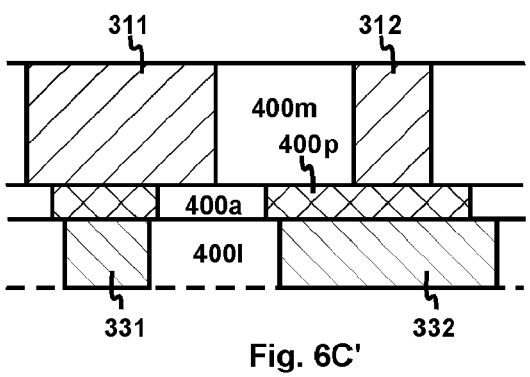

FIGS. 6A-6C' describe several preferred aiv process flows based on single damascene. After forming an nF-opening in the inter-level dielectric 400a, a single damascene step is performed, i.e. a metal plug 400p is formed in the nF-openings (FIG. 6A). This is followed by the formation of a conductive film and a lithographic step. The conductive film is then etched to form upper-level metal lines 311, 312. This etching step may remove a portion of the metal plug 400p (FIG. 6B) or stop thereon (FIG. 6B'). The last step is the fill-in of an upper-level dielectric and planarization (FIG. 6C, FIG. 6C').

c. Dual Damascene

Aiv process preferably takes full advantage of dual damascene. Dual damascene can take the form of embedded nF-opening (FIGS. 7AA-7AF, including FIG. 7AA' and FIG. 7AE'), nF-opening-first-trench-second (FIGS. 7BA-7BH), and trench-first-nF-opening-second (FIGS. 7CA-7CF, including FIG. 7CE').

Figure 7A:
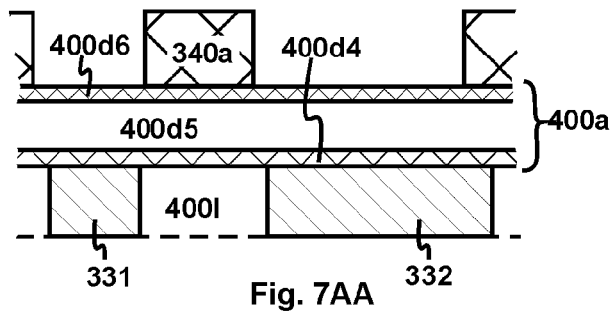
FIGS. 7AA-7CE' describe several preferred aiv processes based on dual damascene.
Figure 7A:
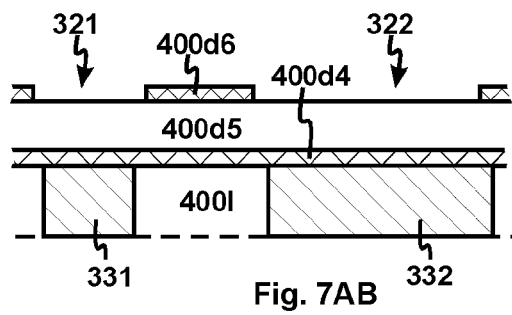
Figure 7A:
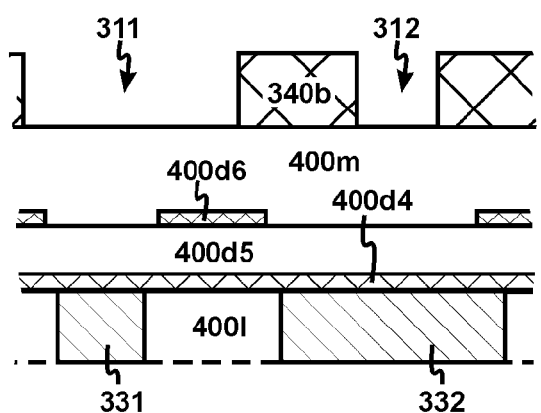
Figure 7A:
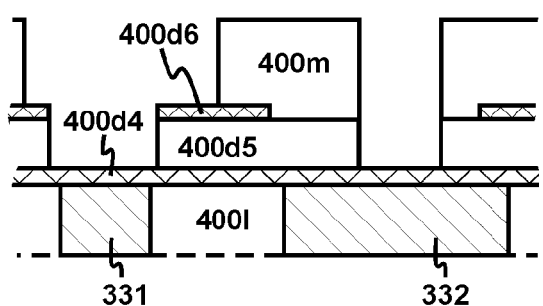
Figure 7A:
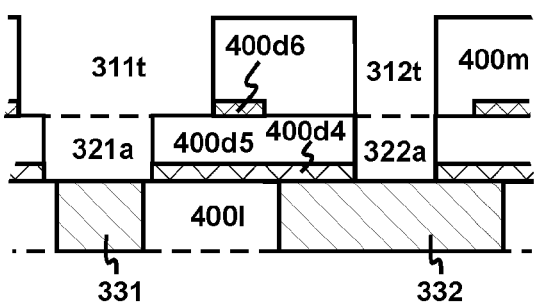
Figure 7A:
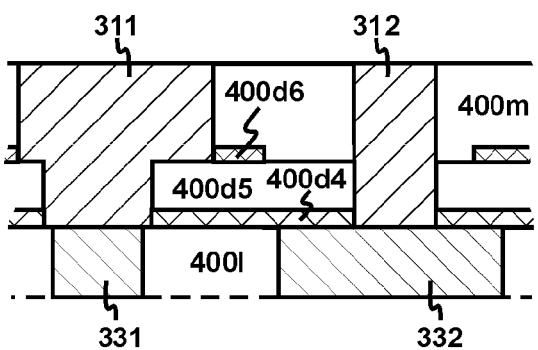
Figure 7A:
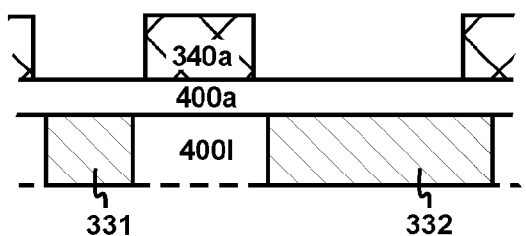
Figure 7A:
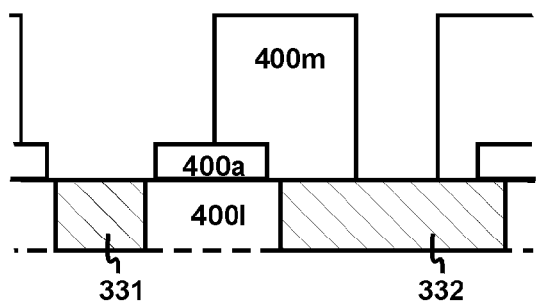

FIGS. 7AA-7AF illustrate a preferred aiv process based on dual damascene with embedded nF-opening. The name "embedded nF-opening" is derived from the fact that the nF-opening pattern is embedded between the inter-level dielectric 400a and the upper-level dielectric 400m. Its process flow is as follows. First, an inter-level dielectric 400a is formed on the lower-level metal lines 331, 332 (FIG. 7AA). It may use the preferred dielectric of FIG. 4BC, i.e. it comprises three dielectric films 400d4, 400d5, 400d6. The nF-opening pattern is transferred to the dielectric film 400d6 (FIG. 7AB). Then an upper-level dielectric 400m is formed. It may use the preferred dielectric of FIG. 4CA. This is followed by the pattern transfer of a trench mask 340b (FIG. 7AC). Then a series of etches are performed: a first etch removes the upper-level dielectric 400m and the dielectric film 400d5 until the dielectric film 400d4 is reached (FIG. 7AD); a second etch removes the remaining dielectric 400d4 until the lower-level metal lines 331, 332 are reached. Thus, aiv 321a, 322a and trenches 311t, 312t are formed (FIG. 7AE). At last, a conductive material is filled in and planarized (FIG. 7AF).

Compared with the conventional borderless dual damascene, the aiv length 1la is larger than the width 1wl of the lower-level metal line 331. To avoid over-etching the lower-level dielectric 400l during said series of etches, an etchstop layer 400d4 preferably covers the top surface of the lower-level dielectric 400l (the preferred dielectric of FIG. 4BC), or there is an etchstop layer 400d8 along both sides of the top surface of the lower-level metal line 331 (the preferred dielectric of FIG. 4AB).

FIG. 7AA', FIG. 7AE' illustrate an alternate preferred aiv process with embedded nF-opening. In this preferred embodiment, the inter-level dielectric 400a and upper-level dielectric 400m are both single, uniform dielectrics. Preferably they comprise different dielectrics (for example, 400a comprises nitride, 400m comprises oxide). Other processing steps are similar to those in FIGS. 7AA-7AF.

Figure 7B:
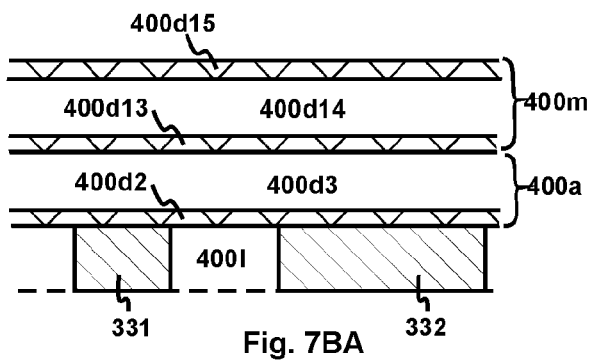
Figure 7B:
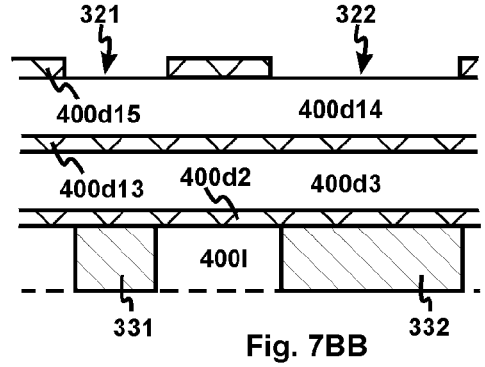
Figure 7B:
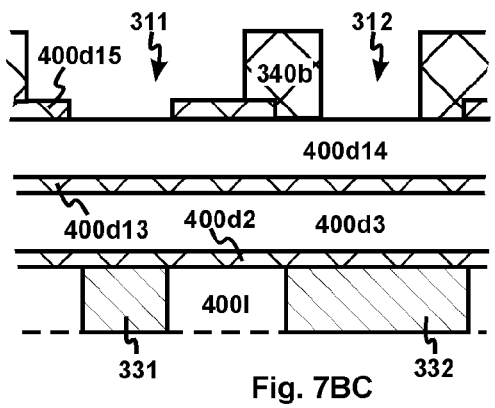
Figure 7B:
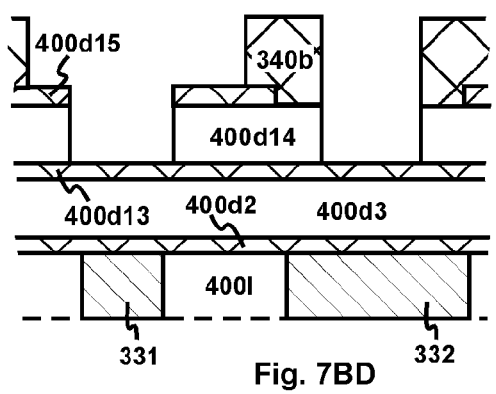
Figure 7B:
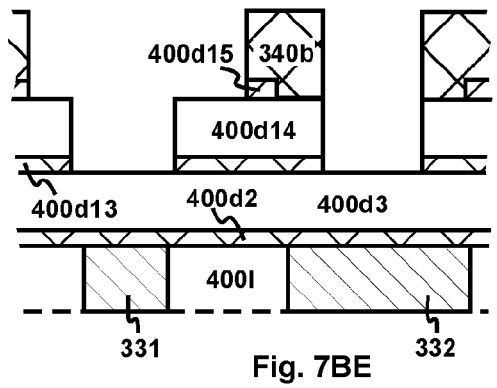
Figure 7B:
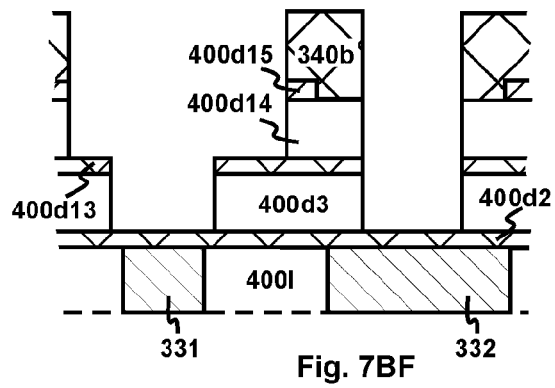
Figure 7B:
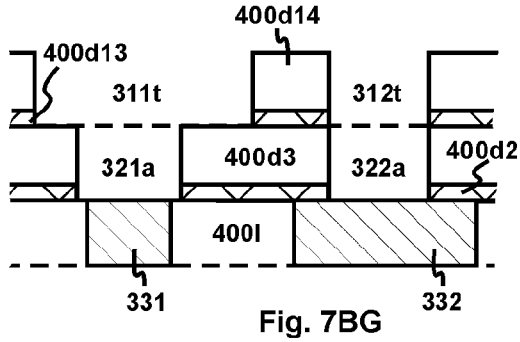
Figure 7B:
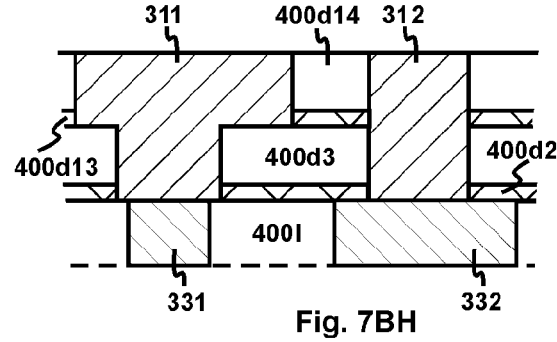
Figure 7C:
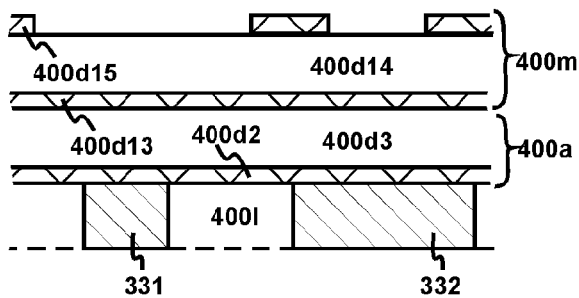
Figure 7C:
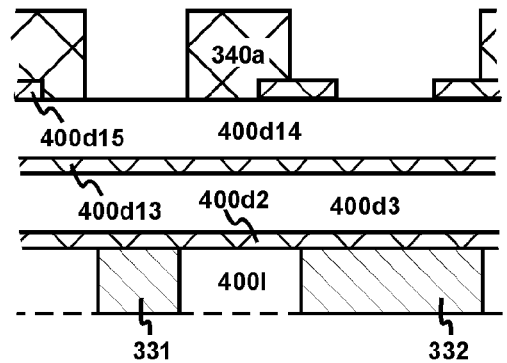
Figure 7C:
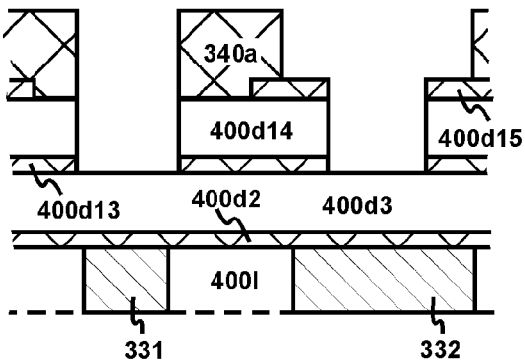
Figure 7C:
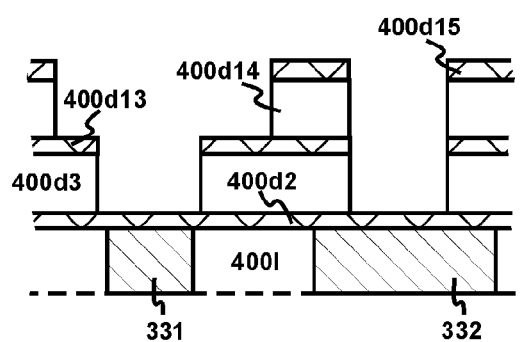
Figure 7C:
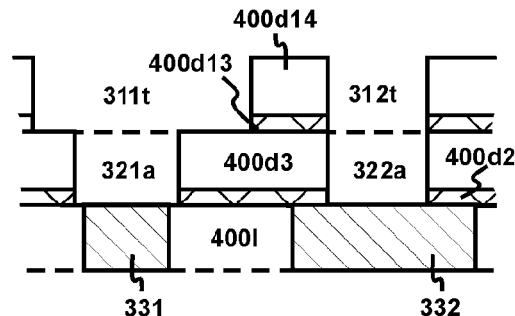
Figure 7C:
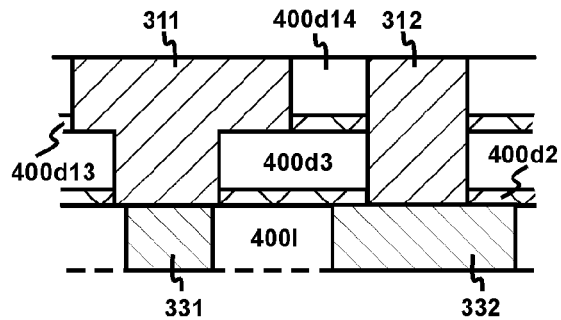
Figure 7C:
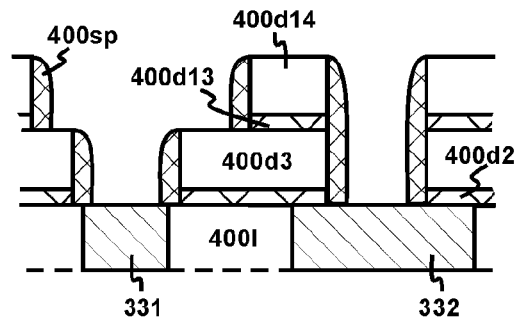

In FIG. 7A, the nF-opening pattern-transfer occurs between the formation of the inter-level dielectric and the upper-level dielectric. In FIG. 7B and FIG. 7C, all pattern transfers occur after these dielectrics are formed. The difference between FIG. 7B and FIG. 7C is the order in which the masks are applied.

FIGS. 7BA-7BH illustrate a preferred aiv process based on dual damascene with the nF-opening-first-trench-second. First, an inter-level dielectric 400a and an upper-level dielectric 400m are formed on the lower-level metal lines 331, 332 (FIG. 7BA). Here, the inter-level dielectric 400a uses the dielectric of FIG. 4BB, and the upper-level dielectric 400m uses the dielectric in the first example of FIG. 4CC. Next, the nF-opening patterns 321, 322 are transferred to the dielectric film 400d15 (FIG. 7BB). The etched dielectric film 400d15 can be used as a hard-mask for subsequent processing. Then a pattern-transfer is performed to a trench mask 340b (FIG. 7BC). This is followed by a series of etches: a first etch removes the exposed dielectric film 400d14 until 400d13 is reached (FIG. 7BD); a second etch removes the exposed dielectric films 400d15, 400d13 until 400d3, 400d14 are reached (FIG. 7BE); a third etch removes the exposed dielectric films 400d3, 400d14 until 400d2, 400d13 are reached (FIG. 7BF); photoresist is then removed and a fourth etch removes the exposed dielectric films 400d2, 400d13, 400d15 until 400d3, 400d14 are reached (FIG. 7BG). At last, a conductive material is filled in and planarized (FIG. 7BH).

FIGS. 7CA-7CF illustrate a preferred aiv process based on dual damascene with trench-first-nF-opening-second. Similar to FIG. 7BA, an inter-level dielectric 400a and an upper-level dielectric 400m are formed on top of the lower-level metal lines 331, 332. Different from FIG. 7BA, the trench patterns 311, 312 are transferred to the dielectric film 400d15 first (FIG. 7CA). Then, the nF-opening pattern 340a is transferred to photoresist (FIG. 7CB). In addition to photoresist, the dielectric film 400d15 can be used as a hard-mask. This is followed by a series of etches: a first etch removes the exposed dielectric film 400d14 until 400d15 is reached (FIG. 7CC); a second etch removes the exposed dielectric film 400d13 until 400d3, 400d15 are reached (FIG. 7CC); then photoresist 340a is removed and a third etch removes the exposed dielectric films 400d3, 400d14 until 400d2, 400d13, 400d15 are reached (FIG. 7CD); a fourth etch removes the exposed dielectric films 400d2, 400d13, 400d15 until 400d3, 400d14 are reached (FIG. 7CE). At last, a conductive material is filled in and planarized (FIG. 7CF).

After finishing said fourth etch of FIG. 7CE, a dielectric spacer 400sp can be formed on the sidewall of the aiv and the trench (FIG. 7CE'). Said dielectric spacer 400sp ensures electrical isolation between the aiv and the adjacent lower-level metal line. Apparently, a dielectric spacer can also be used in the damascene structures of FIGS. 5C, 6B, 6B', 7AE, 7AE', 7BG. In FIGS. 5C, 6B, 6B', the dielectric spacer is formed along both sides of the nF-opening; in FIGS. 7AE, 7AE', 7BG, it is formed along both sides of the aiv.

In FIG. 7, there are a plurality of etch-stop layers. In fact, timed etch could also be used. For the timed etch, some etchstop layers may not be needed in the aiv structure.

2. Programmable Litho-System

A programmable litho-system can be used to improve the mask re-usability. Its core technology is a programmable mask. Being a "soft" mask, a programmable mask can adjust the pattern thereon based on a set of configuration data. The configuration data are coded into an image carrier (i.e. the object that receives the exposure light in a litho-tool, e.g. wafer, mask blank, or master disc. Unless being specifically mentioned, wafer is used as an example). Opening-programmable mask (OPM) is one type of programmable mask that is well suited to adjust the brightness of openings.

Figure 8A:
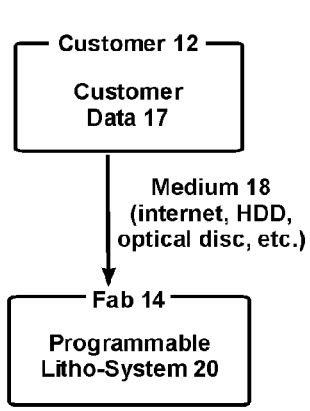
FIGS. 8AA-8BC illustrate several preferred programmable litho-systems.
Figure 8A:
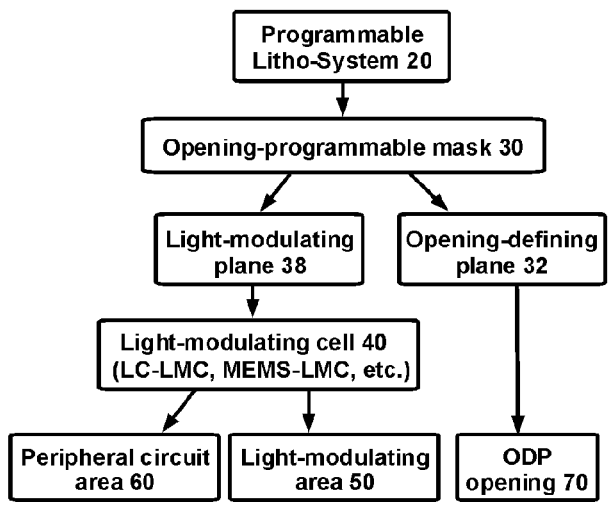

FIG. 8AA illustrates the flow of customer data 17 from a customer 12 to a fab 14 (e.g. a foundry). The customer data 17 can be encrypted or in plain-text. They are delivered to the fab 14 through a medium 18. The medium 18 includes internet, hard-disk drive (HDD), optical disc and other means. After necessary data processing in the fab 14, the customer data 17 are converted into a set of configuration data 16. The configuration data 16 are then hard-coded into the image carrier by the programmable litho-system 20.

FIG. 8AB illustrates the hierarchy of a programmable litho-system 20. Its core portion is an OPM 30. An OPM comprises at least an opening-defining plane (ODP) 32 and a light-modulating plane (LMP) 38. The ODP 32 defines the final shape of openings on a wafer, while the LMP 38 controls the light intensity at said opening. The ODP 32 comprises a plurality of ODP openings 70 and the LMP 38 comprises a plurality of light-modulating cells (LMC) 40. Each LMC 40 comprises a light-modulating area (LMA) 50 and a peripheral circuit 60.

Figure 8B:
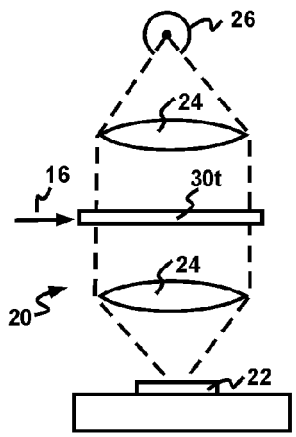
Figure 8B:
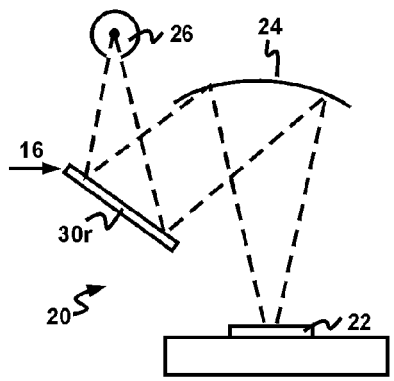
Figure 8B:
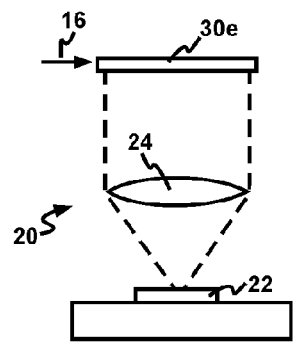

FIGS. 8BA-8BC illustrate three preferred programmable litho-system: transmissive, reflective and emissive. In FIG. 8BA, a transmissive programmable litho-system 20 comprises a light source 26, a transmissive OPM 30t and a projector 24. After the light passes through the OPM 30t, its intensity varies according to the patterns on said OPM 30t, which is controlled by the configuration data 16. FIG. 8BB illustrates a preferred reflective programmable litho-system 20. It is well suited for the litho-system using ultra-violet light (UVL). The light is modulated by a reflective OPM 30r before being projected onto the wafer 22. The reflecting/non-reflecting pattern of the reflective OPM 30r is controlled by the configuration data 16. In FIG. 8BC, an emissive programmable litho-system comprises an emissive OPM 30e. The emissive OPM 30e comprises of a plurality of light-emitting cells. By selectively turning on or off these cells, the configuration data 16 can be passed to the wafer 22. The emissive OPM 30e is similar to the multiple parallel electron guns used in an e-beam litho-system. Besides optical light, X-ray, e-beam or ion beam can also be used in the programmable litho-systems.

A. Opening-Programmable Mask (OPM)

Figure 9A:
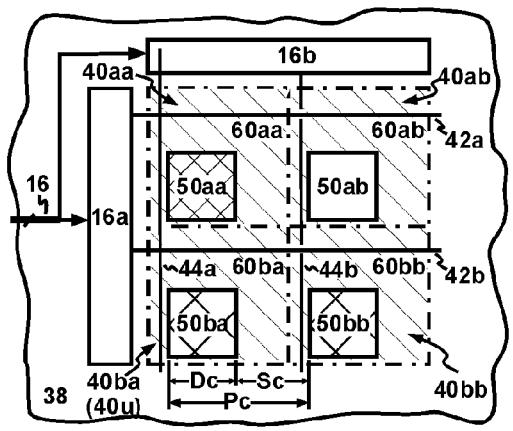
FIGS. 9AA-9BE illustrate the structures and relative placements of the LMP and the ODP in several preferred opening-programmable masks.
Figure 9A:
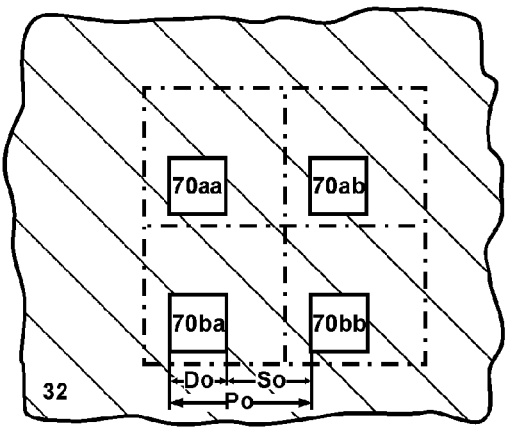

The OPM preferably has a programmable opening corresponding to every cross-point between vertical and horizontal metal lines in the ROM or PGA. FIG. 9AA is a plan view of a LMP 38. It controls the exposure intensity at openings 70aa-70bb (FIG. 9AB). In this preferred embodiment, the LMP 38 comprises a configuration-data bus 16 and a 2×2 light-modulating matrix. The light-modulating matrix comprises an array of LMC's 40aa-40bb, a row-decoder 16a and a column decoder 16b. The LMC is the basic building block of LMP 38. Each LMC 400aa-40bb comprises an LMA 50aa-50bb and a peripheral circuit 60aa-60bb. The LMA has a dimension of $D_c$, a spacing of $S_c$ and a period of $P_c$. Its state is controlled by address line 42a-42b and data line 44a-44b. At its "ON" state, the LMA can transmit light (for the transmissive OPM 30t) or reflect light to a pre-determined direction (for the reflective OPM 30r); at its "OFF" state, it cannot. In FIG. 9AA and figures thereafter, if the crosshatch in an LMA is sparse (as in LMA 50ba), the state of this LMA is un-defined; if the crosshatch is dense (as in LMA 50aa), this LMA is at the "OFF" state; if there is no crosshatch (as in LMA 50ab), this LMA is at the "ON" state. FIG. 9AB is a plan view of the ODP 32. It defines the final shape of the opening on wafer. Every opening is aligned with and preferably encompassed by an LMA (e.g. 70aa is aligned to 50aa, referring to FIGS. 9BA-9BE). The making of the ODP 32 is a standard mask-making process. It may use the advanced mask-making techniques, such as optical proximity correction (OPC) and phase-shift mask (PSM).

Figure 9B:
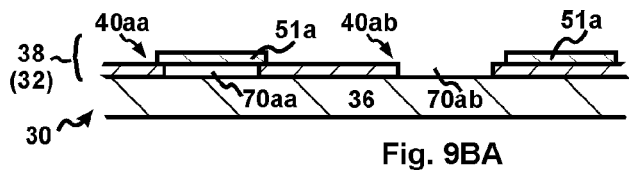
Figure 9B:
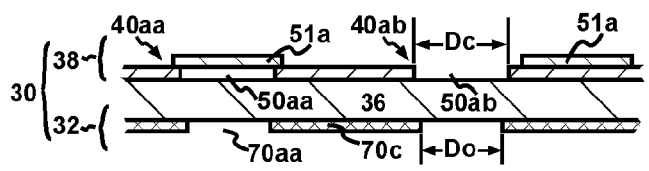
Figure 9B:
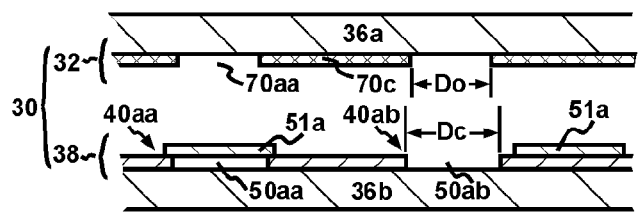
Figure 9B:
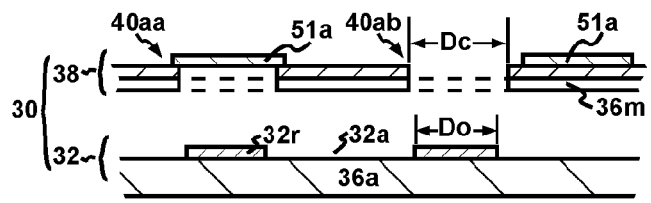
Figure 9B:
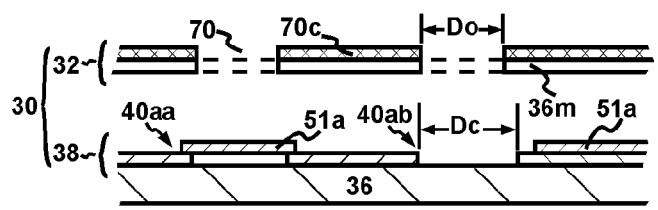

Referring now to FIGS. 9BA-9BE, the relative placements of several preferred ODP's and LMP's in an OPM are illustrated. In these figures, because it can better demonstrate the state of the LMC, a movable element—slider 51a—is used as example. In most cases, when the slider 51a covers the LMA 50aa, the LMC 40aa is at the "OFF" state; otherwise, it is at the "ON" state. In FIG. 9BA, the LMP 32 and the ODP 38 are merged and there is no physical distinction between them. In FIGS. 9BB-9BC, the ODP 32 and the LMP 38 are located on separate surfaces. This arrangement offers more design freedom, better manufacturability and longer exposure endurance (referring to FIGS. 34AA-34BB). In FIG. 9BB, the ODP 32 and the LMP 38 are located at two sides of the mask substrate 36. In FIGS. 9BC-9BE, the ODP 32 and the LMP 38 are located on two different substrates 36a, 36b. The preferred embodiment in FIG. 9BD can be used in a reflective-OPM or an emissive-OPM. For the reflective-OPM, the ODP 32 performs light reflection at each opening 32r; the LMP 38 can be built on a light-absorptive membrane 36m. For the emissive-OPM, the emissive plane 32 emits light at every opening 32r; the LMP 38 controls the intensity of light passing through. The preferred embodiment of FIG. 9BE can be used in a reflective-OPM. Compared with FIG. 9BD, the placements of the ODP 32 and the LMP 38 are exchanged. The movable element 51a comprises a reflective film. Apparently, the LMC in FIG. 9BE may use various preferred embodiments of FIGS. 15A-15C.

B. Light-Modulating Cell (LMC)

Figure 10A:
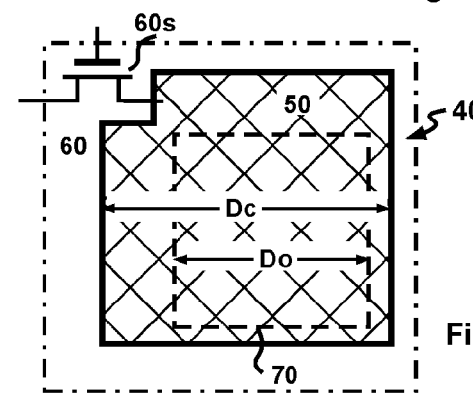
FIGS. 10AA-10CC illustrate the structures and peripheral circuits of a preferred liquid-crystal LMC (LC-LMC).

LMC is the basic building block of an OPM. It adjusts its light intensity according to the configuration data. It can borrow many design ideas and process ideas from the display industry. FIGS. 10AA-16B illustrate the structures and peripheral circuits of various preferred LMC's.

a. Liquid-Crystal LMC (LC-LMC)

Liquid-crystal display (LCD) technology is very mature. It can be readily applied to the liquid-crystal LMC (LC-LMC). FIGS. 10AA-10AB illustrate a preferred LC-LMC 40. The LC-LMC 40 comprises a switch 60s and a liquid-crystal LMA (LC-LMA) 50. It is aligned with an ODP opening 70 and preferably encompasses it. In FIG. 10AA and figures thereafter, the dashed ODP openings 70 shown in the LMC 40 is actually the projected image of the ODP opening 70 on the LMC 40, in the case the OPD opening 70 and the LMC 40 are not located on the same plane. The LC-LMC 40 comprises two opposing substrates 36e, 36f, two opposing electrodes 59p, 59m, two alignment layers 36b, 36d and a liquid crystal layer 36c. For the transmissive cell, there are two opposing polarizers on both sides of the liquid crystal. To those of ordinary skills in the art, light transmission through liquid crystal can be modulated by a voltage between the electrodes 59p and 59m. Alternatively, reflective LC-LMC can be used. Its material and manufacturing are well known in the art. Apparently, the LC-LMA 50 can occupy most area of the LMC 40 (FIG. 10AA).

Figure 10B:
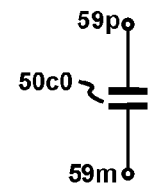
Figure 10C:
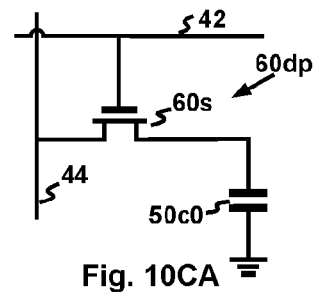
Figure 10C:
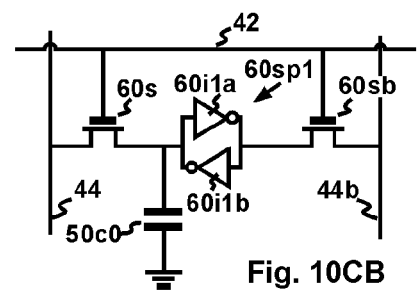
Figure 10C:
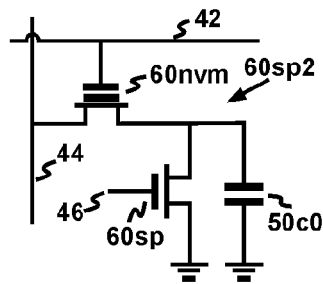
Figure 10A:
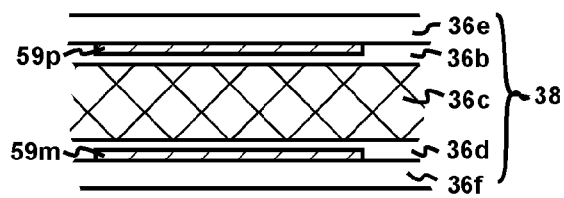

The circuit symbol representing the LC-LMC is a capacitor 50c0 (FIG. 10B). Its peripheral circuits are illustrated in FIGS. 10CA-10CC. The peripheral circuit of FIG. 10CA is a dynamic circuit. It uses a DRAM-type circuit 60dp. When the voltage on the address line 42 rises to high, the switch 60s is turned on. The corresponding configuration bit 44 is sent to the capacitor 50c0 and determines the state of the LMC. FIGS. 10CB-10CC are static circuits. For static circuits, leakage current in the capacitor will not affect the LMC state. This is particularly useful for long-term exposure (no refresh is needed). The preferred circuit in FIG. 10CB is an SRAM-type circuit 60sp1. It comprises two switches 60s, 60sb and an SRAM cell formed by two inverters 60i1a, 60i1b. Its operation is similar to that of FIG. 10CA. The preferred circuit in FIG. 10CC uses a non-volatile-memory (NVM)-type circuit 60sp2. It comprises a NVM cell 60nvm and a switch 60sp. Its operation includes two steps: a programming step and an exposure step. During the programming step (i.e. before exposure), the configuration bit is stored in the NVM cell 60nvm. The switch 60sp is turned on, and voltages are applied to the address line 42 and the configuration-bit line 44. The threshold voltage of the cell 60nvm is varied according to the configuration bit. During exposure, the capacitor 50c0 is first discharged. At this time, all address lines 42 and the configuration-bit line 44 are grounded with the switch 60sp on. Then the switch 60sp is turned off, and the voltages on all address lines 42 and the configuration-bit line 44 rise to appropriate values. If its threshold voltage is high, the NVM cell 60nvm is still off and the capacitor 50c0 is not charged; if its threshold voltage is low, the NVM cell 60nvm is on and the capacitor 50c0 becomes charged. As a result, the light passing through the LMC is modulated.

b. MEMS-LMC

MEMS-LMC can directly modulate the exposure intensity at each opening. At its "ON" state, because the exposure light does not have to pass any additional medium, its intensity loss is minimized. The MEMS-based programmable litho-system can achieve comparable throughput to a conventional litho-tool. In addition, because the MEMS structure physically blocks the light path, the MEMS-based OPM is insensitive to the wavelength of the exposure light. It can be used in DUV, EUV, X-ray, e-beam, ion-beam and other litho-systems. Examples of MEMS-LMC include: slider, rotor, hinge, roller-shade, digital micro-mirror, and digital light-valve.

Slider

Figure 11A:
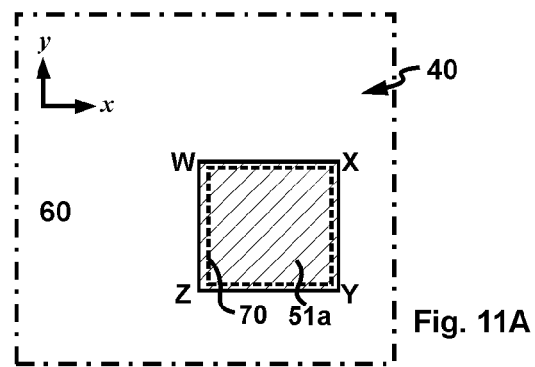

Slider is a simple MEMS structure with good manufacturability. FIGS. 11AA-11MD illustrate various preferred translational light-modulating cells (T-LMC). Its core element is a slider 51a. In FIG. 11AA, the slider 51a is at the "OFF" state, i.e. it covers the opening 70; whereas in FIG. 11AB, the slider 51a is at the "ON" state, i.e. it moves away from the opening 70. Being translational, the relative position of the four corners WXYZ of slider 51a does not change during the movement.

Figure 11B:
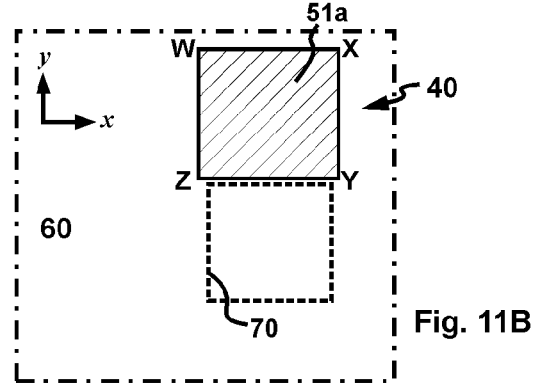
Figure 11C:
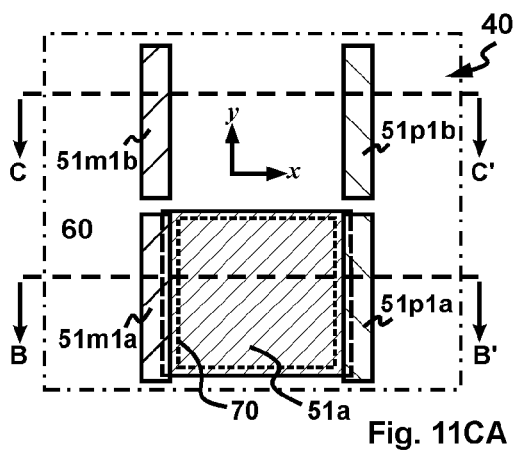
Figure 11C:
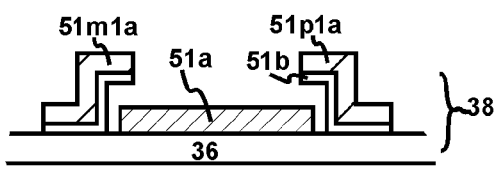
Figure 11C:
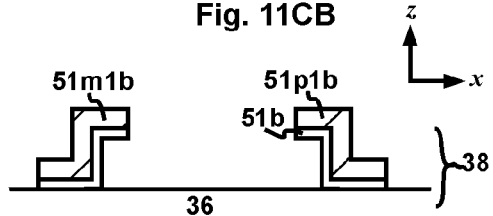

FIGS. 11CA-11GC illustrate a first preferred T-LMC type. This preferred T-LMC type comprises a floating slider and its driving forces are capacitive. A first preferred embodiment of the first T-LMC type is illustrated in FIGS. 11CA-11CC. Besides the slider 51a, it further comprises two flange pairs 51p1a/51m1a and 51p1b/51m1b. These two flange pairs cover the outer edge of the slider 51a. At the "OFF" state, the slider 51a aligns with the first flange pair 51p1a/51m1a. At the "ON" state, the slider 51a aligns with the second flange pair 51p1b/51m1b. The cross-sectional view along BB', CC' are illustrated in FIGS. 11CB-11CC, respectively. Being constrained by the flange pair 51p1a/51m1a on both sides, the slider 51a can only move along the y direction on the surface of the substrate 36. The inner surfaces of the flanges 51p1a, 51m1a are lined with a dielectric 51b, which prevents electrical shorting between the slider 51a and the neighboring flanges 51p1a, 51m1a.

Figure 11D:
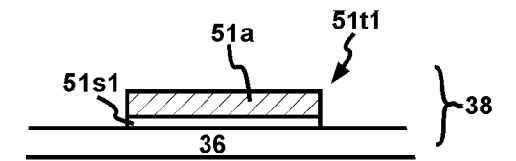
Figure 11D:
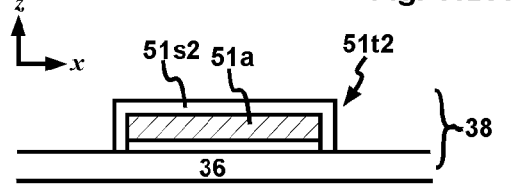
Figure 11D:
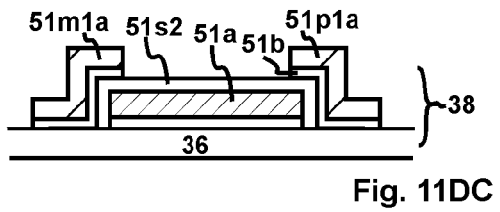

FIGS. 11DA-11DC illustrate a preferred manufacturing sequence for the first preferred embodiment of the first T-LMC type. A first sacrificial layer 51s and the slider layer 51a are formed on substrate 36. They are etched to form a first slider stack 51t1 (FIG. 11DA). The slider layer 51 may comprise poly-silicon or metals such as aluminum. In the case of poly-silicon, the sacrificial layer 51s1 may comprise silicon oxide; in the case of metals, the sacrificial layer 51s1 may comprise polymeric materials (e.g. photo-resist). Then a second sacrificial layer 51s2 is formed on top of the first slider stack 51t1 (FIG. 11DB). Preferably, the second sacrificial layer 51s2 is planarized. It may comprise the same material as the first sacrificial layer 51s1. Afterwards, the second sacrificial layer 51s2 is etched to form a second slider stack 51t2. This is followed by deposition of dielectric 51b and the flange layer. They are etched to form flange pair 51p1a/51m1a (FIG. 11DC). Finally, the slider 51a is released by removing the sacrificial layers 51s1, 51s2 in an aqueous or plasma environment.

Figure 11E:
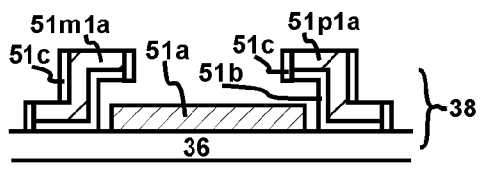
Figure 11E:
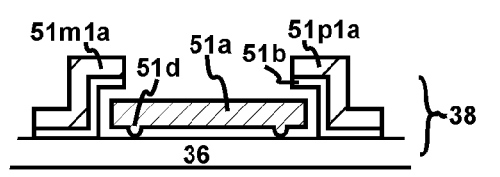
Figure 11E:
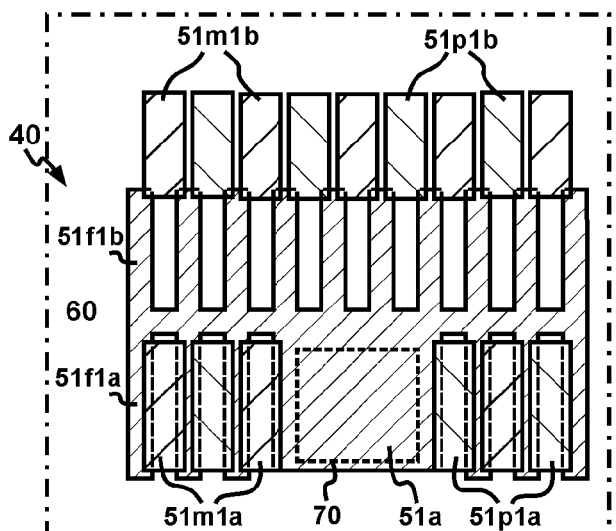

FIGS. 11EA-11EB illustrate several alternate preferred embodiments of the first preferred T-LMC type. In FIG. 11EA, an insulating spacers 51c is formed along the vertical edges of the flanges 51p1a, 51m1a. It provides better electrical isolation between the slider 51a and the flanges 51p1, 51m1. In FIG. 11EB, dimples 51d are added to the under-edge of the slider 51a. They reduce the friction between the slider 51a and the substrate 36. They can be fabricated by etching, preferably isotropically, a portion of the first sacrificial layer 51s1 before the slider layer 51a is deposited. FIG. 11EC further discloses a preferred embodiment using comb-drives. A plurality of interleaved fingers 51f1a, 51f1b are attached to the slider 51a. They increase the capacitive driving forces exerted on the slider 51a. Thus, it would take less time for the slider 51a to switch position. As a result, the throughput of the programmable litho-system can be improved. Apparently, further improvement in throughput can be achieved if the comb-drives and the dimples are combined.

FIG. 11F is a circuit symbol representing the preferred T-LMC illustrated in FIGS. 11CA-11CC and FIGS. 11EA-11EC. It comprises two capacitors 50c1a, 50c1b. Each flange pair forms a capacitor: the flange pair 51p1a/51m1a forms a first capacitor 50c1a; the flange pair 51p1b/51m1b forms a second capacitor 50c1b. The slider 51a is represented by a floating electrode. The capacitors 50c1a, 50c1b are out-of-phase: when the capacitor 50c1a is charged up, the capacitor 50c1b becomes discharged. The slider 51a is driven into the charged capacitor. FIG. 11GA illustrates a preferred peripheral circuit. It uses a DRAM-type circuit and comprises a switch 61s and an inverter 61i. FIGS. 11GB-11GC are static peripheral circuits. Except for the additional inverters 61i, 61i1b between two capacitors 50c1a, 50c1b, these peripheral circuits are similar to those in FIGS. 10CA-10CC.

FIGS. 11HA-11I illustrate a second preferred T-LMC type. This preferred T-LMC type comprises a floating slider and its driving forces are both capacitive and elastic. FIG. 11HA is a first preferred embodiment of this type. The driving force for its "OFF" state is provided by the flange pair 51p2, 51m2. However, the driving force for its "ON" state is an elastic force, which is generated by a spring 51sp. One end of the spring 51sp is attached to the slider 51a and the other to the substrate by an anchor 51sa. After the driving capacitor is discharged, the elastic force of the spring 51sp pulls the slider 51a away from the opening 70. FIG. 11HB illustrates a second preferred embodiment of this type. In this preferred embodiment, a comb-drive is used to increase the driving force for the "ON" state. FIG. 11I is the circuit symbol representing the second preferred T-LMC type. It is a capacitor 50c2 and can use the peripheral illustrated in FIGS. 10CA-10CC.

FIGS. 11JA-11MD illustrate a third preferred T-LMC type. In contrast to the first two T-LMC types, the slider in the third preferred T-LMC type is shorted to an external electrical signal. The driving forces for this T-LMC type are capacitive. It comprises a flange pair 51e and two opposing electrodes 51p3, 51m3 (FIG. 11JA). Limited by the flange pair 51e, the slider 51a can only move along the y direction. FIG. 11JB is a cross-sectional view of the preferred embodiment along DD'. The T-LMC 40 comprises a base pair 51g, which provides mechanical support as well as electrical contact to the slider 51a. To reduce friction, dimples may also be used under the slider 51a. Compared with other preferred T-LMC types, the inner surface of the flange pair in this preferred embodiment is not coated with a dielectric. FIG. 11K illustrates the circuit symbol representing the third preferred T-LMC type. It comprises two capacitors 51c3a, 51c3b in series. The middle terminal corresponds to the slider 51a. FIG. 11L is a preferred peripheral circuit. The two end terminals 51p3 and 51m3 are tied to VDD and GND, respectively. The voltage on the middle terminal 51a is controlled by the configuration bit 44. This peripheral circuit is a dynamic circuit. Static circuits in FIGS. 10CB-10CC can also be used.

FIGS. 11MA-11MD illustrate a preferred process flow of the preferred embodiment in FIGS. 11HA-11HB. Compared with the process flow of the first preferred T-LMC type (FIGS. 11DA-11DC), an additional step is performed to form a base pair 51g (FIG. 11MA) before the first sacrificial layer 51s1 is formed.

Rotor

FIGS. 12A-12EC illustrate various preferred in-plane rotational light-modulating cells (IPR-LMC). Its core element is a rotor 52a. All four corners STUV of the rotor 52a can rotate around axle 52b. When the rotor 52a covers the opening 70, it is at the "OFF" state (FIG. 12A); when it rotates away from the opening 70, the rotor 52a is at the "ON" state (FIG. 12B).

FIGS. 12CA-12CC illustrate a first preferred IPR-LMC type. This preferred IPR-LMC type comprises a floating rotor and its driving forces are capacitive. The rotor 52a is anchored to the substrate 36 by the axle 52b. It is further extended on two edges to form two fingers 52f1a, 52f1b. These two fingers 52f1a, 52f1b act as the floating electrodes for two capacitors 50c4a, 40c4b (formed by two electrode pairs 52p1a/52m1a, 52p1b/52m1b, FIG. 12CA). FIG. 12CB is a cross-sectional view of the floating rotor 52a and its axle 52b along EE'. Limited by the flange 52c on the axle 52b, the rotor 52a can only rotate in the x-y plane. Its inner surface is lined with a dielectric 52d. It provides electrical isolation between the rotor 52a and the axle 52b. FIG. 12CC represents the circuit symbol for this preferred IPR-LMC type. It comprises two capacitors 50c4a, 50c4b. With a voltage on the capacitor 50c4a but no voltage on the capacitor 50c4b, the rotor 52a is driven into the capacitor 50c4a and covers the opening 70. Accordingly, the IPR-LMC is at the "OFF" state. Otherwise, the IPR-LMC is at the "ON" state. The process flow for this preferred IPR-LMC type is similar to that in FIGS. 11BA-11BC.

FIGS. 12DA-12DD illustrate a second preferred IPR-LMC type. In this preferred IPR-LMC type, the rotor is shorted to an external electrical signal and the driving forces are capacitive. The first preferred embodiment in FIG. 12DA and FIG. 12DB uses straight capacitor electrodes 52p2, 52m2. Their edges are lined with a dielectric 52d. It provides electrical isolation between the electrodes 52p2, 52m2 and the rotor 52a. FIG. 12DC illustrates an alternate preferred embodiment of the second IPR-LMC type. Instead of straight capacitor, it uses fingered capacitor. The electrode fingers 52f2a, 52f2b form two capacitors 50c5a, 50c5b with the claw-like electrodes 52p2 and 52m2. These fingered capacitors provide more driving forces to the rotor 52a. The circuit symbol representing the second preferred IPR-LMC type is illustrated in FIG. 12DD. Its peripheral circuits are similar to those used by the third preferred T-LMC type.

FIGS. 12EA-12EC illustrate a preferred process flow for the preferred IPR-LMC of FIGS. 12DA-12DB. A first sacrificial layer 52s1 and a rotor layer 52a are deposited on substrate 36. They are etched to form a rotor stack 52t. Then a selective over-etch is performed on the sacrificial layer 52s1. Not affecting the rotor layer 52a, this over-etch creates an undercut underneath the rotor layer 52a (FIG. 12EA). Afterwards, a second sacrificial layer 52s2 is deposited around this structure and etched to expose a portion of substrate 36 (FIG. 12EB). This is followed by the formation of a flange layer 52c and a capacitor finger 52m2. To prevent electrical shorting between the capacitor fingers and the rotor 52a, a dielectric 52d is formed around the capacitor finger 52m (FIG. 12EC).

Hinge

FIGS. 13AA-13CB illustrate various out-of-plane rotational light-modulating cells (OPR-LMC). Its core element is a hinge 53a. The hinge 53a rotates around a hub 53h, which is confined by a staple 53b. The four corners of the hinge 53a are labeled as OPQR. At its "OFF" state, the hinge 53a lays on the substrate and covers the opening 70 (FIGS. 13AA-13AB). At its "ON" state, the hinge 53a rotates away from the opening 70. There are two possibility: a) it rotates ~90° from its "OFF" state in the x-z plane (FIG. 13AC); b) it rotates ~180° from its "OFF" state in the x-z plane (FIG. 13AE) and corners QR move from the right-hand side of OP to their left-hand side (FIG. 13AD).

FIGS. 13BA-13BC illustrate a first preferred OPR-LMC. FIG. 13BA is its plan view and FIG. 13BB is its cross-sectional view along I-I'. In this preferred embodiment, the hinge 53a rotates ~90° around its hub 53h when it is switched from "OFF" to "ON" state. The hinge 53a and the staple 53b are both located on a base 53c, which provides electrical connection to the hinge 53a. There are two electrodes 53p1 and 53m1 in the vicinity of the hinge 53a. Besides driving the hinge 53a, the electrode 53p1 also acts as a stop that limits the degree of the hinge rotation. It comprises a post 53ps and an arm 53ar. The arm 53ar is enclosed by a dielectric 53d. This dielectric provides electrical isolation between the electrode 53p1 and the hinge 53a. The circuit symbol representing this preferred embodiment comprises two capacitors 53c6a and 53c6b (FIG. 13BC). They share one common electrode 53a. Its peripheral circuits are similar to those of the third preferred T-LMC type.

The process flow of this preferred embodiment is similar to the third preferred T-LMC type. However, after the formation of the staple layer 53b, a third sacrificial layer 53s3 is formed on top (FIG. 13BD). A via is formed inside the third sacrificial layer 53s3 and filled with a conductor. After another pattern transfer, the electrode 53p1 is formed. Finally, all sacrificial layers are removed and the whole structure is released.

FIGS. 13CA-13CB illustrate a second preferred OPR-LMC. FIG. 13CA is a plan view and FIG. 13CB is a cross-sectional view along J-J'. In this preferred embodiment, the hinge 53a rotates ~180° from its "OFF" state to "ON" state. The electrodes 53p2, 53p2 are more symmetrical. The circuit symbol and peripheral circuit for this preferred embodiment are similar to those of the first preferred OPR-LMC.

Roller-Shade

FIGS. 14A-14C illustrate a preferred roller-shade LMC (RS-LMC). At its "OFF" state, the roller shade 54a covers the opening 70 and anchors to the substrate 36 by a flange 54f (FIG. 14A). The roller shade 54a further comprises at least two thermal layers 54b, 54c (FIG. 14B). They have different thermal expansion coefficients y. A resistor 54r sits on the top surface of the roller-shade 54a. When a current passes through the resistor 54r and heats up the roller-shade 54a, the y difference between the thermal layers 54b, 54c rolls up the roller-shade 54a (FIG. 14C). Accordingly, the RS-LMC switches to its "ON" state.

The roller-shade 54a can be modeled as a two-terminal resistor 54r (FIG. 14D). In its "ON" state, preferably a current runs through the roller-shade 54a. Being resistive, its peripheral circuit is different from capacitive LMC. A first preferred circuit is illustrated in FIG. 14EA. Compared with the DRAM-style circuit in FIG. 10CA, the capacitor 50c0 is replaced by a PMOS 64s2 and a resistor 54r. The gate voltage of the PMOS 64s2 controls the current flow through the resistor 54r. Its operation is similar to FIG. 10CA except that the RS-LMC switches to "ON" state when 44 is low. Similarly, the static circuits in FIGS. 10CB-10CC can also be used. FIG. 14EB illustrates a second preferred circuit. It comprises an NVM cell 64nvm and its operation includes two steps. In the first step, the NVM cell 64nvm is programmed by the configuration bit. At this time, the voltage on 64g is high. This turns on the switch 64s4 but turns off 64s5. Thus, no programming current flows through the resistor 54r. In the second step, the state of the NVM cell 64nvm translates to the current flow through the resistor 54r. At this time, 64g is grounded. This turns off the switch 64s4 but turns on 64s5. As a result, appropriate voltages are applied on the address line 43 and the configuration-bit line 44. If the threshold voltage of the NVM cell 64nvm is high, no current will flow through the resistor 54r. On the other hand, if its threshold voltage is low, the cell 64nvm is turned on and a current will flow through the resistor 54r. Consequently, the roller-shade 54a is rolled up.

Reflective LMC

Much progress has been made in the reflective display. Two examples are digital micro-mirror display (DMD) and digital light valve (DLV). All these technologies can be used in reflective-OPM. FIGS. 15A-15C illustrate several preferred reflective LMC (R-LMC). Preferably, it comprises a reflector 55a. On its four corners are four spring arms 55sp and four anchors 55sa. The cross-sectional views of these preferred embodiments along LL' are illustrated in FIGS. 15B-15C, respectively. For DUV applications, the top surface of the reflector 55a can be coated with interleaved silicon-molybdenum layers. The first preferred embodiment (FIG. 15B) is a DMD. By adjusting the voltage on the electrodes 55p, 55m, the reflector 55a is tilted. If there is no tilt, the incident light will be reflected straight back; otherwise, it will be reflected to a different direction. An alternate preferred embodiment (FIG. 15C) is a digital light valve. Here, the reflector 55a is a membrane. Portion of the incident light is reflected from its surface, with another portion being reflected by the substrate 36 (or the lower electrode 55b). When there is no voltage on the lower electrode 55b, the reflector 55a is at location 55C; with a voltage applied on the lower electrode 55b, the reflector 55a is pulled to location 55D. Through different interference, the reflected light changes its intensity.

As mentioned earlier, reflective liquid-crystal can also be used for the R-LMC. Since its substrate is in the optical path, the peripheral circuit of liquid-crystal-based R-LMC can be built on a single-crystalline wafer. Meanwhile, the reflector 55a can be stacked on top of the peripheral circuit. Accordingly, the reflector (LMA) area is close to the LMC area, i.e. the fill ratio is nearly ideal.

c. Emissive-LMC

Much works have been performed on the emissive display. Two examples are vertical-cavity surface emitting laser (VCSEL) and field-emission display (FED). They can also be used in emissive-LMC (E-LMC). FIGS. 16A-16B illustrate a preferred E-LMC. The core element in this E-LMC is a VCSEL 56a. It comprises two opposing electrodes 56p, 56m, two opposing Bragg reflectors 56e, 56f, and p-i-n laser medium 56c-56d. The VCSEL can be integrated with TFT's, which act as its peripheral circuit. The equivalent circuit of a VCSEL is a diode, which is a non-linear resistor (FIG. 16B). Its peripheral circuits are similar to those of RS-LMC. They can be built in silicon or GaAs wafers.

C. 3D-LMC

Three-dimensional LMC (3D-LMC) can improve the LMC density. In a 3D-LMC, the MEMS structures are built in multiple levels and can overlap each other. Thus the spacing between the LMC's can be reduced and the LMC's density is improved. FIGS. 17AA-17AC, FIGS. 17BA-17BC illustrate a preferred 3D-slider and 3D-rotor, respectively.

FIGS. 17AA-17AC illustrate a preferred LMC with 3D-slider. For the reason of simplicity, only the core element of the LMC is shown in these figures. In FIG. 17AA, two adjacent LMC's 40x, 40y are both in their "OFF" state. Note that the LMC disclosed in the earlier portion of the present invention has only one slider. In this preferred embodiment, the LMC 40x comprises two sliders 51xa1, 51xa2. Closing from its upper and lower sides, the sliders 51xa1, 51xa2 cover the opening 70x. The LMC 40y has a similar structure. In FIG. 17AB, the LMC's 40x, 40y are both at their "ON" state. The slider 51xa2 moves towards the lower side of the opening 70x, while the slider 51ya1 moves towards the upper side. Since they are located at two different levels 51A, 51B, the sliders 51xa2, 51ya1 can overlap each other (FIG. 17AC). With a three-dimensional arrangement of the sliders, the spacing $S_o$ between the openings can be reduced and the OPM can achieve a high density.

FIGS. 17BA-17BC illustrate a preferred LMC with 3D-rotor. Only the core element is shown in these figures. In FIG. 17BA, two adjacent LMC's 40x, 40y are both in their "OFF" state. Note that the LMC disclosed in the earlier portion of the present invention has only one rotor. In this preferred embodiment, the LMC 40x comprises four rotors 52xa1-51xa4. Closing from its four corners, the rotors 52xa1-52xa4 cover the opening 70x. The LMC 40y has a similar structure. In FIG. 17BB, the LMC's 40x, 40y are both at their "ON" state. The rotors 52xa3, 52xa4 rotates ~90° around their respective axles 52xb3, 52xb4, and the rotors 52ya1, 52ya2 rotates ~90° around their respective axles 52yb1, 52yb2. Located at different levels 52A-52D (FIG. 17BC), the rotors 52xa3, 52xa4, 52ya1, 52ya2 can overlap each other. With a three-dimensional arrangement of rotors, the spacing $S_o$ between the openings can also be reduced and the OPM can achieve a high density.

D. Manufacturing of the OPM Peripheral Circuit

The manufacturing of the OPM peripheral circuit (i.e. TFT) may take advantage of the techniques developed in SOI (silicon-on-insulator) technology. The performance of the single-crystalline-silicon (sc-Si)-based TFT is better than α-or p-Si-based TFT. FIGS. 18A-18D illustrate a preferred process flow for a sc-Si-based peripheral circuit. The starting material is an SOI wafer 350SOI (FIG. 18A). It comprises a substrate 350s, a buried oxide film 350o, and a silicon film 350si. The SOI wafer 350SOI has a first surface 350us and a second surface 350ls. On the first surface 350us, a quartz substrate 352 is thermally adhered to the SOI wafer 350SOI (FIG. 18B). Then the backside of the SOI wafer 350SOI is ground from its second surface 350ls until the buried oxide film 350o is reached. This is followed by an etch of the buried oxide film 350o, which exposes the silicon film 350si (FIG. 18C). As a result, an sc-Si film 350si is formed on top of the quartz substrate 352. This sc-Si film 350si can be used as the substrate for the OPM peripheral circuit (FIG. 18D). Apparently, other technologies developed in SOI (e.g. smart-cut) can also be used to form an sc-Si film on the mask substrate. Besides silicon, other semiconductor materials can also be used for peripheral circuits.

3. Logic Litho-System

In a logic litho-system, wafer pattern is generated through a series of litho-logic operations between mask patterns. Litho-logic operation can be performed between conventional masks, between OPM's, or between conventional mask and OPM. Typical litho-logic operations include litho-"OR" and litho-"AND".

One important consequence of the logic litho-system is pattern-distribution. With pattern-distribution, wafer patterns are distributed on a plurality of mask, or in a plurality of mask regions on a single mask. After performing a litho-logic operation to the images from these masks (regions), the desired wafer pattern can be obtained. Pattern-distribution can be used to improve the mask re-usability. It can further enable the mask-repair through redundancy (referring to FIGS. 33CA-33FC) and highly-corrected masks.

A. "OR" Litho-System

Figure 19A:
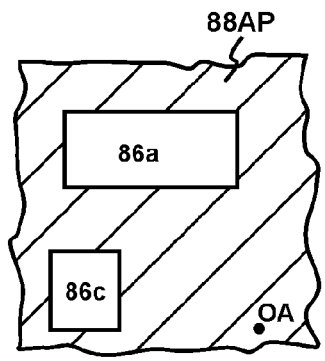
FIGS. 19A-19C explains the concept of "OR" litho-system.
Figure 19B:
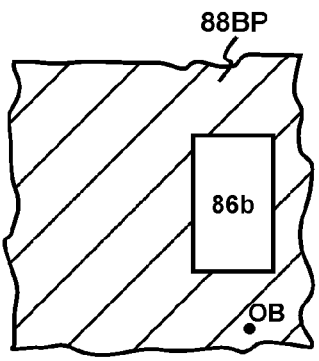
Figure 19C:
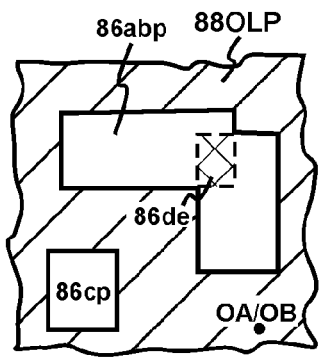

FIGS. 19A-19C explain the concept of "OR" litho-system. FIGS. 19A-19B illustrate the images of mask patterns 88AP, 88BP projected on a wafer during exposure. FIG. 19C illustrates the final wafer pattern 880LP after the photoresist development, which is the union of the mask patterns 88AP, 88BP. This litho-logic operation is referred to as litho-"OR". During litho-"OR", the reference point OA of the mask pattern 88AP coincides with the reference point OB of the mask pattern 88BP.

Figure 20A:
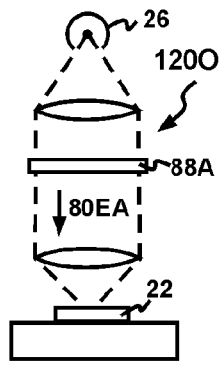
FIGS. 20AA-20EG illustrate several preferred "OR" litho-systems.
Figure 20A:
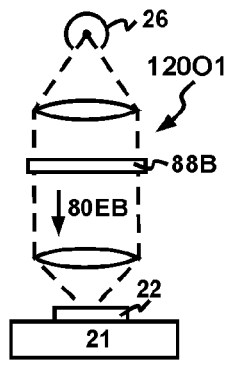

FIGS. 20AA-20EG illustrate several preferred "OR" litho-systems. The preferred embodiment in FIG. 20C may need only one exposure pass, while all others need two exposure passes (without photoresist development between exposures). The preferred embodiments in FIGS. 20B-20EG are seamless multiple-exposure tools, i.e. mask patterns can self-align to each other during multiple exposures. It can achieve a higher throughput.

The preferred embodiments in FIGS. 20AA-20AB use a conventional litho-tool 120O1. It comprises a single projector. Two exposure passes 88EA, 80EB are performed to the same wafer 22. During exposure pass 88EA, the image of the mask 88A (i.e. the mask pattern 88AP) is projected on the wafer 22; during exposure pass 88EB, the image of the mask 88B (i.e. the mask pattern 88BP) is projected on the wafer 22; and the wafer needs to be aligned between exposure passes. After all exposure passes are performed, photoresist is developed in a single step.

Figure 20C:
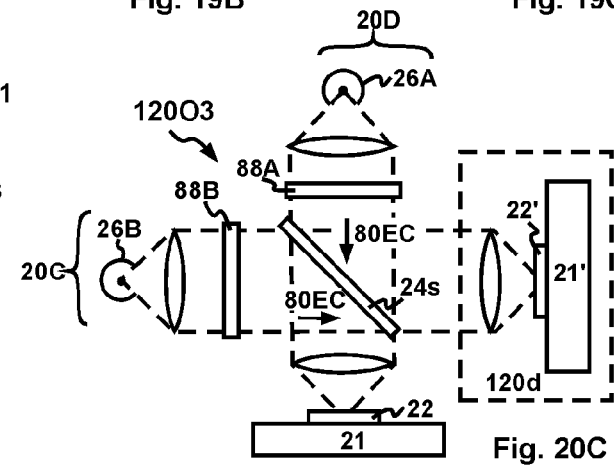
Figure 20B:
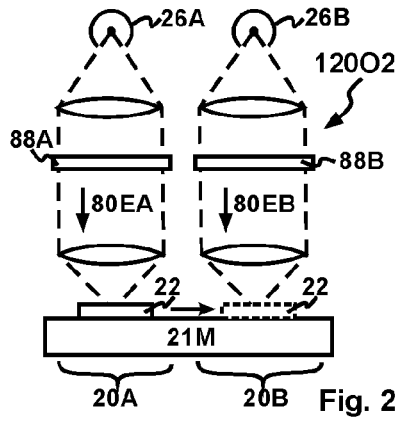

The litho-tool 120O2 in FIG. 20B comprises two projectors 20A, 20B with a shared stage 21M. A wafer 22 is exposed first to the projector 20A. Then it steps forward and is exposed to the projector 20B. The relative placement of the masks 88A, 88B can be controlled in such a way that, if it is aligned with the mask 88A in the projector 20A, the wafer 22 becomes self-aligned to the mask 88B when it steps into the projector 20B.

The litho-tool 120O3 in FIG. 20C comprises two projectors 20C, 20D with a 50/50 beam splitter 24s. Here, half of the light entering the beam splitter 24s is reflected with another half passing through. The image formed on the wafer 22 combines the images of the masks 88A and 88B, as the image of the mask 88A passes through the beam splitter 24s; the images of the mask 88B is reflected by the beam splitter 24s. In this preferred embodiment, only one exposure (flash) may be needed. It is acceptable to expose another wafer 22' at the same time on the other side 120d of the beam splitter 24s. This improves the throughput.

Figure 20D:
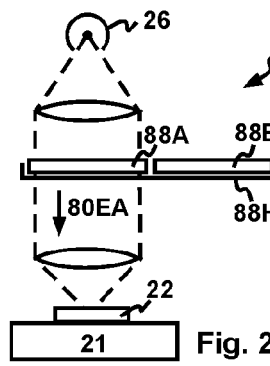
Figure 20D:
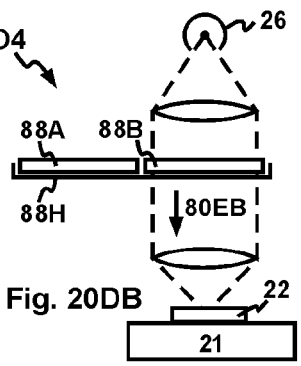

In FIGS. 20DA-20DB, a mask-steppable litho-tool 120O4 is used. It comprises one projector. Here, the masks 88A, 88B are placed in a mask-holder 88H and their relative placement is fixed. Besides precisely controlling the wafer stepping, this litho-tool 120O4 can precisely control the stepping of the mask-holder 88H. Similarly, wafer alignment between exposure passes may not be needed.

Figure 20E:
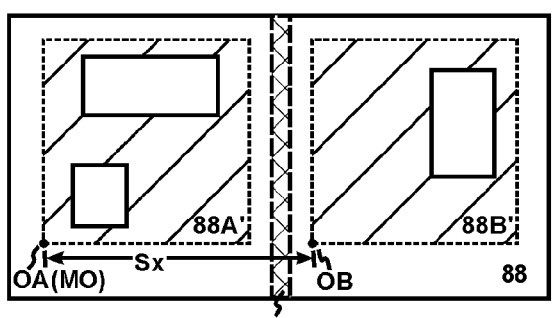
Figure 20E:
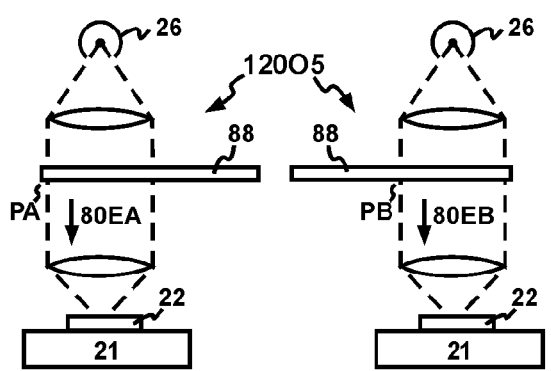
Figure 20E:
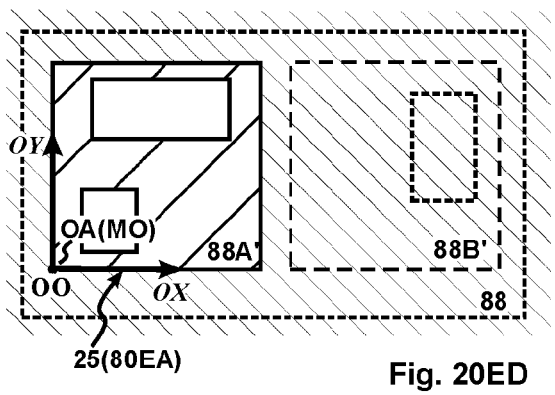
Figure 20E:
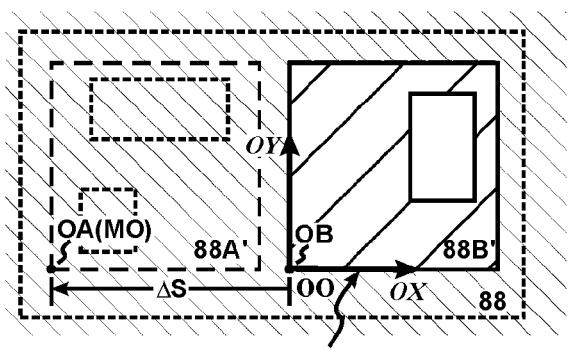
Figure 20E:
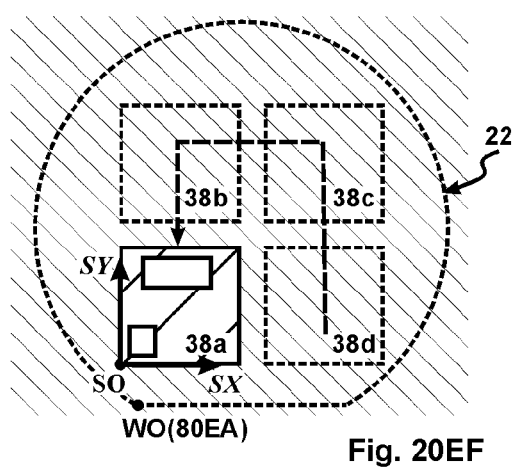
Figure 20E:
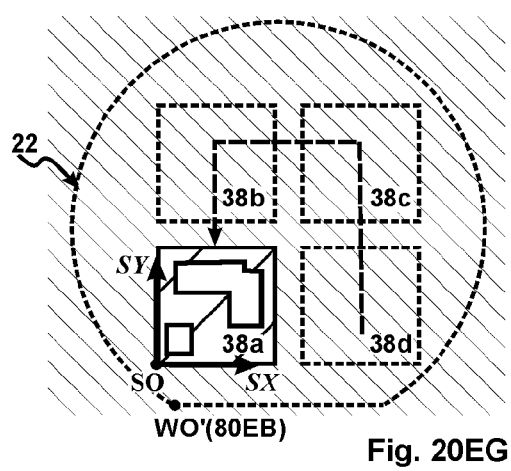

The preferred embodiment of FIGS. 20EA-20EG is an extension of FIGS. 20DA-20DB. Similar to FIGS. 20DA-20DB, it also uses a mask-steppable litho-tool 120O5 and comprises one projector. Unlike FIG. 20DA-20DB where the mask patterns 88AP, 88BP come from two masks 88A, 88B, in FIGS. 20EC, the mask patterns 88AP, 88BP come from two mask regions 88A', 88B' of a SINGLE mask 88. Accordingly, this mask 88 is referred to as pattern-distributed mask. On a pattern-distributed mask, that wafer patterns are distributed over a plurality of mask regions. Note that at least one mask regions 88A', 88B' can nearly fill the full aperture 25 of the projector, and the combined range of these mask regions 88A', 88B' exceeds that of the full aperture 25. Here, the origin OA of the mask region 88A' (also designated as the origin MO of the mask 88) has a spacing $S_x$ to the origin OB of the mask region 88B'. With the help of the pattern-distributed mask, the control of the mask stepping can be simplified.

Figure 24A:
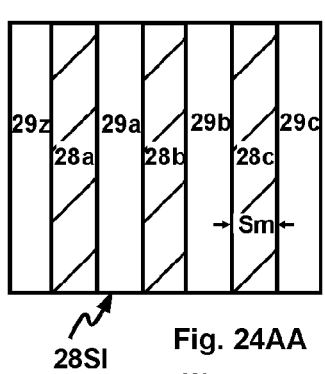
FIGS. 24AA-24BC illustrate several preferred correctional structures for line-spaces on a highly-corrected mask.
Figure 24A:
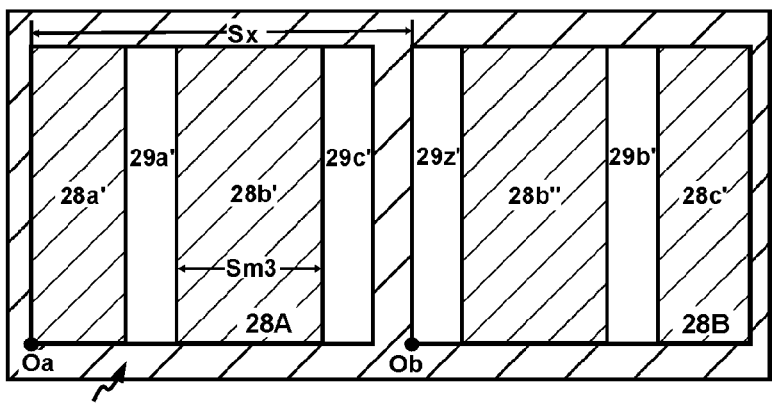

The pattern-distributed mask 88 might be larger and heavier than a conventional mask. If gravitational sagging is a concern, a support beam 88s may be added thereunder between the mask regions 88A', 88B'. It provides mechanical support to the mask 88 and will not interfere with the lithographic process. Note that the support beam 88s can be used in the preferred embodiments of FIG. 23AB, FIG. 24AB, and FIG. 33EA. For the reason of simplicity, it is not shown in these figures.

The exposure process in the mask-steppable litho-tool 12O5 is similar to that in FIGS. 20DA-20DB. Two exposure passes 80EA, 80EB are performed. During the first exposure pass 80EA, the aperture 25 is aligned with the mask region 88A', e.g. OA coincides with the origin OO of the aperture 25 (FIG. 20ED). Dies 38a-38d are exposed one-by-one to the mask region 88A' (FIG. 20EF). Between two exposure passes, the mask 88 makes a displacement of $\Delta S$ ($\Delta S=S_x$) along the OX direction. Accordingly, during the second exposure pass 80EB, the aperture 25 is aligned with the mask region 88B', e.g. OB coincides with OO (FIG. 20EE). Similar, dies 38a-38d are then exposed one-by-one to the mask region 88B' (FIG. 20EG). At the beginning of two exposure passes 80EA, 80EB, the wafer origins WO, WO' coincide. After exposures, a single development step forms wafer pattern.

B. "AND" Litho-System

Figure 21A:
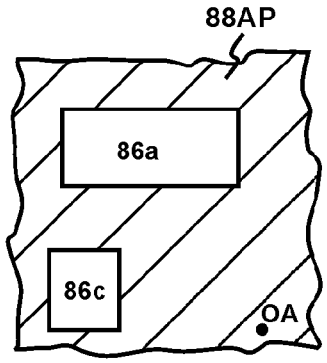
FIGS. 21A-21C explains the concept of "AND" litho-system.
Figure 21B:
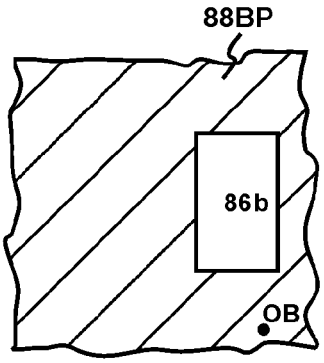
Figure 21C:
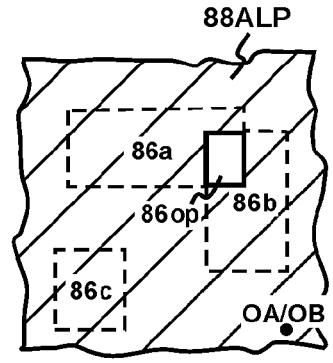

FIGS. 21A-21C explain the concept of "AND" litho-system. FIGS. 21A-21B illustrate the first and second mask patterns 88AP, 88BP. FIG. 21C illustrates the final wafer pattern 88ALP, which is the intersection between mask patterns 88AP and 88BP. The litho-logic operation is referred to as litho-"AND". During litho-"AND", the reference point OA of the mask pattern 88AP coincides with the reference point OB of the mask pattern 88BP.

Figure 22A:
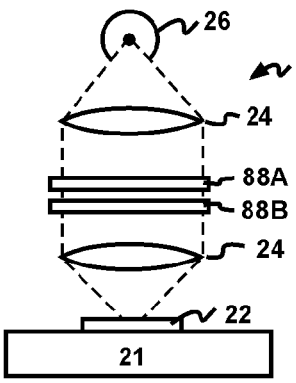
FIGS. 22A-22B illustrate two preferred "AND" litho-systems.
Figure 22B:
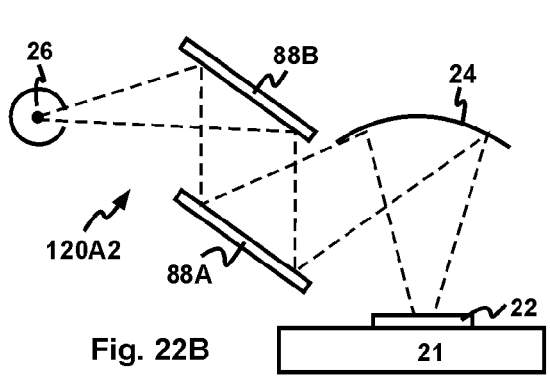

FIGS. 22A-22B illustrate two preferred "AND" litho-systems. FIG. 22A is a transmissive "AND" litho-system 120A1. It uses two masks 88A, 88B, each having a first and second mask patterns 88AP, 88BP. The exposure light is filtered by both masks 88A and 88B. Images are only formed in areas where the mask patterns 88AP and 88BP are both clear. FIG. 22B is a reflective "AND" litho-system 120A2. Images are only formed in areas where both the masks 88A, 88B are reflective.

C. Highly-Corrected Masks

With the help of pattern-distribution, the feature spacing on a mask becomes larger. Accordingly, the OPC-computing can be reduced and more complex, higher-order correctional structures can be accommodated on the mask. This enables highly-corrected masks. FIGS. 23A-24BC illustrate several preferred highly-corrected masks.

FIGS. 23AA-23AC illustrate a pattern-distributed mask to implement high-density vias and its related lithographic process. FIG. 23AA illustrates the desired via patterns 18SI on wafer. The via shown here only means that this is a possible via location. If it is drawn in solid line (e.g. 18a), the via exists; if it is drawn in dashed line (e.g. 18b), there is no via. Typically, the via dimension $D_v$ and spacing $S_v$ are ~1 F.

To implement the via patterns of FIG. 23AA, a pattern-distributed mask 18MS with four mask regions 18A-18D (FIG. 23AB) and a logic litho-system employing four exposure passes can be used. On each mask region, there are only a fraction of via patterns. For example, the mask region 18A only comprises via patterns 18e', 18g', 18m', 18o'. An exposure sequence is detailed in FIG. 23AC: during exposure step 1, the origin O1 of the mask region 18A coincides with OO, the displacement $\Delta S$ of the mask 18MS is (0, 0), and vias 18e, 18g, 18m, 18o are exposed on wafer; during exposure step 2, the origin O2 of the mask region 18B coincides with OO, $\Delta S$ =(−Sx, 0), and vias 18a, 18c, 18k are exposed (no via at 18i); during exposure step 3, the origin O3 of the mask region 18C coincides with OO, $\Delta S$ =(−Sx, Sy), and via 18l is exposed (no vias at 18b, 18d, 18j); during exposure step 4, the origin O4 of the mask region 18D coincides with OO, $\Delta S$=(0, Sy), and vias 18f, 18p are exposed (no vias at 18h, 18n).

On the pattern-distributed mask 18MS, the via spacing Sv3 is ~3 F. This is three times larger than that on a conventional mask. In general, if a pattern-distributed mask comprises $n^2$ mask regions, its via spacing could be (2n−1)× larger than that on a conventional mask. The pattern-distributed mask provides several benefits: First, the proximity effect between adjacent features is much less. This translates to less OPC computing and lower mask cost. Secondly and more importantly, the larger feature spacing can be used to accommodate higher-order correctional structures, thus enabling highly-corrected masks. In contrast, these higher-order correctional structures cannot be accommodated on conventional masks, because the feature spacings on these masks are much smaller and if these mask features were placed at the minimum spacing, their correctional structures would overlap. As a result, even if the same litho-tool is used, the highly-corrected masks can achieve much better lithographic resolution. Moreover, the highly-corrected mask can still be a binary mask. FIGS. 23BA-23DC illustrate several preferred highly-corrected masks.

FIGS. 23BA-23BC illustrate a rim-shift PSM. Here, via 18g' is a zero-order clear pattern and the phase-shifter 18ps around the via 18g' is its first-order correctional structure. In prior arts, the width $W_{cs}$ of the phase-shifter 18ps ($W_{cs}$ is the spacing between the outer edge of the highest-order correctional structures and the outer edge of the zero-order clear pattern) cannot exceed F/2, because the spacing $S_v$ between adjacent vias could be 1 F. This severely limits the design of the correctional structures. On a pattern-distributed mask, the via spacing $S_{v3}$ is much larger ($\geq 3$ F) and $W_{cs}$ increases by more than three-fold (~3 F/2). Accordingly, the phase-shifter 18ps can be better sized and better lithographic resolution can be achieved.

With a much larger $W_{cs}$, higher-order correctional structures can be accommodated. FIGS. 23CA-23CC and FIGS. 23DA-23DC illustrate two masks 18A, 18A' with second-order correctional structures. The second-order correctional ring 18psa in FIGS. 23CA-23CB is separated from via 18g' by a spacer film 18sf. The spacer film 18sf may comprise chrome, phase-shifter or even just a trench. Although it may comprise phase-shifter, the correctional ring 18psa in FIGS. 23CA-23CB does not comprise phase-shifter and it is a clear pattern. Namely, the mask 18A is a binary mask. Its fabrication is easier and costs less. From the E-field diagram of FIG. 23CC, the E-field 18psaE from the second-order correctional ring 18psa nearly cancels out the first-order diffraction maximum of the E-field 18gE from the zero-order clear pattern (via 18g'). The final exposure light 18cE can render a good profile.

The preferred embodiments in FIGS. 23DA-23DB comprises a first-order correctional ring $18ps'$ and a second-order correctional ring $18ps''$ around the via $18g'$. In this preferred embodiment, the first-order correctional ring $18ps'$ may comprise a phase-shifter, and the second-order correctional ring $18ps''$ may not. From the E-field diagram of FIG. 23DC, the addition of E-field components $18psE'$, $18psE''$ from these two correctional structures can almost completely cancel out the first-order diffraction maximum of the E-field $18gE$. As a result, the final exposure light $18cE'$ can render an excellent profile. In fact, this preferred embodiment is an example of the second-order Fresnel plate.

Besides achieving better via resolution, pattern-distribution can achieve better line resolution. The high-density line patterns $28a$-$28c$ of FIG. 24AA can be distributed on a pattern-distributed mask $28MS$ of FIG. 24AB. Here, only clear patterns, i.e. line-spaces (space between lines, a zero-order clear pattern), are distributed. The mask region $28A$ comprises line-space pattern $29a'$, $29c'$, while the mask region $28B$ comprises the remaining line-space pattern $29b'$, $29z'$. The exposure sequence follows that in FIGS. 20EA-20EG.

Figure 24B:
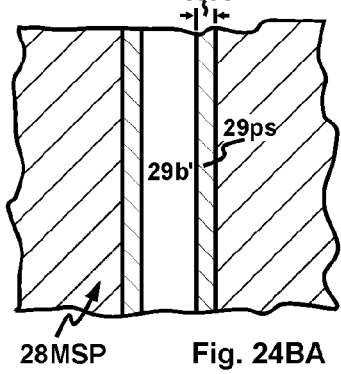
Figure 24B:
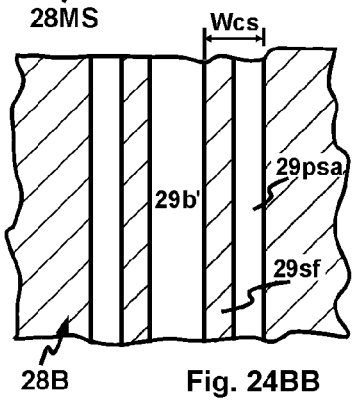
Figure 24B:
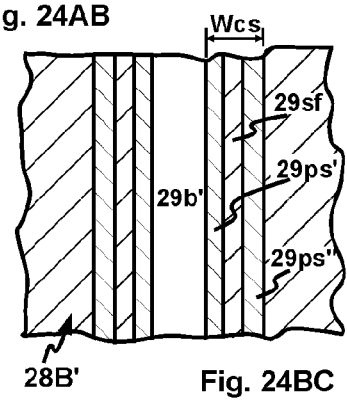

The spacing $S_{m3}$ between the line-spaces on a pattern-distributed mask is much larger than the spacing $S_m$ on a conventional mask. It can also accommodate high-order correctional structures. FIGS. 24BA-24BC illustrate several preferred correctional structures. FIG. 24BA is similar to FIG. 23BA. Mask $28MSP$ comprises a first-order correctional structure $29ps$ (a phase-shifter) along the edges of the line-space $29b'$. Its $W_{cs}$ can exceed $F/2$. Similar to FIG. 23BB, mask $28B$ in FIG. 24BB comprises a second-order correctional structure $29psa$. It is a binary mask. FIG. 24BC is similar to FIG. 23BC. Mask $28B'$ comprises first- and second-order correctional structures $29ps'$, $29ps''$.

D. Mask With Improved Re-Usability

Logic litho-system can also improve the mask re-usability. For the IC with mature circuit and volatile circuit, wafer patterns can be distributed on at least two masks (or mask regions): one for mature circuit (mature mask) and the other for volatile circuit (volatile mask). Through litho-"OR", the desired wafer pattern can be formed. The mature mask can be used in a number of products—an improvement of its re-usability. On the other hand, the data amount on the volatile mask is typically small and therefore, its fabrication is much less time-consuming and less expensive.

a. System-on-a-Chip (SoC)

Figure 25A:
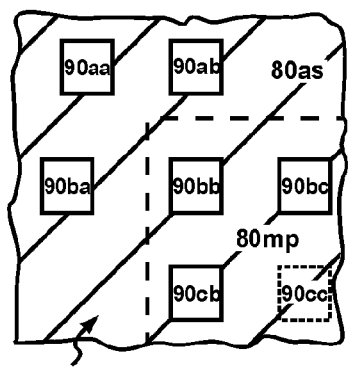
FIGS. 25A-25C illustrate a preferred implementation of vias on an SoC chip through litho-"OR".
Figure 25B:
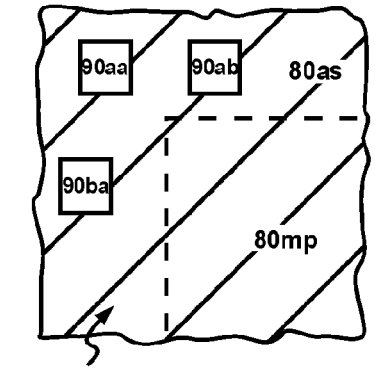
Figure 25C:
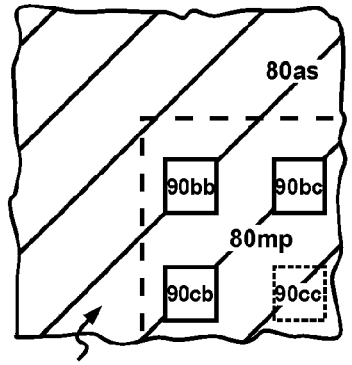

Many SoC products comprise mask-programmable IC (MPIC). They can be integrated with other IC to implement many functions. FIG. 25A illustrates the via patterns $80SOC$ in an SoC chip (SoC via patterns), which comprises an on-chip MPIC $80mp$ and an on-chip ASIC $80as$. Note that the via patterns in the MPIC $80mp$ may change frequently. Here, the SoC via patterns can be formed from two masks (or mask regions): an ASIC via mask $80ASO$ (FIG. 25B) and an MPIC via mask $30MPO$ (FIG. 25C). The ASIC via mask $80ASO$ comprises ASIC via patterns $90aa$, $90ab$, $90ba$, but not MPIC via patterns $90bb$-$90cc$. The MPIC via mask $30MPO$ comprises MPIC via patterns $90bb$-$90cc$, but not ASIC via patterns $90aa$, $90ab$, $90ba$. The desired SoC via pattern $80SOC$ can be formed through litho-"OR" between the ASIC via mask $80ASO$ and the MPIC via mask $30MPO$. Apparently, besides via patterns, other layer patterns in an SoC chip can be formed in the same way.

b. Segmented-Lines

Figure 26A:
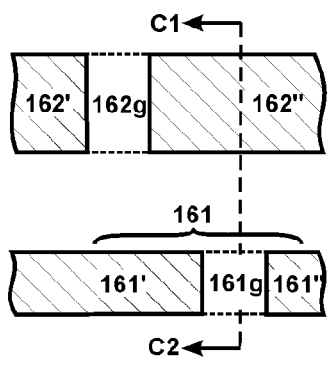
FIGS. 26A-26FC describe several preferred implementations of segmented-lines through litho-"OR".
Figure 26B:
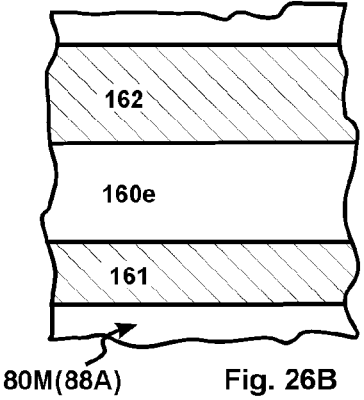
Figure 26C:
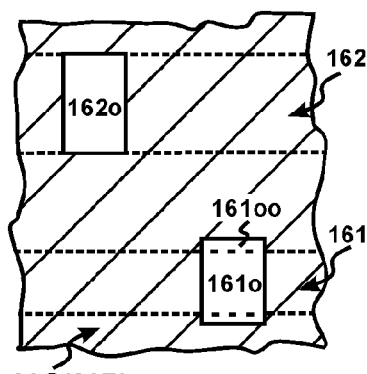

By changing the locations of segment-gap, e.g. $161g$, the length of the segmented-lines $161'$, $161''$ can be customized (FIG. 26A). The segmented-lines can be implemented through litho-logic operation on two masks (regions): a continuous-line mask and a segment-gap mask. FIGS. 26B-26C illustrate several preferred implementations.

FIGS. 26B-26C illustrate a continuous-line mask $80M$ and a segment-gap mask $80G$. The line patterns $161$, $162$ on the continuous-line mask $80M$ are dark patterns; the opening patterns $161o$, $162o$ on the segment-gap mask $80G$ are clear patterns. Their relative position on wafer is illustrated in FIG. 26C. Through litho-"OR", these two masks $80M$, $80G$ form the segmented-line pattern of FIG. 26A. By controlling the position of openings, the length of each segmented-line can be adjusted according to the customer's needs. Note that the extension $161oo$ of the opening $161o$ over the line $161$ has no effect on the final shape of segment-gap. Accordingly, the shape of the openings $161o$ can be quite flexible (referring to FIG. 2B).

Figure 26D:
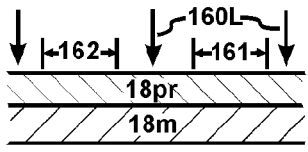
Figure 26D:
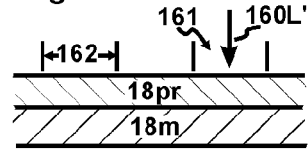
Figure 26D:
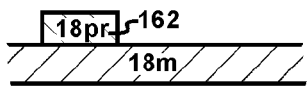
Figure 26E:
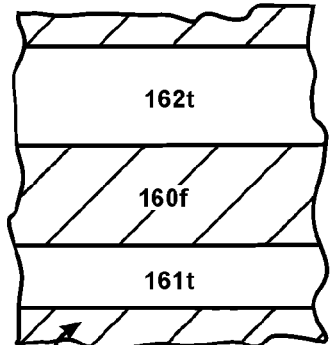
Figure 26F:
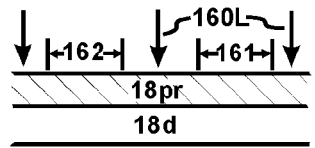
Figure 26F:
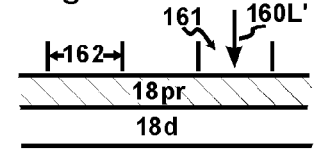
Figure 26F:
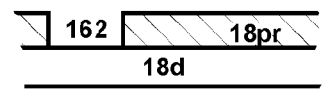

A first preferred segmented-line process is illustrated in FIGS. 26DA-26DC (along C1-C2 of FIG. 26A). It is based on conventional metallization. During the first exposure, photoresist $18pr$ is exposed to the continuous-line mask $80M$. That exposure exposes everywhere except areas $161$, $162$ (FIG. 26DA). During the second exposure, photoresist $18pr$ is exposed to the opening mask $80G$, when the area $161$ (i.e. inside segment-gap $161g$) is exposed (FIG. 26DB). After development, only photoresist in the area $162$ remains.

A second preferred segmented-line process is based on damascene technique. In damascene, a trench needs to be formed before the metal-filling. A conventional trench mask $80T$ (FIG. 26E) is complementary to the continuous-line mask $80M$ and is not suitable for litho-"OR". To accommodate the need from damascene, negative photoresist is preferably used during the lithographic process. With negative resist, the same mask set (i.e. the continuous-line mask $80M$ and the segment-gap mask $80G$) can be used to form the trench pattern required by damascene. The associated process flow (FIGS. 26FA-26FC) is similar to that in FIGS. 26DA-26DB, except that photoresist $18pr$ is only removed in the area $162$ but remains in all other areas. Apparently, this process flow results in the same segmented-line pattern as FIGS. 26DA-26DC.

E. Thin-Film Mask

Logic litho-system can also be used in thin-film mask (e.g. X-ray mask, e-beam mask). Thin-film mask is built on a fragile thin film (e.g. silicon nitride). In order to improve the mask's durability, support beams are desired under the thin-film mask. To accommodate supporting structures such as support beams, a pattern-distributed mask is to be used, i.e. wafer patterns are distributed over multiple mask regions. Within each mask region, there are invalid exposure areas. These invalid exposure areas contains can be used to build support beams. The final wafer patterns are formed by performing litho-logic operation on these mask regions.

Figure 27A:
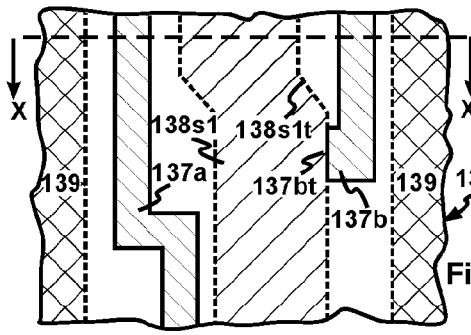
FIGS. 27AA-27DB illustrate several preferred thin-film masks.
Figure 27B:
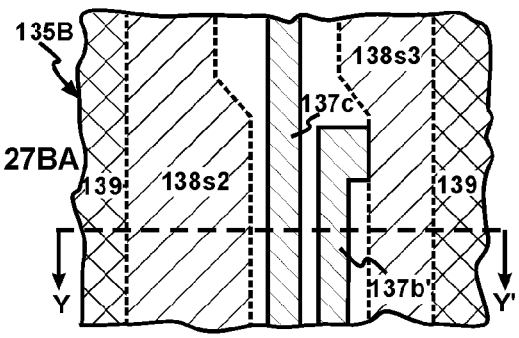
Figure 27A:
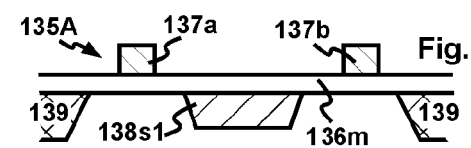
Figure 27B:
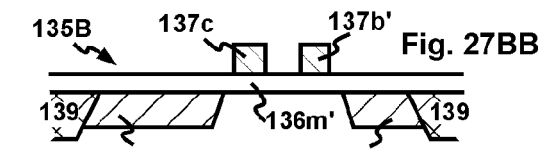

FIGS. 27AA-27BB illustrate a first preferred thin-film mask. It comprises a first mask regions $135A$ and a second mask region $135B$. FIGS. 27AA-27AB are the plan view and cross-sectional views of the first mask region $135A$. Support beam $138s1$ is built in the first mask region $135A$. In this preferred embodiment, the area within the support beam $138s1$ is the invalid exposure area. The wafer patterns in the invalid exposure area reside on the second mask region $135B$. FIGS. 27BA-27BB are the plan view and cross-sectional view of the second mask region $135B$. The patterns of the support-beams $138s2$, $138s3$ complements the pattern of the support beam $138s1$. Through litho-"OR", the mask patterns $137b'$, $137c$ on the second mask region $135B$ and the mask patterns $137a$, $137b$ on the first mask region $135A$ form the desired wafer pattern. In this preferred embodiment, there is no mask pattern in the invalid exposure areas $138s1$-$138s3$.

Figure 27C:
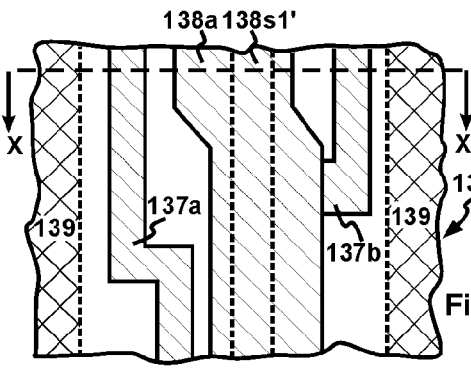
Figure 27D:
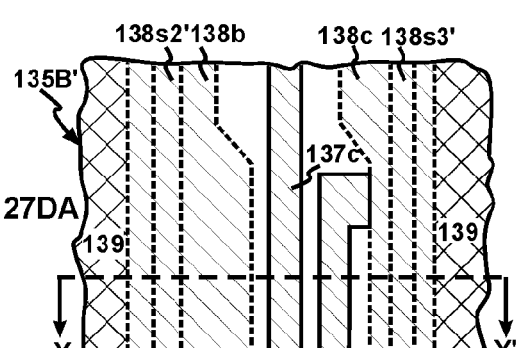
Figure 27C:
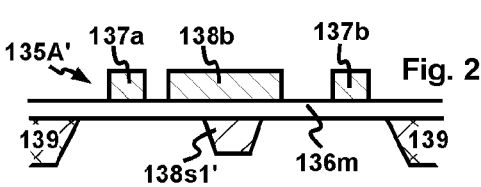
Figure 27D:
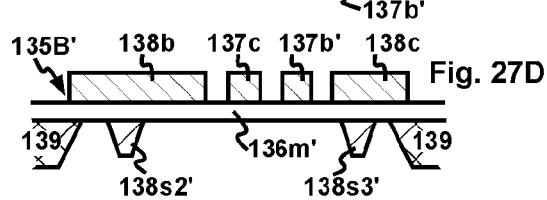

FIGS. 27CA-27DB illustrate a second preferred thin-film mask. Compared with the first preferred thin-film mask, the invalid exposure area 138s1' in the second preferred thin-film mask is defined by the mask pattern 138s1', but not by the support beam 138s1. Thus, the invalid exposure area 131s1' is more accurately defined. Moreover, there is more design freedom for support beams. For example, straight support beam 138s1' can be used.

4. Design-For-Litho-Programming (DFL)

Ideally, a few general-purpose masks (GPM) can be used in most lithographic processes. To maximize the usage of the GPM, the IC layout preferably follows "design-for-litho-programming (DFL)".

A. General-Purpose Masks (GPM)

Figure 28A:
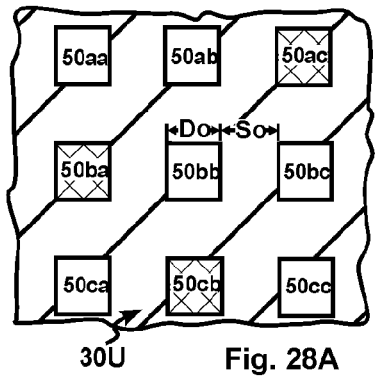
FIGS. 28A-28B illustrate two preferred general-purpose masks (GPM).
Figure 28B:
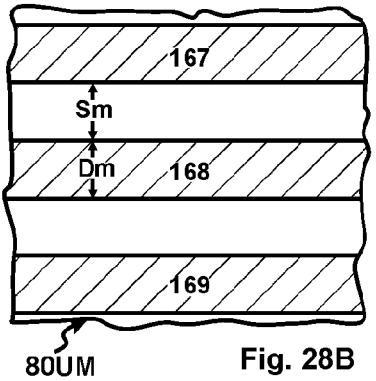

Examples of GPM include uniform opening-programmable mask (UOPM) and uniform metal-line mask (UMLM). On an UOPM, all programmable openings have the same size $D_o$ and same spacing $S_o$, preferably 1 F or 2 F (FIG. 28A); On an UMLM, all metal lines are continuous and have the same width $D_m$ and same spacing $S_m$, preferably 1 F (FIG. 28B). One advantage of the UMLM is that it is highly regular and can fully utilize the advanced mask-making techniques such as alternative PSM. To maximize the usage of the GPM, the IC layout preferably follows the DFL. The DFL includes via DFL and metal-line DFL.

B. Via DFL

Figure 29A:
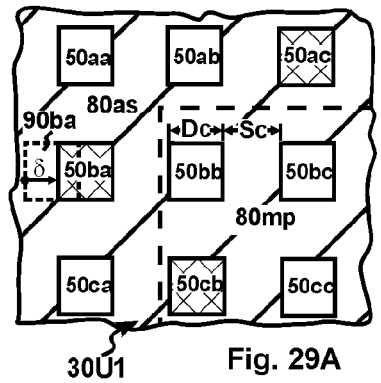
FIGS. 29A-29BC describe several preferred "design-for-litho-programming (DFL)".

A preferred via DFL is illustrated in FIG. 29A. It can be used to implement the SoC via pattern in FIG. 25A. Note that in FIG. 25A, the via 90ba is not aligned with its adjacent vias. In order to use the UOPM 30U, the via 90ba has to be displaced by δ so that it coincides with its nearest programmable opening 50ba. Because the spacing $S_o$ between programmable openings is ~1 F on the UOPM 30U, δ is no larger than ~F/2. Namely, the via DFL has small effect on the via layout.

C. Line DFL

Figure 29B:
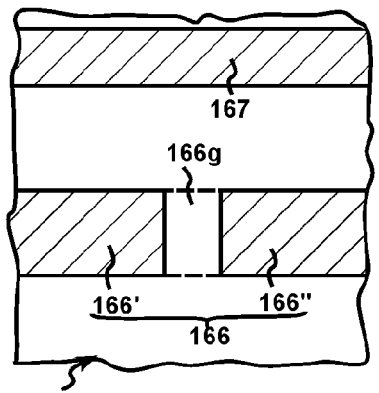
Figure 29B:
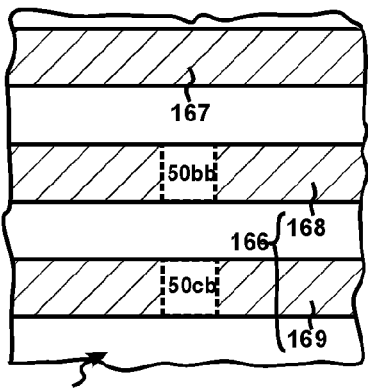
Figure 29B:
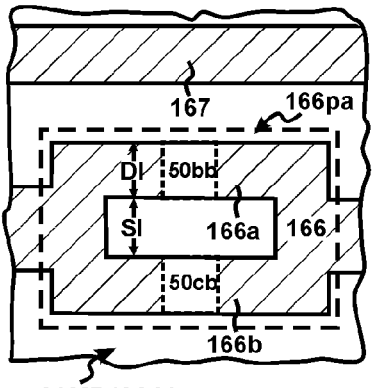

The implementation of segmented-lines requires the alignment of the continuous-line patterns 80M and the segment-gap patterns 80G. The segment-gap patterns 80G can be generated by an UOPM 30U. Accordingly, the continuous-line patterns, at least the continuous-line patterns subject to programming, can coincide with programmable openings on the UOPM 30U. If the line 166 is wider than 1 F (FIG. 29BA), it is preferably split into a few sub-lines 168, 169 (FIG. 29BB) or at least a few sub-lines 166a, 166b in the programming area 166pa (FIG. 29BC). The width of these sub-lines is smaller than or equal to that of the programming openings, preferably equal to 1 F, the pitch of these sub-lines is equal to the period of the programming openings, preferably 2 F Combined with openings 50bb, 50cb, the desired segmented-lines can be generated.

5. Composite Litho-System

Composite litho-system combines programmable litho-system with logic litho-system. Besides programmable SoC and programmable lines, the composite litho-system enables the application of manufacturable OPM in advanced lithography. It can also improve the mask yield and offer longer exposure endurance to OPM.

A. Programmable SoC

Figure 30A:
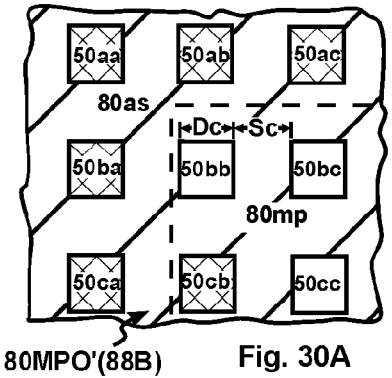
FIGS. 30A-30CB illustrate several preferred programmable SoC opening patterns and preferred programmable line patterns.

In the preferred embodiment of FIG. 25C, the MPIC via patterns are formed from a custom opening mask. In fact, it can be created from the OPM 80MPO' of FIG. 30A. In the ASIC area 80as, all corresponding programmable openings are at the "OFF" state; only in the MPIC area 80mp, the OPM 80MPO' generates valid opening patterns. Accordingly, the OPM 80MPO' offers programmability to SoC chips.

B. Programmable Line Pattern

Figure 30C:
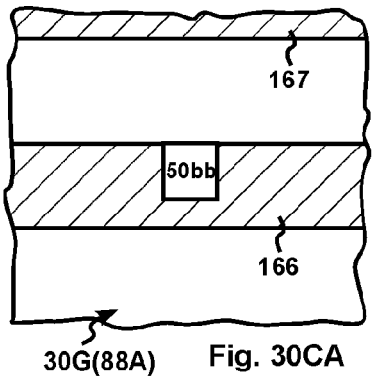
Figure 30C:
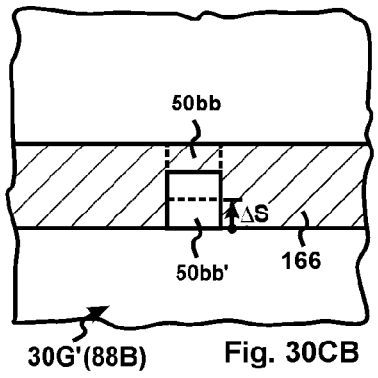
Figure 30B:
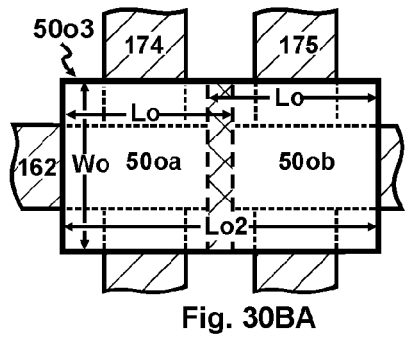
Figure 30B:
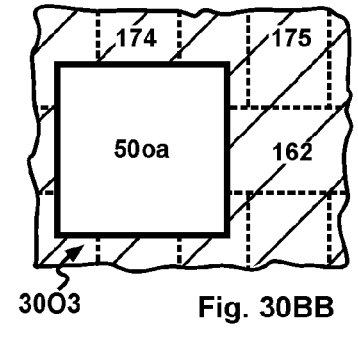
Figure 30B:
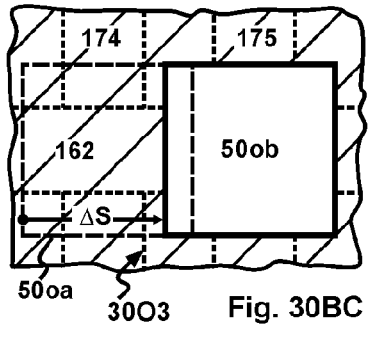

Line patterns can be formed by merging a plurality of square openings and they can be programmable. FIG. 30BA illustrates a line pattern, i.e. merged opening 50o3. It can be formed by a single OPM 30O3 in an "OR" litho-system. To be more specific, it can be formed by multi-pass exposures with displacement. Here, two exposure passes are performed and the OPM 30O3 is displaced relative to the wafer by ΔS between the exposure passes. The first exposure pass forms a first opening 50oa (FIG. 30BB); the second exposure pass forms a second opening 50ob (FIG. 30BC). These opening patterns are merged to form the desired line pattern 50o3. More details on multi-pass exposure with displacement will be disclosed in FIGS. 31CA-31DC'. The programmable line pattern can also be used to form gap 166g in wide metal lines (FIG. 29BA). As illustrated in FIGS. 30CA-30CB, two exposure passes are performed and the OPM is displaced relative to the wafer by ΔS between the exposure passes. The combined openings 50bb, 50bb' cut the wider metal line 166.

C. Deep-Sub-μm Litho-Programming Based on Manufacturable OPM

Figure 31A:
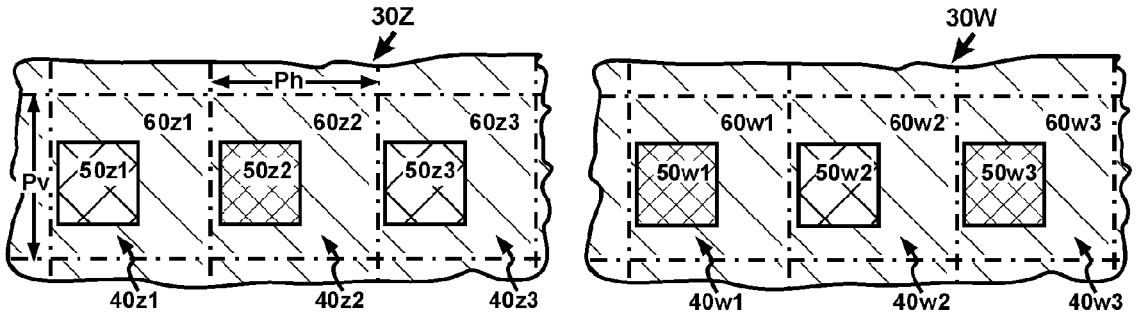
FIGS. 31AA-31DC' illustrate several preferred implementations of the litho-programmable deep-sub-μm openings through litho-"OR".

In a composite litho-system, litho-programmable deep-sub-μm features (~0.25 μm) can be rendered by manufacturable OPM (~5 μm). FIGS. 31AA-32B illustrate several preferred implementations of the litho-programmable deep-sub-μm openings through litho-logic operation.

FIGS. 31AA-31AB illustrate a preferred implementations of the litho-programmable deep-sub-μm openings through litho-"OR". It uses two OPM's 30Z, 30W. Each OPM comprises a plurality of LMC's 40z1-40z3, 40w1-40w3. The LMC 40z2 on OPM 30Z is always dark, with another two LMC's 40z1, 40z3 programmable (FIG. 31AA); The LMC's 40w1, 40w3 on OPM 30W are always dark, with another LMC 40w2 programmable (FIG. 31AB). On wafer, the pattern from each LMC's 40z1-40z3 is aligned to and combined with pattern from each LMC's 40w1-40w3. Although the LMC 40z2 (40w1, 40w3) is always dark, its counterpart LMC 40w2 (40z1, 40z3) on the OPM 30W (30Z) can still program the corresponding wafer opening. As a result, every wafer opening is still programmable.

The LMC 40z2 in FIGS. 31AA-31AB is always set to dark. This can be easily accomplished by removing the ODP opening at this "always-dark" LMC 40z2. Accordingly, no structure needs to be built for this "always-dark" LMC 40z2 and an adjacent LMC can extend into its area. Occupying more area, this adjacent LMC is easier to design and manufacture.

Figure 31B:
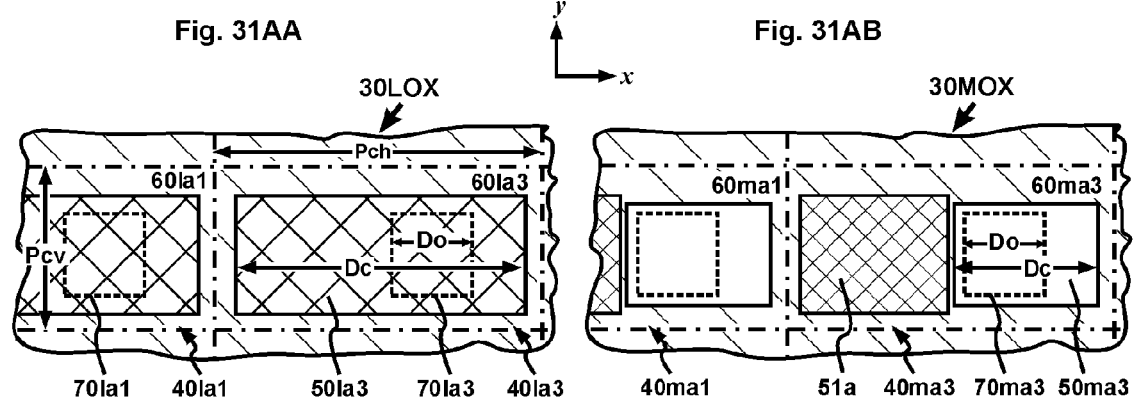

FIG. 31BA illustrates a preferred LC-OPM 30LOX whose LMC extends into the adjacent cells. Here, LMC 40la3 extends to an adjacent "always-dark" LMC (such as 40z2 in FIG. 31AA). If it can extend to three "always-dark" LMC's, the dimension of this LC-LMC could be 2R×$P_{wo}$. For a 0.25 μm opening and a conventional 4× litho-tool, this value could be as large as 4 μm. The LMC of this size is highly manufacturable and reliable. On the other hand, because the openings imaged on wafer are separately controlled by the ODP opening 70la3, they can still be small and have fine features. FIG. 31BB illustrates a preferred MEMS-OPM 30MOX whose LMC extends into the adjacent cells. Similarly, its LMC can use a larger, more manufacturable movable elements 51a.

Figure 31C:
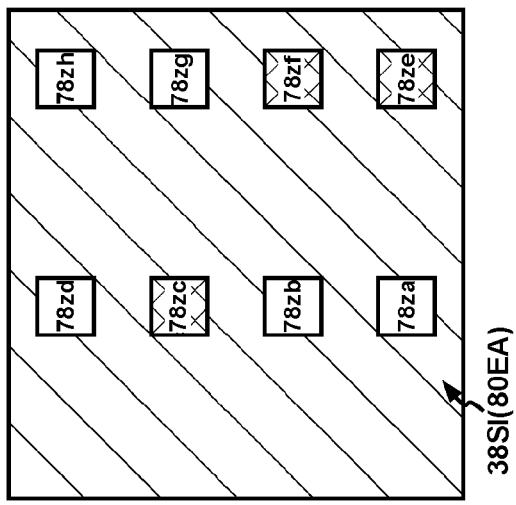
Figure 31C:
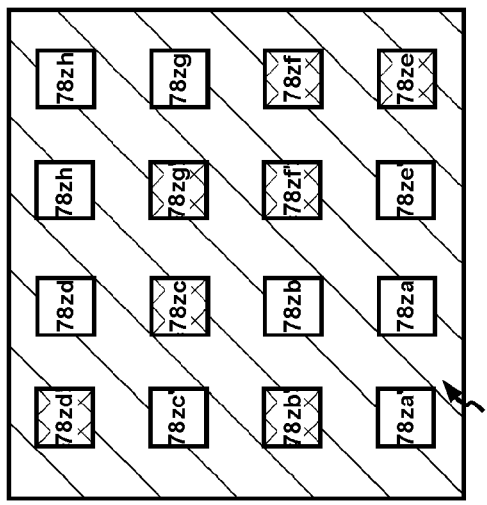
Figure 31C:
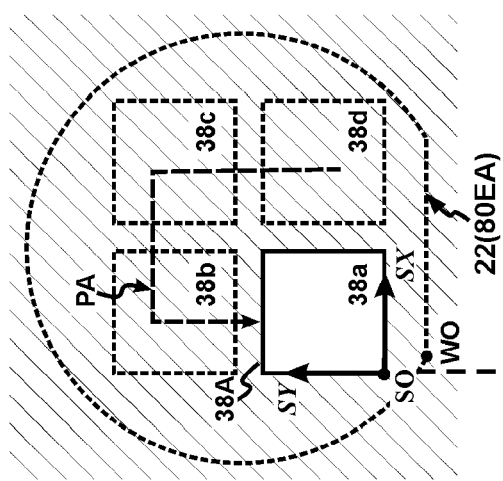
Figure 31C:
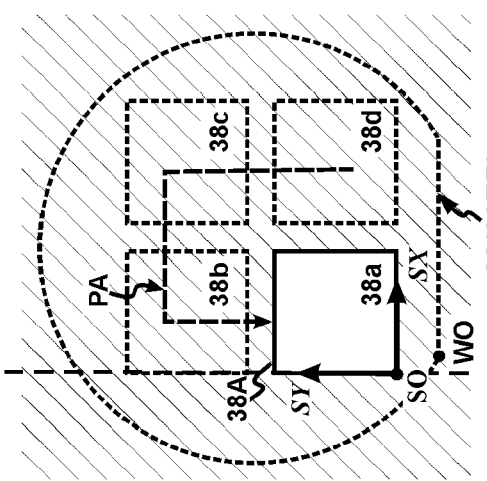
Figure 31C:
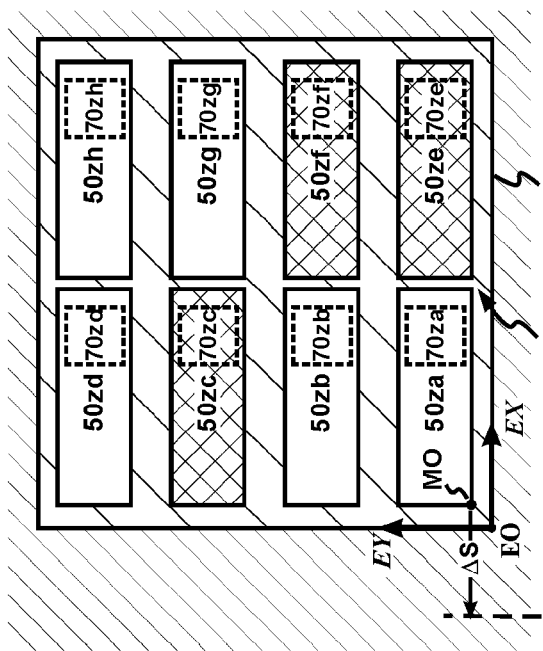
Figure 31C:
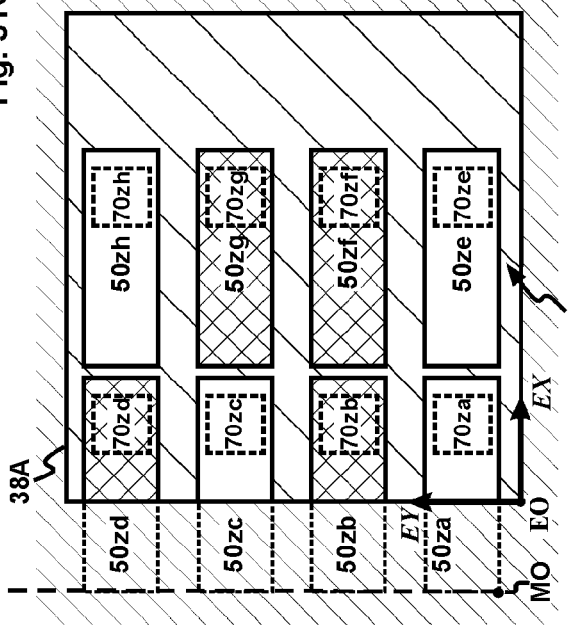

In the preferred embodiments of FIGS. 31AA-31BB, two OPM's 30Z, 30W are used. In fact, one OPM is all needed to form the desired wafer pattern. FIGS. 31CA-31DC' illustrate two preferred implementations. These implementations are based on multi-exposure with displacement. This method is also referred to as inter-leaved stepping.

The preferred implementation in FIGS. 31CA-31CC' is based on a multi-exposure with mask displacement. It is similar to FIGS. 20EA-20EB, except that mask in this embodiment is an OPM 38. During the first exposure pass 80EA, the OPM 38 coincides with the aperture 38A of the litho-tool, and it has a first mask pattern 38(80EA) (FIG. 31CA). Dies 38a-38d on wafer 22 are exposed one-by-one to the first mask pattern 38(80EA) (FIG. 31CB). The first exposure pass 80EA exposes a first half of the wafer openings 78za-78zh (FIG. 31CC). Their state is determined by the first mask pattern 38(80EA). At the beginning of second exposure pass 80EB, the OPM 38 is displaced by ΔS (ΔS is preferably equal to the mask opening period $P_o$) relative to the aperture 38A, i.e. its origin moves from MO to MO'. Meanwhile, the OPM 38 acquires a second mask pattern 38(80EB) (FIG. 31CA'). The second exposure pass exposes a second half of the wafer openings 78za'-78zh' (FIG. 31CC'). Their state is determined by the second mask pattern 38(80EB). Note that, at the beginning of each exposure pass, the wafer origin WO makes no displacement (FIG. 31CB'). With a single development step after all exposures, the desired opening pattern is formed on wafer.

Figure 31D:
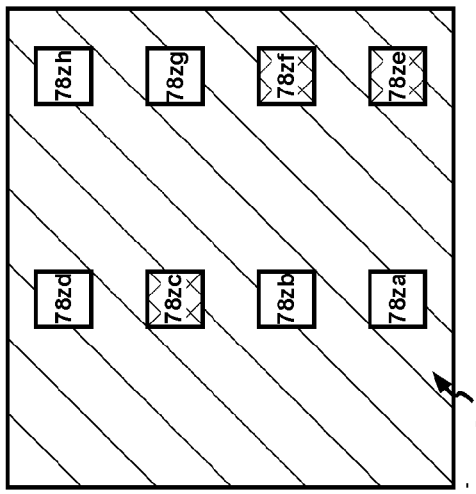
Figure 31D:
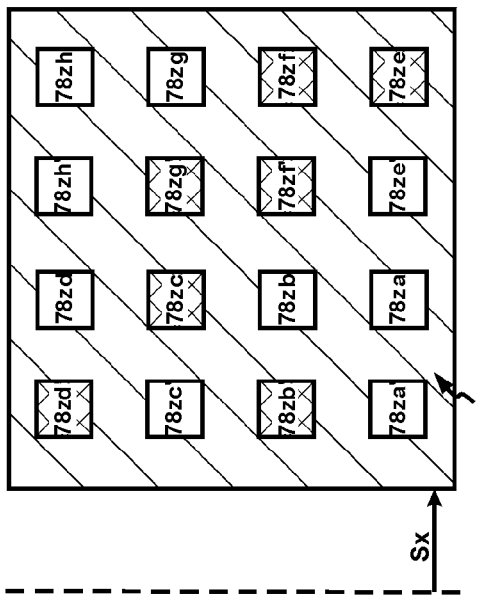
Figure 31D:
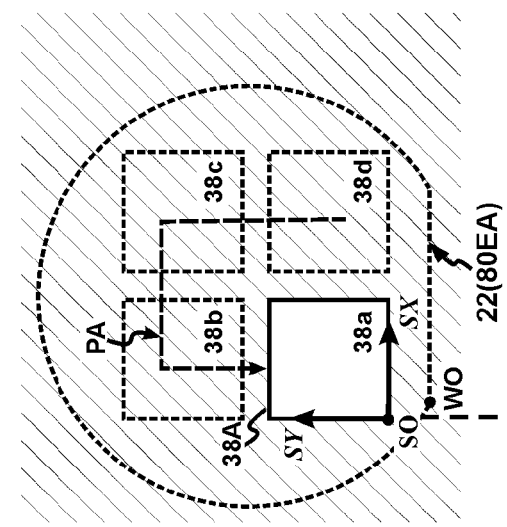
Figure 31D:
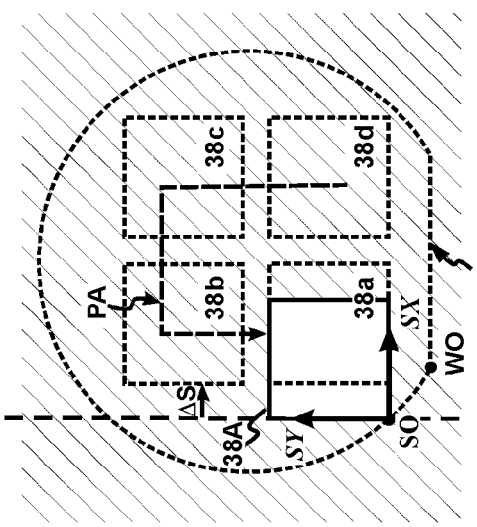
Figure 31D:
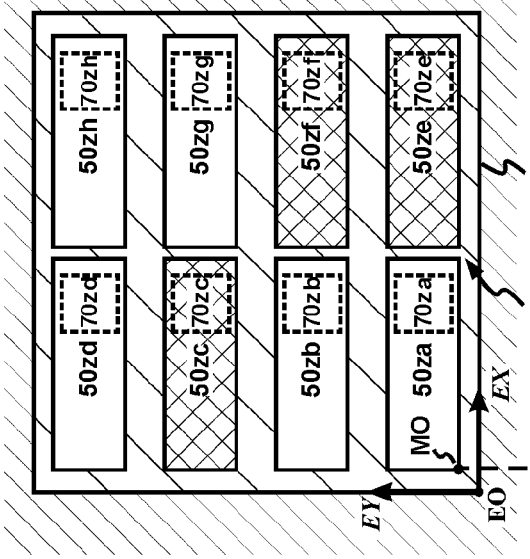
Figure 31D:
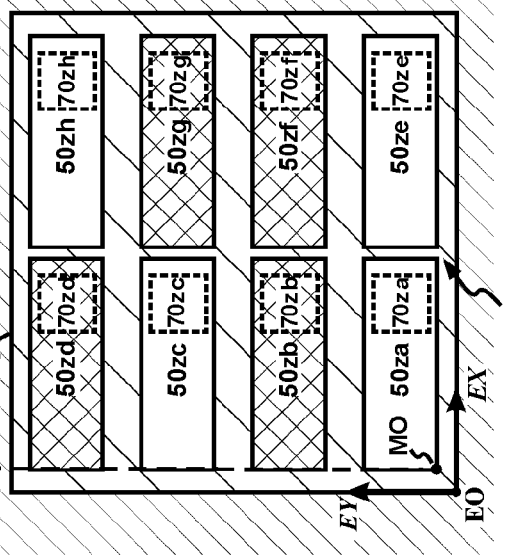

The preferred implementation in FIGS. 31DA-31DC' is based on a multi-pass exposure with wafer displacement. During the first exposure pass 80EA, the OPM 38 has a first mask pattern 38(80EA) (FIG. 31DA). Dies 38a-38d on wafer 22 are exposed one-by-one to the first mask pattern 38(80EA) (FIG. 31DB). The first exposure pass 80EA exposes a first half of the wafer openings 78za-78zh (FIG. 31DC). Their state is determined by the first mask pattern 38(80EA). During the second exposure pass 80EB, the OPM 38 acquires a second mask pattern 38(80EB) (FIG. 31DA') and a second half of the wafer openings 78za'-78zh' are exposed (FIG. 31DC'). Their state is determined by the second mask pattern 38(80EB). With a single development step after all exposures, the desired opening pattern is formed on wafer. Compared with FIGS. 31CA-31CC', the first and second half openings 78za-78zh, 78za'-78zh' here switch position. Note that during both exposure passes, the OPM 38 makes no displacement; however, at the beginning of each exposure pass, the wafer origin is displaced by ΔS (from WO to WO'), where ΔS is preferably equal to the wafer opening period $P_w$.

Figure 32A:
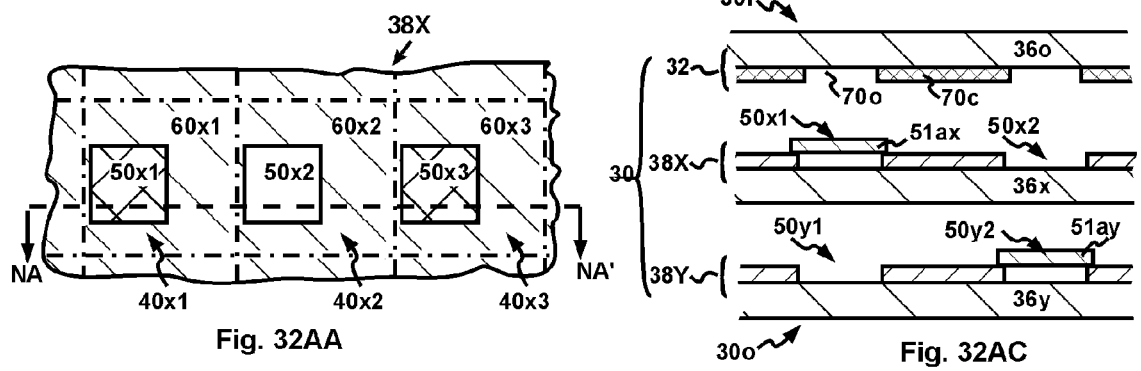
FIGS. 32AA-32B illustrate several preferred implementations of the litho-programmable deep-sub-μm openings through litho-"AND".
Figures 32A, 32B:
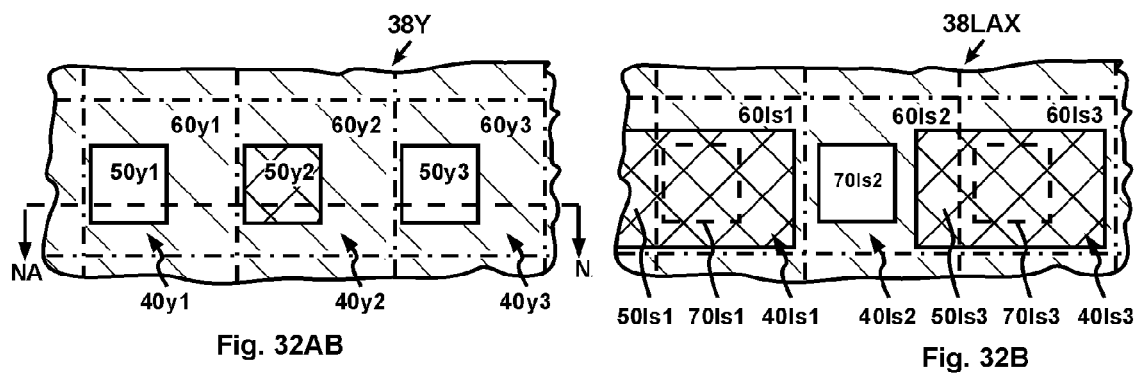

FIGS. 32AA-32AB illustrate a preferred implementation of the litho-programmable deep-sub-μm openings through litho-"AND". It comprises two LMP's 38X, 38Y. On the LMP 38X, the LMA 50x2 is always clear, with another two LMA's 50x1, 50x3 programmable (FIG. 32AA); on the LMP 38Y, the LMA's 50y1, 50y3 are always clear, with another LMA 50y2 programmable (FIG. 32AB). During exposure, two LMP's 38X, 38Y and an ODP 32 are aligned to each other. Wafer patterns are formed through litho-"AND" (FIG. 32AC). For the "always-clear" LMA 50x2, it does not modulate light and therefore, does not need peripheral circuit. Accordingly, its peripheral-circuit area can be used by the adjacent LMC 50x1. FIG. 32B illustrates a preferred LC-LMP 38LAX whose LMA 50ls3 extends into the adjacent peripheral-circuit area. Its LMC is larger and more manufacturable.

D. Mask Inspection and Repair

Figure 33A:
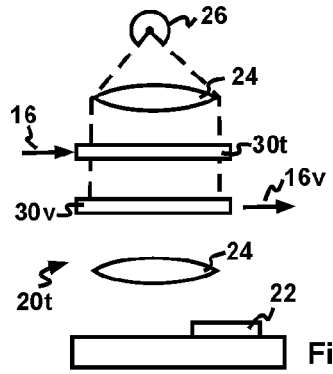
FIGS. 33AA-33FC illustrate several preferred mask-inspection and mask-repair means.
Figure 33A:
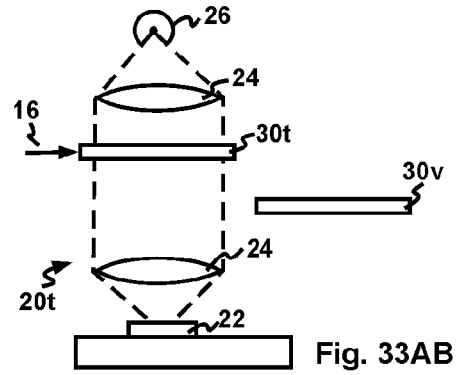

During its usage, an OPM preferably go through a field inspection so as to ensure the desired pattern is generated. FIGS. 33AA-33BB illustrate a field-inspectable programmable litho-system. It comprises an image sensor 30v. It is placed into the exposure-light path after the OPM 30t is configured but before the wafer 22 is exposed (FIG. 33AA). Preferably, at the location of image sensor 30v, the image from the OPM patterns has not been reduced by the litho-tool. Accordingly, the image sensors 30v can use larger sensing cells. This will benefit the signal integrity and lower the sensor cost. The sensed signal 16v (from the image sensor 30v) is compared with the configuration data 16. If they match, the image sensor 30v is removed from the exposure-light path and a wafer 22 is exposed (FIG. 33AB); otherwise, the OPM 30t needs to be checked.

Figure 33B:
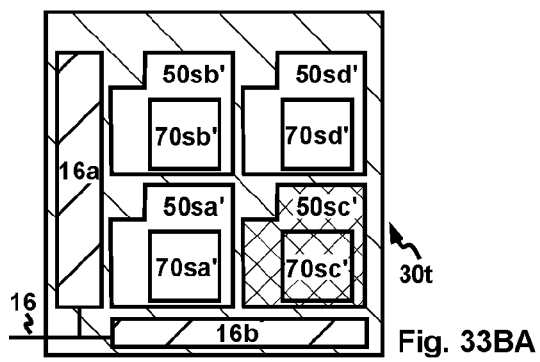
Figure 33B:
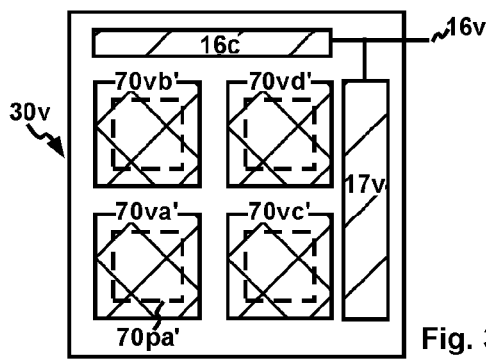

FIG. 33BA illustrates an OPM pattern during exposure. Based on the configuration data 16, the light intensity on the LMC 50sa'-50sd' are varied; the ODP openings 70sa'-70sd' define the final shape of the wafer openings. FIG. 33BB is a preferred image sensor 30v. It comprises a plurality of sensing cells 70va'-70vd' and a peripheral circuit 16c. The sensing cells 70va'-70vd' can be based on conventional image-sensing techniques, such as CCD, CMOS imager. The peripheral circuit 16c collects the sensed signal 16v. During field inspection, the sensing cells 70va' is aligned with the LMC 50sa' (FIG. 33AA), and preferably encompasses the pattern 70pa' imaged by the ODP opening 70sa' thereon.

Figure 33C:
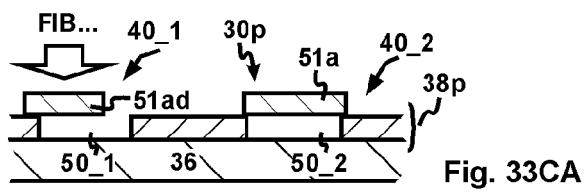
Figure 33C:
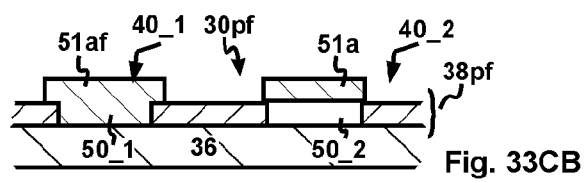
Figure 33C:
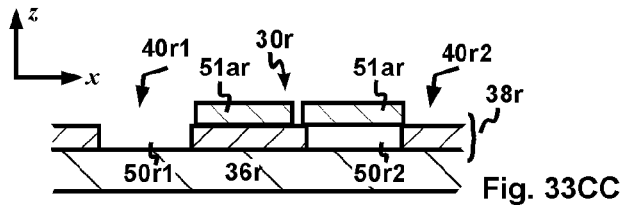

Logic litho-system can be used to improve the mask yield. The primary mask (i.e. the mask that is supposed to form wafer patterns) likely has defects. A redundant mask (region) can remedy these defects through litho-logic operation. OPM is well suited for the redundant mask (region). FIGS. 33CA-33FC illustrate several preferred mask-repair means.

FIGS. 33CA-33CC illustrate a preferred mask-repair means based on litho-"OR". In this preferred embodiment, the primary OPM 30p works with a redundant OPM 30r to form the desired wafer patterns. In the "OR" litho-system, each redundant LMC (i.e. the LMC on the redundant OPM 30r, e.g. 40r1) corresponds to a primary LMC (i.e. the LMC on the primary OPM 30p, e.g. 40_1). For the non-defective primary LMC 40_2, the corresponding redundant LMC 40r2 is at the "OFF" state; for the defective primary LMC 40_1 (FIG. 33CA), its correctional pattern is now carried by the redundant LMC 40r1 (FIG. 33CC). Meanwhile, means such as FIB (focused ion beam) is used to darken the defective LMC 40_1 (FIG. 33CB) by, for example, filling a light-absorptive material 51af to the defect site 51ad.

Figure 33D:
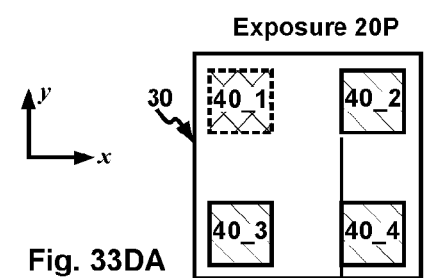
Figure 33D:
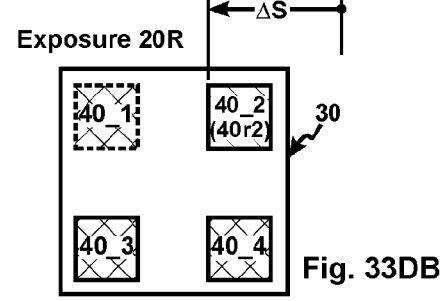

In fact, the OPM can perform self-repair. This involves multi-exposure with displacement. FIGS. 33DA-33DB illustrate a preferred OPM with self-repair. Here, the LMC 40_1 on the OPM 30 is defective and is subsequently darkened; the LMC 40_2 is non-defective. After a primary (first) exposure 20P, the OPM 30 is displaced relative to the wafer by ΔS and a redundant (second) exposure 20R is performed. At this time, the image of the LMC 40_2 formed on wafer is located at where the image of the LMC 40_1 should have been during the primary exposure 20P, and all LMC's corresponding to the non-defective primary LMC's are at the "OFF" state. Because the LMC 40_2 carries the designated pattern for the defective LMC 40_1, the desired wafer patterns can be formed. The OPM self-repair needs only one mask.

Besides the OPM-repair, non-programmable (conventional) masks can be repaired based on pattern-distribution. In prior arts, the mask is repaired at the defect sites. Because a typical mask is "feature-dense", this "repair-at-site" scheme will likely damage the adjacent "known-good" mask features and therefore, is error-prone. It is even more difficult to repair the PSM and OPC-masks. The present invention provides a "repair-through-redundancy" scheme for the defective mask. After clearing or darkening the defect sites (depending on the logic litho-operation to be used), instead of "repair-at-site", the correctional structures are formed in another (redundant) region on the mask or on a different (redundant) mask. This repair step will unlikely interfere with other "known-good" mask patterns. As a result, "repair-through-redundancy" is more reliable and robust.

Figure 33E:
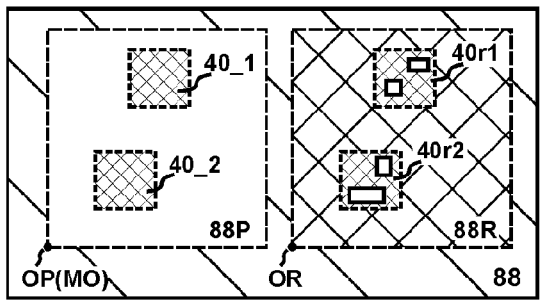
Figure 33E:
Figure 33E:
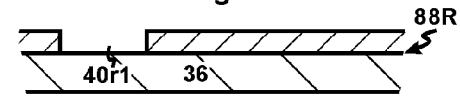

FIG. 33EA illustrates a pattern-distributed mask 88. It comprises a primary mask region 88P and a redundant mask region 88R. The primary mask region 88P comprises a plurality of darkened areas 40_1, 40_3. These darkened areas cover the defect sites and are preferably formed by, for example, filling a light-absorptive material 51*af* on the defect sites (FIG. 33EB). The redundant mask region 88R comprises a plurality of correctional areas 40*r*1, 40*r*2. Each correctional area 40*r*1 corresponds to a darkened area 40_1 in the primary mask region 88P and it carries the designated patterns for the defect site 40_1 (FIG. 33EC). Through litho-"OR", the patterns from these mask regions 88P, 88R are merged and form the desired pattern on wafer. It is to be understood that the primary mask region and redundant mask region can be located on two masks. Repair-through-redundancy is well suited to repair the PSM and OPC-mask.

Alternatively, the OPM can also be used be repair a non-programmable mask. The advantage of the OPM-repair is that the OPM can be readily configured for the mask-repair purpose. This configuration step can be carried out in a short time. Accordingly, the field-repair for the defective opening masks becomes feasible.

Figure 33F:
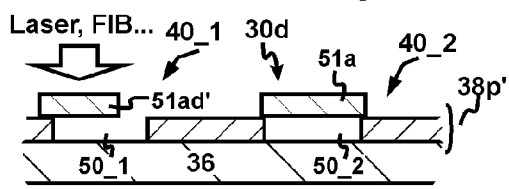
Figure 33F:
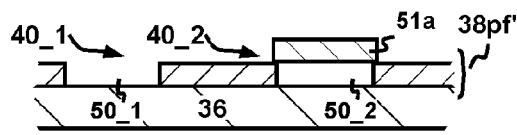
Figure 33F:
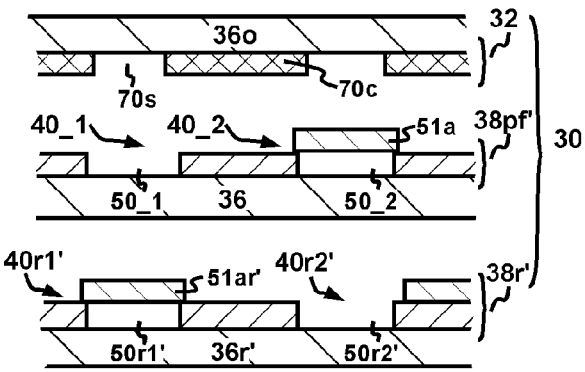

FIGS. 33FA-33FC illustrate an alternate preferred mask-repair means based on litho-"AND". The primary LMP 38*p* comprises a defective LMC 40_1 (FIG. 33FA). The defect 51*ad'* is cleared by, for example, a laser beam or FIB, and therefore, the LMC 40_1 becomes always clear (FIG. 33FB). A redundant LMP 38*r'* is aligned with the primary LMP 38*p* and the ODP 32. The redundant LMC 40*r*1' performs light-modulation for the defective primary LMC 40_1; and other redundant LMC's corresponding to the non-defective primary LMC's are always at the "ON" state (FIG. 33FC). This method can also be extended to the repair of non-programmable masks.

E. Long-Term Exposure Endurance

Figure 34A:
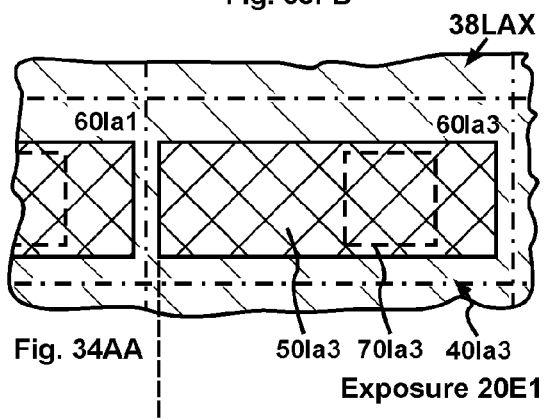
FIGS. 34AA-34BB illustrate a preferred OPM with long-term exposure endurance.
Figure 34A:
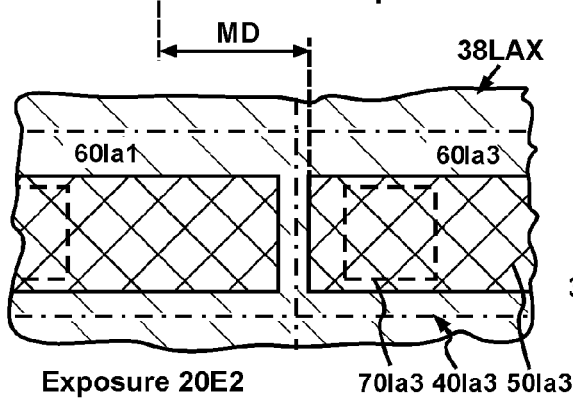
Figure 34B:
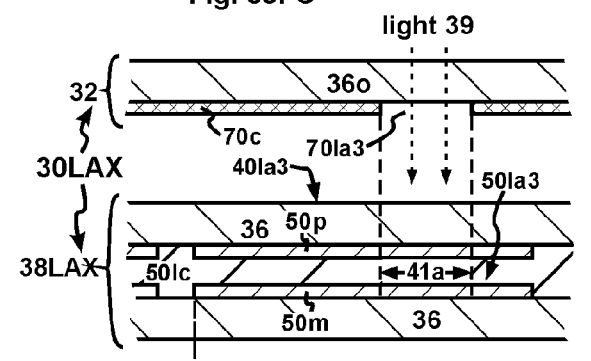
Figure 34B:
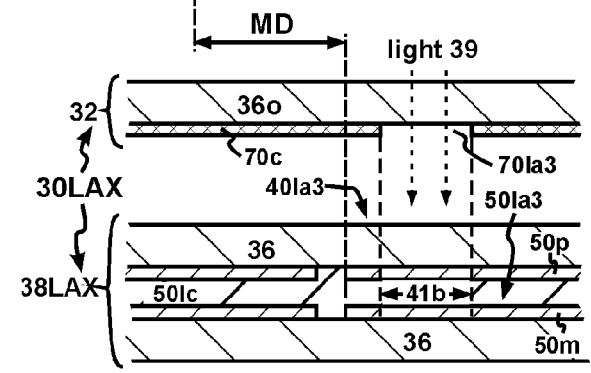

During long-term exposure, an OPM may become overheated. FIGS. 34AA-34BB illustrate a preferred method to avoid over-heating during the long-term exposure of an OPM. In this preferred embodiment, the LMP 38LAX and the ODP 32 are located on two separate substrates. Between two exposures 20E1, 20E2, the LMP 38LAX is displaced by MD while the location of the ODP 32 is fixed. Accordingly, during two exposures 20E1, 20E2 to the LPM 38LAX, the exposure light passes through different LMA areas 41*a*, 41*b*. Accordingly, each LMA area 41*a*, 41*b* receives less exposure-light intensity and the over-heating issue is alleviated. Because the location of the ODP 32 is fixed, the LMP displacement does not affect the final pattern formed on wafer.

6. Applications of Low-Cost Lithography

Low-cost lithography combines techniques such as nF-opening mask, programmable litho-system, and logic litho-system. It is ideal for the litho-programmable integrated circuits (LP-IC). Examples of LP-IC include litho-programmable SCIC (LP-SCIC) and litho-programmable ASIC (LP-ASIC). Low-cost lithography can also be used during the fabrication of conventional masks and master optical discs.

A. Litho-Programmable Integrated Circuits (LP-IC)

Figure 35:
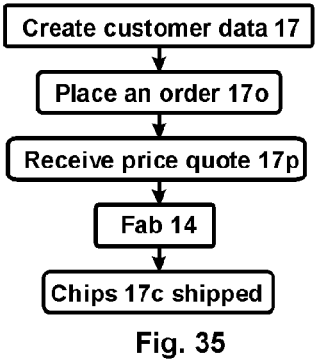
FIG. 35 illustrates a preferred flow for a litho-programmable integrated circuit (LP-IC).

An LP-IC comprises a plurality of litho-programmable opening-related patterns (e.g. litho-programmable inter-level connections and litho-programmable segmented-lines). It can be implemented with an UOPM and optionally with an UMLM. In an LP-IC flow (FIG. 35), a customer first creates a set of customer data; then s/he sends to the fab an order, which has an order volume; the fab returns with a price quote. The overall expected revenue for this order, which is the product of the order volume and the price quote, can be smaller than the cost of the conventional custom opening-mask set corresponding to said opening-related patterns. In contrast, in prior arts, the completion of the same order involves making a new set of (conventional) custom masks. The manufacturing cost, including other processing and materials costs, should at least be higher than the cost for these masks. Namely, the overall expected revenue of the conventional (non-litho-programmable) IC cannot be lower than the mask cost. Accordingly, the present invention differentiates the LP-IC from conventional IC through their expected revenues for a specific order.

One example of LP-IC is litho-programmable SCIC (LP-SCIC). In an LP-SCIC, a limited number of custom layers are formed by litho-programming. The LP-SCIC includes litho-programmable ROM (LP-ROM) and litho-programmable PGA (LP-PGA). Another example of LP-IC—litho-programmable ASIC (LP-ASIC)—goes even further. By taking full advantage of low-cost lithography, its back-end process eliminates the needs for custom masks (at least expensive custom masks). The front-end layers of LP-ASIC are fully customized, just like a conventional ASIC. This can reduce chip area and realize high-speed circuit. The back-end design needs to follow a more stringent ASIC-DFL: in at least one metal layer of the LP-ASIC, all metal lines are aligned along a first direction with their width and spacing preferably equal to 1 F, in a metal layer next to said metal layer, all metal lines are aligned along a second direction with their width and spacing also preferably equal to 1 F. By repetitively using the GPM such as UOPM and UMLM, all interconnect patterns can be formed without using custom masks. To accomplish the same task in a conventional ASIC, tens of custom masks are needed. Moreover, these GPM's are shared in many LP-ASIC products, they add little cost to the ASIC chips.

Figure 36A:
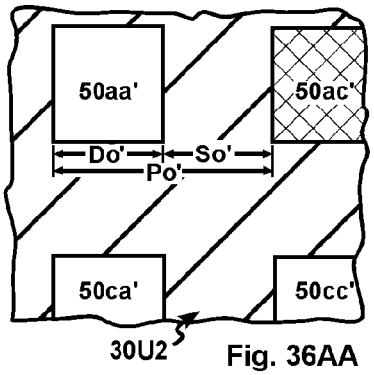
FIGS. 36AA-36F illustrate several preferred implementations of litho-programmable ASIC.
Figure 36A:
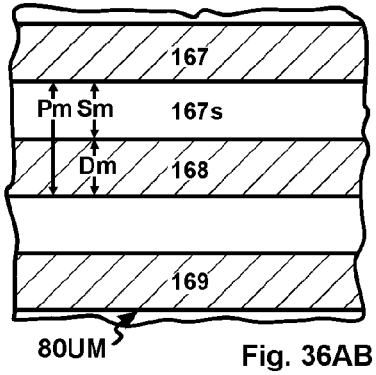

FIGS. 36AA-36AB illustrate two preferred GPM's. FIG. 36AA illustrates a 2 F-UOPM 30U2 and FIG. 36AB illustrates a 1 F-UMLM 80UM (also shown in FIG. 28B). On the 2 F-UOPM 30U2, its LMC size $D_o'$ and spacing $S_o'$ are equal to 2 F or at least around 2 F. The 2 F-UOPM 30U2 has better manufacturability and can also implement segment-gaps and inter-level connections (referring to FIGS. 2A-2B). Alternatively, the 1 F-UOPM of FIG. 28A can be used.

Figure 36B:
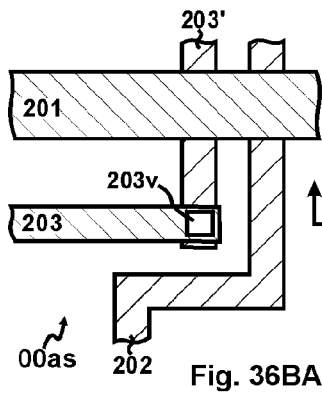
Figure 36B:
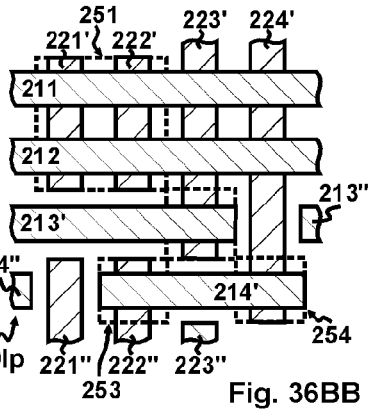
Figure 36B:
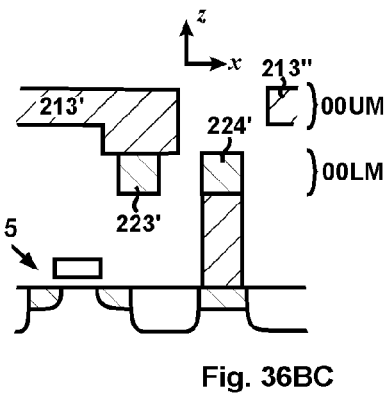

FIGS. 36BA-36BC illustrate a preferred implementation of LP-ASIC using the GPM. The interconnects 00*as* in FIG. 36BA are the typical interconnects encountered in an ASIC layout. They involve two metal levels and include a wide metal line 201 (with width equal to 2 F), a bended line 203/203' (its two sections 203, 203' are connected through via 203*v*), and a displaced line 202 (the line has a displacement along the x direction). A conventional process needs three custom masks, i.e. an upper-level metal mask, a lower-level metal mask and a via mask. According to the present invention, the LP-ASIC only needs two GPM's, i.e. a 2 F-UOPM (FIG. 36AA) and an UMLM (FIG. 36AB). FIGS. 36BB-36BC illustrate the LP-ASIC interconnects 00*lp* equivalent to interconnects 00*as* of FIG. 36BA. Here, all upper-level metal lines 00UM are aligned along the xdirection, and all lower-level metal lines 00LM are aligned along the ydirection. For the wide metal line 201 of FIG. 36BA, FIG. 36BB uses two 1 F upper-level metal lines 211, 212, which are shorted by the lower-level metal segments 221', 222' and a merged aiv 251. For the bended line 203/203', FIG. 36BB stays the same. For the displaced line 202, a conventional ASIC only uses a single lower-level metal line. However, according to the ASIC-DFL, the LP-ASIC segment along the x direction has to be implemented by the upper-level metal line 00UM (FIG. 36BB). Accordingly, the equivalence of the displaced line 202 includes three metal segments 222" (00LM), 214' (00UM), 224' (00LM), and two aivs 253, 254.

Figure 36C:
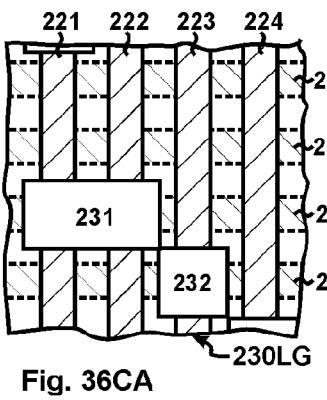
Figure 36C:
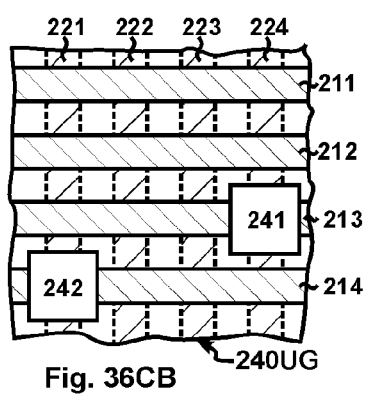
Figure 36C:
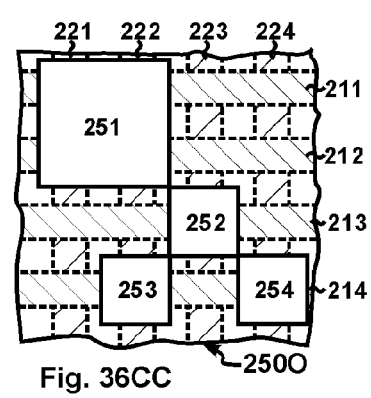

To implement the lower-level metal lines 221'-224' of FIGS. 36BB-36BC, the UMLM 80UM is placed along the ydirection in the litho-tool. To realize the gaps between metal segments 221' and 221", 222' and 222", 223' and 223", a first litho-"OR" is performed on the UOPM 30U2 (referring to FIGS. 26A-26C). During the first litho-"OR", the UOPM 30U2 has a first opening configuration 230LG (including openings 231-232) and its relative placement to the lower-level metal pattern (including metal lines 221-224) is illustrated in FIG. 36CA. Apparently, the openings (e.g. 231) divide the metal lines (e.g. 221) into the segments (e.g. 221', 221") of FIG. 36BB.

To implement the upper-level metal lines 211-214' of FIGS. 36BB-36BC, the UMLM 80UM is placed along the xdirection in the litho-tool. Meanwhile, to realize the gaps between metal segments 213' and 213", 214' and 214", a second litho-"OR" is performed on the UOPM 30U2. During the second litho-"OR", the UOPM 30U2 has a second opening configuration 240UG (including openings 241-242) and its relative placement to the upper-level metal pattern (including metal lines 211-214) is illustrated in FIG. 36CB. Apparently, the openings (e.g. 241) divide the metal lines (e.g. 213) into the segments (e.g. 213', 213") of FIG. 36BB.

Finally, to implement the inter-level connections of FIGS. 36BB-36BC, the UOPM 30U2 is again used. FIG. 36CC illustrates its third opening configuration 250O (including openings 251-254) and its relative placement to the lower/upper-level metal patterns. These openings (e.g. 252) provide inter-level connections between the lower-and upper-level metal lines (e.g. 213, 223). Note that all three opening patterns 230LG, 240UG, 250O are generated by a single UOPM 30U2.

Figure 36D:
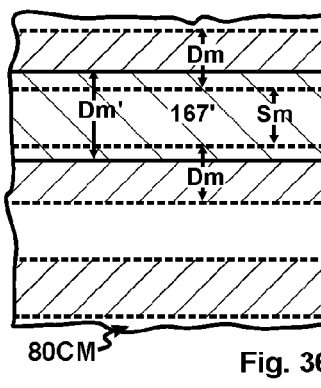

FIG. 36D illustrates an alternate preferred implementation of wide metal line 201 of FIG. 36BA. It uses a custom metal mask 80CM. The desired metal line 201 is formed by performing litho-"AND" on said custom metal mask 80CM and the UMLM 80UM. During litho-"AND", their relative placement is illustrated in FIG. 36D. On the custom metal mask 80CM, the metal pattern 167' is only needed at places corresponding to the wide metal lines 201 of FIG. 36BA, and its width only needs to be larger than the line-spacing 167s (~1 F). To implement gaps on wide metal line 201, multi-exposure with displacement of FIGS. 30CA-30CB can be used. Since the custom metal mask 80CM only contains wide metal lines (>1 F), which can tolerate large width and alignment error, the mask and processing costs are fairly low.

Figure 36E:
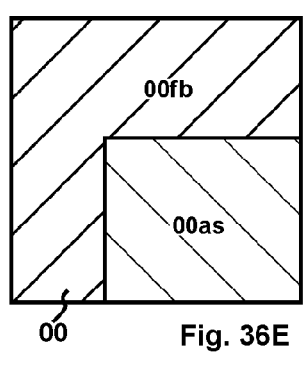

The LP-ASIC implementations in FIGS. 36AA-36CC not only can be used in a standalone ASIC, but also in SoC designs with embedded ASIC. FIG. 36E illustrates a preferred SoC chip 00 with an ASIC block 00*as* and a plurality of functional blocks 00*fb*. The functional blocks 00*fb* usually contains IC blocks with third-party IP, such as memory blocks (RAM, ROM, etc) and processing blocks (CPU, DSP, etc). The SoC patterns can be implemented through litho-"OR" between two mask sets: one for the ASIC block 00*as* (ASIC mask set), the other for the functional blocks 00*fb* (functional-block mask set), as in the case of FIGS. 25A-25C. The ASIC mask set follows the LP-ASIC implementations. The functional-block mask set may be provided by IP-vendors, or may also follow the LP-ASIC implementations.

Figure 36F:
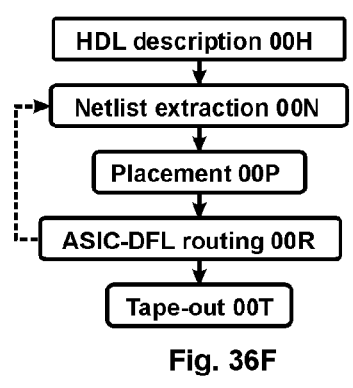

FIG. 36F illustrates a preferred design flow of LP-ASIC. Similar to a conventional ASIC, it includes steps such as HDL description 00H, netlist extraction 00N, placement 00P, routing 00R, and tape-out 00T. However, the routing 00R of LP-ASIC needs to follow the ASIC-DFL. Moreover, only front-end layout needs to be taped out 00T. The back-end output is not layout, but the state or location of openings. It has small data amount and can be delivered to the fab through the internet.

B. Quasi-Opening Programmable Mask (QOPM)

Figure 37A:
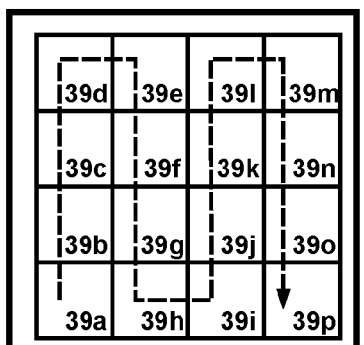
FIGS. 37A-37C illustrate a preferred implementation of a quasi-opening-programmable mask.
Figure 37B:
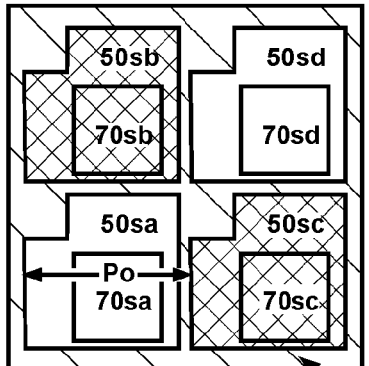
Figure 37B:
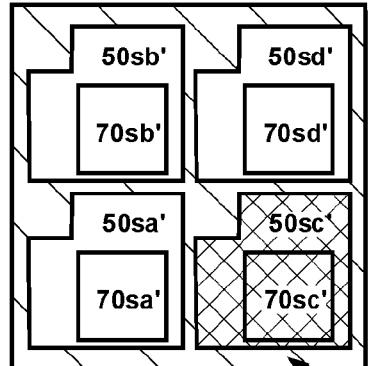
Figure 37C:
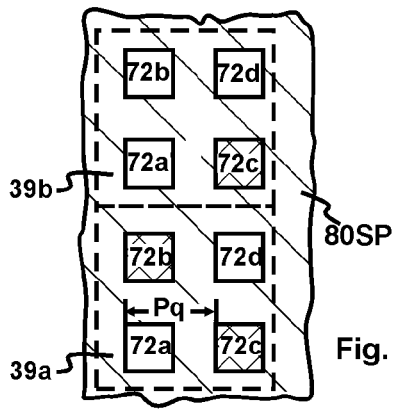

Low-cost lithography, more particularly OPM, can also be used to fabricate conventional masks, particularly the conventional mask with regularly-sized and -spaced openings, as in the case ROM, PGA and others. Accordingly, this type of conventional mask is referred to as quasi-opening programmable mask (QOPM). FIGS. 37A-37C illustrate a preferred process flow.

FIG. 37A illustrates a preferred process flow to fabricate a QOPM from an OPM. It is similar to conventional lithographic process. However, the image carrier here is not a wafer, but a mask blank 80SP coated with photoresist (QOPM blank). The QOPM 80SP comprises a plurality of QOPM units 39*a*-39*p*. Each QOPM unit corresponds to the exposure field of the OPM during one exposure. In the programmable litho-system, the QOPM blank 80SP steps and the QOPM units 39*a*-39*p* are exposed one-by-one with respect to the OPM 30. Between exposures, the OPM patterns are adjusted based on the configuration data. For example, during the exposure 80Ea to the QOPM unit 39*a*, the OPM 30 has a first pattern 30(80Ea) and the LMC 50*sb* is at the "OFF" state (FIG. 37BA); during the exposure 80Eb to the QOPM unit 39*b*, the OPM 30 has a second pattern 30(80Eb) and the LMC 50*sb* is at the "ON" state (FIG. 37BB). Accordingly, on the QOPM 80SP, no opening is formed at location 72*b*, and an opening is formed at location 72*b'* (FIG. 37C). Note the shape of these openings 72*b'* is controlled by the ODP openings 70*sa*-70*sd*, 70*sa'*-70*sd'*. Besides simple side-by-side stepping, inter-leaved stepping of FIGS. 31CA-31DC' can also be used during the fabrication of the QOPM.

From FIGS. 37A-37C, the LMC period $P_o$ on the OPM 30 is R times the opening period $P_q$ on the QOPM 80SP. If a same litho-tool is used to expose the QOPM 80SP to a wafer, $P_o$ can be $R^2$ times the wafer opening period $P_w$. By "imaging twice" (first from an OPM to a QOPM, then from the QOPM to a wafer), the image reduction ration from the OPM to the wafer is $R^2$. With a typical R 4×-5×, the LMC can be 16×-25× larger than $P_w$. For example, at the 0.13 μm node, an LMC could be ~5 μm. The LMC of this size is highly manufacturable and reliable. Moreover, the QOPM openings have a size of ~1 μm. The openings of this size can be formed by a conventional optical litho-tool and configured by an LC-LMC (e.g. an off-shelf LCD from the micro-display industry). Accordingly, a QOPM can be fabricated in-house. It has a short turn-around time and offers better user-configurability. In sum, the QOPM is a very practical intermediate step for low-cost lithography.

C. Master Optical Disc

Figure 38A:
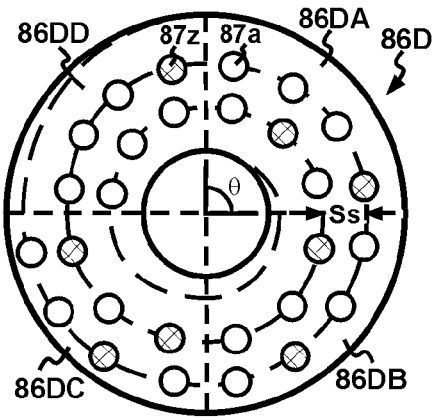
FIGS. 38A-38CB illustrate a preferred implementation of master optical disc.

Low-cost lithography, more particularly OPM, can also be used to fabricate master optical discs. This process is similar to the fabrication of the QOPM, except that the image carrier now is a master optical disc 86D. The master optical disc 86D is circular and has spiral tracks. The spacing between each turn of spiral is $S_s$ (FIG. 38A). Digital "0' and "1" is represented through the existence and absence of pits.

Figure 38B:
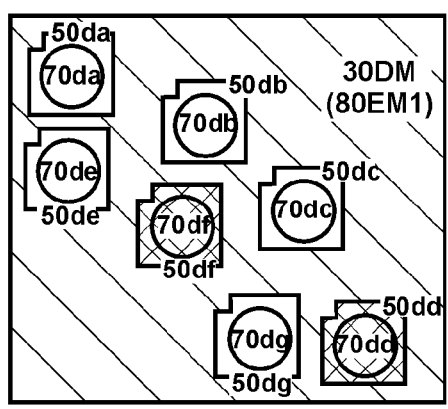

An OPM 30DM can be used to fabricate the master optical disc 86D. The LMC's 50*da*-50*dg* on the OPM 30DM form an arc (FIGS. 38BA-38BB). It controls the existence of pits within a degree θ on the master optical disc. In this preferred embodiment, θ is 90°. Similar to the QOPM, the master optical disc steps in a programmable litho-tool and is exposed one section after another. At each exposure, the OPM 30DM adjusts its pattern according to the configuration data. During exposure 80EM1, the OPM 30DM has a first pattern 30DM

Figure 38C:
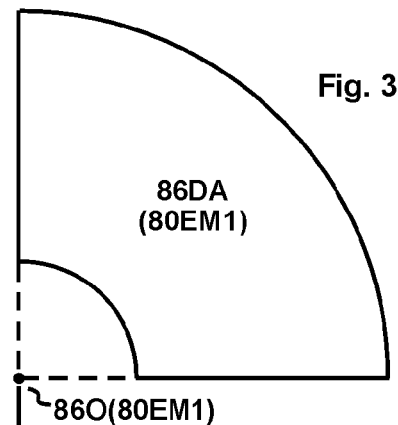
Figure 38B:
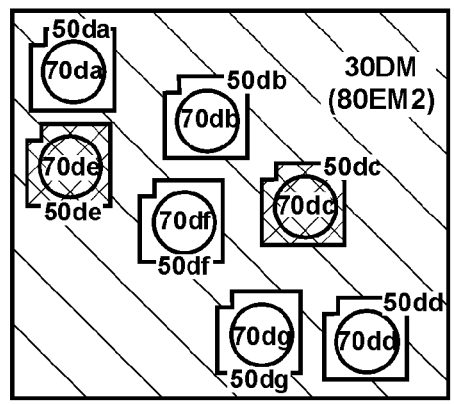
Figure 38C:
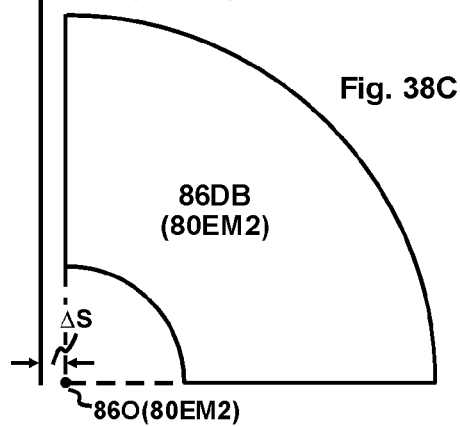

(80EM1) (e.g. the LMC 50*de* is at the "ON" state) (FIG. 38BA) and the disc section 86DA is exposed. FIG. 38CA illustrates the position and orientation of the master optical disc 86D during the exposure 80EM1. During exposure 80EM2, the OPM 30DM has a second pattern 30DM (80EM2) (e.g. the LMC 50*de* is at the "OFF" state) (FIG. 38BB) and the disc section 86DB is exposed. FIG. 38CB illustrates the position and orientation of the master optical disc 86D during the exposure 80EM2. Relative to the exposure 80EM1, the master optical disc 86D rotates around its origin 860(80EM2) by θ and displaced by ΔS (preferably equal to $\theta/360° \times S_s$). In this preferred embodiment, at least four exposures are needed to form the whole master disc.

7. Business Model

The LP-IC preferably follows an internet business model. As is illustrated in FIG. 8AA, FIG. 35 and FIG. 39A, a customer 12 sends a set of customer data 17 to a fab 14 through a medium 18, such as internet. In the fab 14, wafers are preferably constantly exposed in a programmable lithosystems. Once a new order is received, the customer data 17 are processed by a data-processing unit 15 and converted into a set of configuration data 16. The configuration data 16 are issued to the OPM and then coded into the wafer-under-exposure. Thus, the customer 12 has direct, remote and real-time control.

For data which are frequently needed or whose source code the owners want to hide from the customers (e.g. copyrighted materials such as audio/video materials), they can be stored in a database 1*ddb* at or near the fab 14. To select the interested files 1*da*, 1*dc*, the customer 12 sends pointers 1*pa*, 1*pc* associated with these files (e.g. by clicking a web-page 12*t*) and the data-processing unit 15 will fetch these files from the database 1*ddb*. Because the fab 12 can have fast access to the database 1*ddb*, the upload time is more acceptable. Alternatively, the customer data 17 can be compressed.

Using "hard" mask for coding, the prior-art ROM usually only stores "public" information. Shared by many users, "public" information does not need to be encrypted. However, with the advent of litho-programming, litho-programmable ROM (LP-ROM) will more likely store "personal" information. Accordingly, information security will become a concern. FIG. 39BA illustrates the data flow for a preferred secure LP-ROM. Before sending it to the fab, the customer encrypts the customer data 17 at an encryption unit 4*e* with a key 7*k*. Subsequently, only encrypted data 17*ed* are sent to the fab. The fab 14 plainly codes these data into a LP-ROM chip 9, without any knowledge of their representation. After receiving chip 9, the customer inputs the key 7*k* and enables the chip 9. As a result, the key 7*k* never falls out of the customer's hands and excellent information security can be achieved during the chip manufacturing.

Besides high security during manufacturing, it is also desired to maintain a high security during the chip usage. Preferably, a decryption engine 4*d* and a key storage 7*m* can be built on the same chip as the LP-ROM chip 9. Three-dimensional read-only memory (3D-ROM) is well suited for this purpose. As illustrated in FIG. 39BB, the 3D-ROM cells 101-103 are located above the substrate 00 and they do not occupy silicon real estate. Accordingly, the substrate 00 can accommodate a large number of transistors 5 and NVM 7. They can be used to form the decryption engine 4*d* and the key storage 7*m* (FIG. 39BC). Accordingly, the decryption process can be completely carried out inside the 3D-ROM chip 9. The decrypted data 170 can be directly forwarded to other functional blocks on the chip, such as D/A converter. During the chip usage, the key is not exposed to the external world and excellent information security can be achieved.

While the invention has been particularly shown and described with reference to the preferred embodiments thereof, it will be understood by those skilled in the art that various changes in form and details may be made without departing from the spirit and scope of the invention. For example, many preferred embodiments use metal lines. In fact, other conductive lines (e.g. poly-silicon lines) can also be used. These low-cost lithography concepts can be readily extended to next-generation lithography (e.g. X-ray, e-beam, ion-beam). The invention, therefore, is not to be limited except in the spirit of the appended claims.

What is claimed is:

1. A highly-corrected mask comprising a plurality of pattern structures, each of said pattern structures comprising:
    a zero-order structure having a minimum feature size;
    at least one higher-order correctional structure surrounding at least a portion of said zero-order structure;
    wherein there exists at least one point at the outer edge of said higher-order correctional structure whose smallest spacing to the outer edge of said zero-order structure is larger than half of said minimum feature size;
    whereby the optical image formed by said zero-order structure and said higher-order correctional structure is smaller than the optical image formed by said zero-order structure alone.

2. The highly-corrected mask according to claim 1, wherein said higher-order correctional structure is a phase-shifter.

3. The highly-corrected mask according to claim 1, wherein said higher-order correctional structure is a correctional ring separated from said first-order pattern by a spacer structure.

4. The highly-corrected mask according to claim 3, wherein said correctional ring is a clear pattern.

5. The highly-corrected mask according to claim 3, wherein said spacer structure is a dark pattern.

6. The highly-corrected mask according to claim 3, wherein said spacer structure is a phase-shifter.

7. The highly-corrected mask according to claim 3, wherein said spacer structure is a trench.

8. The highly-corrected mask according to claim 1, wherein said pattern structures are vias.

9. The highly-corrected mask according to claim 1, wherein said pattern structures are lines.

10. A highly-corrected mask system, comprising:
    a first mask region comprising a plurality of pattern structures; and
    a separate second mask region comprising a plurality of pattern structures;
    each of said pattern structures comprising:
        a zero-order structure having a minimum feature size;
        at least one higher-order correctional structure surrounding at least a portion of said zero-order structure;
        wherein there exists at least one point at the outer edge of said higher-order correctional structure whose smallest spacing to the outer edge of said zero-order structure is larger than half of said minimum feature size;
        whereby the optical image formed by said zero-order structure and said higher-order correctional structure is smaller than the optical image formed by said zero-order structure alone;
    a litho-tool for interleaving the optical images from said first and second mask regions on an image carrier.

11. The highly-corrected mask system according to claim 10, wherein said first and second mask regions are located on a same mask.

12. The highly-corrected mask system according to claim 11, wherein said litho-tool can move said mask in a controlled manner.

13. The highly-corrected mask system according to claim 10, wherein said higher-order correctional structure is a phase-shifter.

14. The highly-corrected mask system according to claim 10, wherein said higher-order correctional structure is a correctional ring separated from said first-order pattern by a spacer structure.

15. The highly-corrected mask system according to claim 14, wherein said correctional ring is a clear pattern.

16. The highly-corrected mask system according to claim 14, wherein said spacer structure is a dark pattern.

17. The highly-corrected mask system according to claim 14, wherein said spacer structure is a phase-shifter.

18. The highly-corrected mask system according to claim 14, wherein said spacer structure is a trench.

19. The highly-corrected mask system according to claim 10, wherein said pattern structures are vias.

20. The highly-corrected mask system according to claim 10, wherein said pattern structures are lines.

* * * * *